US 6,479,211 B1
*Nov. 12, 2002

(12) United States Patent
Sato et al.

(54) POSITIVE PHOTORESIST COMPOSITION FOR FAR ULTRAVIOLET EXPOSURE

(75) Inventors: Kenichiro Sato, Shizuoka (JP); Kunihiko Kodama, Shizuoka (JP); Toshiaki Aoai, Shizuoka (JP); Hajime Nakao, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/577,884

(22) Filed: May 25, 2000

(30) Foreign Application Priority Data

| May 26, 1999 | (JP) | ............ | 11-146774 |
| May 26, 1999 | (JP) | ............ | 11-146775 |
| May 28, 1999 | (JP) | ............ | 11-150215 |
| May 31, 1999 | (JP) | ............ | 11-152860 |
| May 31, 1999 | (JP) | ............ | 11-152861 |
| May 31, 1999 | (JP) | ............ | 11-152862 |
| Jun. 4, 1999 | (JP) | ............ | 11-158693 |
| Jun. 4, 1999 | (JP) | ............ | 11-158695 |

(51) Int. Cl.$^7$ ................ G03F 7/039
(52) U.S. Cl. ............ 430/270.1; 430/905
(58) Field of Search ............ 430/270.1, 910

(56) References Cited

U.S. PATENT DOCUMENTS

| 5,693,452 A | * | 12/1997 | Aoai et al. ............ | 430/270.1 |
| 5,851,728 A | * | 12/1998 | Kim et al. ............ | 430/270.1 |
| 6,013,416 A | * | 1/2000 | Nozaki et al. ............ | 430/283.1 |
| 6,093,517 A | * | 7/2000 | Ito et al. ............ | 430/270.1 |
| 6,239,231 B1 | * | 5/2001 | Fujishima et al. ............ | 525/337 |

FOREIGN PATENT DOCUMENTS

JP    A-11-109632    4/1999

* cited by examiner

Primary Examiner—John S. Chu
(74) Attorney, Agent, or Firm—Sughrue Mion, PLLC

(57) ABSTRACT

A positive photoresist composition for far ultraviolet exposure is disclosed, comprising a compound capable of generating an acid upon irradiation with actinic rays or radiation and a resin having a repeating unit represented by formula (I) and being capable of decomposing under the action of an acid to increase the solubility in alkali. The positive photoresist composition of the present invention may further comprise a fluorine-containing and/or silicon-containing surfactant, an acid decomposable resin, a compound capable of decomposing under the action of an acid to generate a sulfonic acid, and/or a specific solvent, according to the objects.

24 Claims, No Drawings

POSITIVE PHOTORESIST COMPOSITION FOR FAR ULTRAVIOLET EXPOSURE

FIELD OF THE INVENTION

The present invention relates to a positive photoresist composition for use in the ultramicro-lithography process and other photofabrication processes, such as production of ultra-LSI and high-capacitance micro-chip. More specifically, the present invention relates to a positive photoresist composition for far ultraviolet exposure, which can form a highly precise pattern using light in the far ultraviolet region including an excimer laser ray, particularly, in the region of 250 nm or less.

BACKGROUND OF THE INVENTION

In recent years, the integration degree of integrated circuits Is more and more elevated and in the production of a semiconductor substrate such as ultra-LSI, an ultrafine pattern consisting of lines having a width of half micron or less must be worked. To meet this requirement, the wavelength used in the exposure apparatus for photo-lithography increasingly becomes shorter and at the present time, studies are being made on the use of an excimer laser ray (e.g., XeCl, krF, ArF) having a short wavelength among far ultraviolet rays.

In the formation of a pattern for lithography using this wavelength region, a chemical amplification-system resist is used.

The chemical amplification-system resist in general can be roughly classified into three groups, that is, commonly called 2-component system, 2.5-component system and 3-component system. The 2-component system uses a combination of a compound capable of generating an acid by the photochemical decomposition (hereinafter referred to as a "photo-acid generator") and a binder resin. This binder resin is a resin having within the molecule thereof a group capable of decomposing under the action of an acid and thereby increasing solubility of the resin in an alkali developer (also called acid-decomposable group). The 2.5-component system contains a low molecular compound having an acid-decomposable group in addition to the 2-component system. The 3-component system contains a photo-acid generator, an alkali-soluble resin and the above-described low molecular compound.

The chemical amplification-system resist is suitable as a photoresist for use under irradiation with an ultraviolet ray or a far ultraviolet ray but still in need of coping with the characteristics required for individual uses. or example, a resist composition using a polymer obtained by introducing an acetal or ketal group into a hydroxystyrene-base polymer reduced in the light absorption particularly in the case of using light at 248 nm of a KrF excimer laser has been proposed in JP-A-2-141636 (the term "JP-A" as used herein means an "unexamined published Japanese patent application"), JP-A-2-19847, JP-A-4-219757, JP-A-5-281745 and the like. In addition, a similar composition using a t-butoxycarbonyloxy or p-tetrahydropyranyloxy group as the acid-decomposable group has been proposed in JP-A-2-209977, JP-A-3-206458 and JP-A-2-19847.

These compositions are suitable for the case of using light at 248 nm of the KrF excimer laser, however, when an ArF excimer laser is used as the light source, the substantial absorbance is still excessively large and therefore, the sensitivity is low. Accompanying this, other defects such as deterioration in the resolution, the focus allowance or the pattern profile arise. Thus, improvements are necessary in many points.

As a photoresist composition for use with an ArF light source, a resin in which an alicyclic hydrocarbon site is introduced so as to impart dry etching resistance has been proposed. Examples of this resin include resins obtained by copolymerizing a monomer having a carboxylic acid site such as acrylic acid or methacrylic acid or a monomer having a hydroxyl group or a cyano group within the molecule, with a monomer having an alicyclic hydrocarbon group.

The alicyclic hydrocarbon site introduced into the photoresist composition for use with an ArF light source so as to impart dry etching resistance disadvantageously renders the system extremely hydrophobic, as a result, the resist may not be developed with an aqueous tetramethylammonium hydroxide (hereinafter referred to as "TMAH") solution heretofore widely used as a developer for resists or there may arise a phenomenon such that the resist falls off from the substrate during the development.

With an attempt to overcome this hydrophobitization of the resist, an organic solvent such as isopropyl alcohol is mixed in the developer. This gains a certain result but still suffers from problems such as swelling of the resist film or the cumbersome process. From the standpoint of improving the resist, a large number of techniques have been proposed, for example, hydrophobitization ascribable to various alicyclic hydrocarbon sites is compensated for by introducing a hydrophilic group.

JP-A-10-10739 discloses an energy-sensitive resist material containing a polymer obtained by polymerizing a monomer having an alicyclic structure such as norbornene ring in the main chain, a maleic acid anhydride and a monomer having a carboxyl group. JP-A-10-111569 discloses a radiation-sensitive resin composition containing a resin having an alicyclic skeleton in the main chain and a radiation-sensitive acid generator. JP-A-11-109632 discloses use of a radiation-sensitive resin composition containing a polar group-containing alicyclic functional group and an acid-decomposable group.

In general, the problems related to the developability have been intended to overcome by copolymerizing a monomer having a carboxylic acid site such as acrylic acid or methacrylic acid or a monomer having a hydroxyl group or a cyano group within the molecule, with a monomer having an alicyclic hydrocarbon group. However, the results are not satisfied by any means.

Other than the above-described method of introducing an alicyclic hydrocarbon site into the side chain of an acrylate-base monomer, a method of using an alicyclic hydrocarbon site in the polymer main chain to impart dry etching resistance is also studied.

Furthermore, JP-A-9-73173, JP-A-9-90637 and JP-A-10-161313 describe a resist material using an acid-sensitive compound containing an alkali-soluble group protected by a structure containing an alicyclic group, and a structural unit for rendering the alkali-soluble group when released from the acid, to be alkali soluble.

JP-A-11-109632 describes use of a resin containing a polar group-containing alicyclic functional group and an acid-decomposable group, in a radiation-sensitive material.

On the other hand, JP-A-8-248561 discloses a photoreactive composition comprising a photo-acid generator and an acid-increasing agent capable of generating a new acid by the acid generated from the photo-acid generator. In *SPTE*., vol. 3049, pp. 76–82, a chemical amplification-system resist for 193-nm lithography containing an acid generator, a partially protected alicyclic polymer and an acid-increasing agent is disclosed.

The resin having an acid-decomposable group, which is used in the photoresist for far ultraviolet exposure, generally contains an aliphatic cyclic hydrocarbon group within the molecule at the same time. Therefore, the resin becomes hydrophobic and there arise problems attributable to it. For overcoming the problems, various techniques have been aggressively investigated as described above, however, these techniques are insufficient in many points (particularly in the developability) and improvements are demanded.

That is, this technique of using a light source of emitting a far ultraviolet ray of short wavelength, for example, an ArF excimer laser (193 nm), as the exposure light source is still in need of improvements in view of the developability. To speak specifically, development failure may arise or scum (development residue) may be generated. Furthermore, the defocus latitude depended on line pitch is also in need of improvements. Devices in recent years have a tendency to contain various patterns, therefore, the resist is required to have various capabilities. One of these capabilities is the defocus latitude on line pitch. More specifically, a device has a portion where lines are crowded, a pattern where the space is broad as compared with lines, and isolated lines. Therefore, it is important to resolve various lines with high reproducibility. However, reproduction of various lines cannot be easily attained because of optical factors and the resist is not yet succeeded in undertaking the part of solving this problem at present. In particular, the above-described resist system containing an alicyclic group conspicuously varies in the reproducibility between the isolated pattern and the crowded pattern, and improvements are being demanded.

As described above, devices in recent years have a tendency to contain various patterns, therefore, the resist is required to have various capabilities. One of these capabilities is a broad defocus latitude of the isolated line pattern. In a device, isolated lines are present, therefore, it is important to resolve isolated lines with high reproducibility. However, reproduction of isolated lines cannot be easily attained because of optical factors and the resist is also not yet succeeded in undertaking the part of solving this problem at present. In particular, the above-described resist system containing an alicyclic group conspicuously is narrow in the defocus latitude of the isolated pattern and improvements are being demanded.

Accompanying the requirements for finer semiconductor chips in recent years, the pattern for designing these fine semiconductors has reached a fineness region even of from 0.13 to 0.35 $\mu$m. However, the composition used therefor has a problem in that the resolution of the pattern is inhibited by the factors such as edge roughness of the line pattern and the like. The term "edge roughness" as used herein means that since the top and bottom edges of the resist line pattern irregularly fluctuate in the direction perpendicular to the line direction due to the properties of the resist, the edges are viewed uneven when the pattern is viewed from right above.

The resin containing an acid-decomposable group generally contains, as described above, an aliphatic cyclic hydrocarbon group within the molecule at the same time. Due to the tendency thereof, the resulting resin is in fact hydrophobic. On the other hand, with respect to the photo-acid generator used together, onium salt compounds are widely used and some results are attained. However, conventionally used onium salt compounds exhibit bad compatibility, generate turbidity or cause precipitation of insoluble matters in aging, though the reasons therefor are not known, as a result, the aging stability has a problem. Furthermore, these compounds incur decrease in the sensitivity with the passing of time, thus, these are still in need of improvements.

For the coating solvent of naphthoquinone-diazide/novolak resin-base positive photoresists, glycol ethers, glycol ether esters such as 2-methoxyethanol and 2-ethoxyethanol, acetates thereof such as ethylene glycol monomethyl ether acetate and ethylene glycol monoethyl ether acetate have been heretofore commonly used.

However, these solvents have problems in the toxicity, the coatability, the storage stability of the solution, the resist capability and the like, and improvements thereof are demanded.

The coatability, the storage stability of the solution and the resist performance are known to be properties attributive to the constituent components such as binder polymer and photo-acid generator and at the same time greatly fluctuating by the solvent. As such, the resist solvent is demanded to satisfy all requirements on the coatability, the storage stability of the solution, the safety, the resist performance and the development failure, however, the fact is that such a solvent has been scarcely known for the chemical amplification resist using a polymer having an alicyclic hydrocarbon skeleton.

SUMMARY OF THE INVENTION

Accordingly, a first object of the present invention is to solve the problems in the techniques for improving the original capabilities of the above-described microphotofabrication using far ultraviolet rays, particularly ArF excimer laser rays, more specifically, to provide a positive photoresist composition which is excellent in the sensitivity, resolution, dry etching resistance and adhesion to the substrate, which is freed from the problems occurring at the development, namely, generation of development failures or scumming and which is a positive photoresist composition for far ultraviolet exposure, favored with an excellent defocus latitude depended on line pitch.

A second object of the present invention is to provide a positive photoresist composition for far ultraviolet exposure, favored with a wide and excellent defocus latitude of the isolated line pattern.

A third object of the present invention is to provide a chemical amplification-type positive photoresist composition having high resolution and being improved in the edge roughness of a pattern.

A fourth object of the present invention is to provide a positive photoresist composition capable of exhibiting, when dissolved in an organic solvent, good compatibility with a resin to give a solution having excellent aging stability and ensuring high sensitivity and high resolution with a short wavelength light source.

A fifth object of the present invention is to provide a positive photoresist composition which is excellent in sensitivity, resolution, dry etching resistance and adhesion to the substrate, which is freed from the problems occurring at the development, namely, generation of development failures or edge roughness, and which is a positive photoresist composition for far ultraviolet exposure, favored with an excellent defocus latitude depended on line pitch.

As a result of extensive studies on the constituent materials of a resist composition in the positive chemical amplification system, the present inventors have found that the objects of the present invention can be attained by using a specific acid-decomposable resin and a specific additive. The present invention has been accomplished based on this finding.

More specifically, the first object can be attained by the following constructions according to the first aspect of the present invention.

(1) A positive photoresist composition for far ultraviolet exposure, comprising (A) a compound capable of generating an acid upon irradiation with actinic rays or radiation, (B) a resin having a repeating unit represented by the following formula (I) and being capable of decomposing under the action of an acid- to increase the solubility in alkali, and (D) a fluorine-containing and/or silicon-containing surfactant:

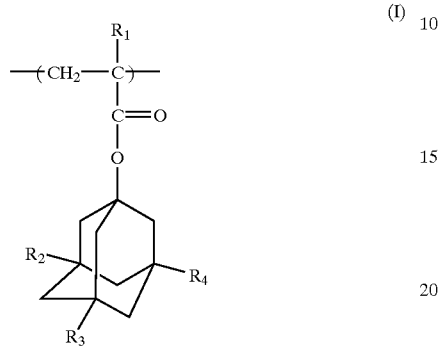

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

(2) The positive photoresist composition for far ultraviolet exposure as described in (1) above, further comprising a nitrogen-containing basic compound.

(3) The positive photoresist composition for far ultraviolet exposure as described in (2) above, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

The second object can be attained by the following constructions according to the second aspect of the present invention.

(4) A positive photoresist composition for far ultraviolet exposure, comprising:

(A) a compound capable of generating an acid upon irradiation with actinic rays or radiation, and (B') a resin containing a repeating unit having an alkali-soluble group protected by at least one of the groups containing an alicyclic hydrocarbon structure represented by the following formula (pI), (pII), (pIII), (pIV), (pV) or (pVI) and a repeating unit represented by the foregoing formula (I) and being capable of decomposing under the action of an acid to increase the solubility in alkali:

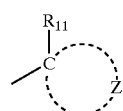 (pI)

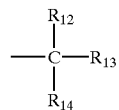 (pII)

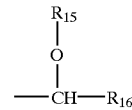 (pIII)

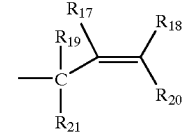 (pIV)

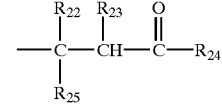 (pV)

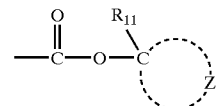 (pVI)

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ to $R_{21}$ each independently represents a hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of R22 to $R_{25}$ represents an alicyclic hydrocarbon group.

(5) The positive photoresist composition for far ultraviolet exposure as described in (4) above, wherein the rein (B') further contains a repeating unit having a group represented by the following formula (II):

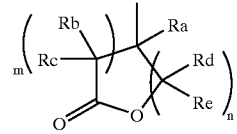 (II)

wherein Ra to Re each represents a hydrogen atom or an alkyl group having from 1 to 4 carbon atoms and m and n each independently represents an integer of from 0 to 3, provided that m+n is a number of from 2 to 6.

(6) A positive photoresist composition for far ultraviolet exposure, comprising:

(A) a compound capable of generating an acid upon irradiation with actinic rays or radiation, and (B″) a resin containing a repeating unit having a group represented by formula (I) and a repeating unit represented by the following formula (II′):

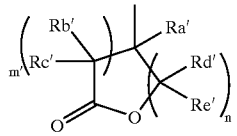

(II′)

wherein Ra′ represents a hydrogen atom or an alkyl group having from 1 to 4 carbon atoms, provided that when m′ is 0 or 2, Ra′ represents an alkyl group having from 1 to 4 carbon atoms; Rb′ to Re′ each independently represent a hydrogen atom or an alkyl group which may have a substituent; m′ represents an integer of from 0 to 2; and n′ represents an integer of from 1 to 3, provided that m′+n′ is a number of from 2 to 6.

(7) The positive photoresist composition for far ultraviolet exposure as described in (6) above, wherein the resin (B″) further contains at least one of the repeating units represented by the following formulae (III-a) to (III-d):

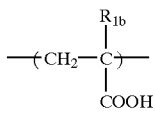

(III-a)

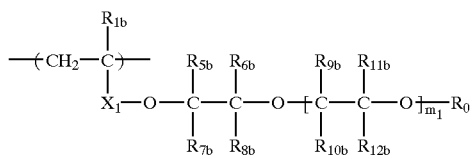

(III-b)

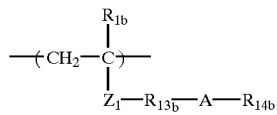

(III-c)

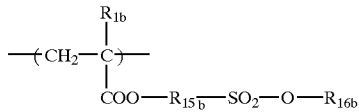

(III-d)

wherein $R_{1b}$ has the same meaning as $R_1$ in formula (I), $R_{5b}$ to $R_{12b}$ each independently represents a hydrogen atom or an alkyl group which may have a substituent; $R_0$ represents a hydrogen atom or an alkyl group which may have a substituent, a cyclic alkyl group which may have a substituent, an aryl group which may have a substituent or an aralkyl group which may have a substituent; $m_1$ represents an integer of from 1 to 10; $X_1$ represents a single bond, an alkylene group which may have a substituent, a cyclic alkylene group which may have a substituent, an arylene group which may have a substituent, or a divalent group incapable of decomposing under the action of an acid selected from the group consisting of an ether group, a thioether group, a carbonyl group, an ester group, an amido group, a sulfonamido group, a urethane group, a urea group and a combination of two or more thereof; $Z_1$ represents a single bond or a divalent group selected from the group consisting of an ether group, an ester group, an amide group, an alkylene group and a combination thereof; $R_{13b}$ represents a single bond or a divalent group selected from the group consisting of an alkylene group, an arylene group and a combination thereof; $R_{15b}$ represents a divalent group selected from the group consisting of an alkylene group, an arylene group and a combination thereof; $R_{14b}$ represents an alkyl group which may have a substituent, a cyclic alkyl group which may have a substituent, an aryl group which may have a substituent or an aralkyl group which may have a substituent; $R_{16b}$ represents a hydrogen atom, an alkyl group which may have a substituent, a cyclic alkyl group which may have a substituent, an alkenyl group which may have a substituent, an aryl group which may have a substituent, or an aralkyl group which may have a substituent; and A represents any one of the following functional groups:

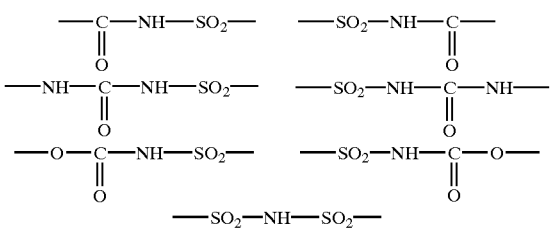

As a result of extensive investigations by taking notice of the above-described various properties, the present inventors have found that the third object can be attained by using a specific resin having an alicyclic group and a specific additive, which are described below. The present invention has been accomplished based on this finding.

More specifically, the present invention is the following construction according to the third aspect of the present invention.

(8) A positive photoresist composition for far ultraviolet exposure, comprising (A) a compound capable of generating an acid upon irradiation with actinic rays or radiation, (B) a resin having a repeating unit represented by the following formula (I) and being capable of decomposing under the action of an acid to increase the solubility in alkali, and (C) a compound represented by the following formula (CI) or (CII):

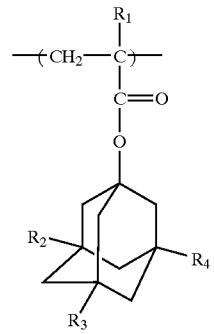

(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group;

(CI)

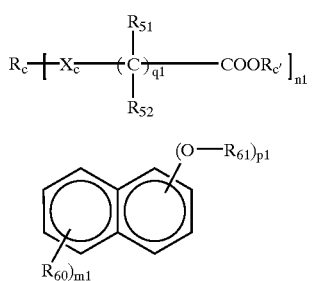

(CII)

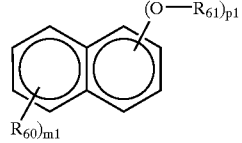

wherein in formula (CI), $X_c$ represents —O—, —S—, —N($R_{53}$)— or a single bond, $R_{51}$, $R_{52}$ and $R_{53}$ each independently represents a hydrogen atom or an alkyl group, $R_c{'}$ represents a group for constituting an acid decomposable group in the form of —COOR$_c{'}$, and $R_c$ represents an n1-valent residue containing a bridge-containing hydrocarbon group or a naphthalene ring; and in formula (CII), $R_{60}$ represents a hydrogen atom or an alkyl group, $R_{61}$ represents a group for constituting an acid decomposable group in the form of —O—$R_{61}$, m1, n1 and p1 each independently represents an integer of from 1 to 4, and q1 represents an integer of from 0 to 10.

Further, the third object can be attained by the following constructions according to the fourth aspect of the present invention.

(9) A positive photoresist composition for far ultraviolet exposure, comprising (A) a compound capable of generating an acid upon irradiation with actinic rays or radiation, (B) a resin having a repeating unit represented by formula (I) and being capable of decomposing under the action of an acid to increase the solubility in alkali, and (E) a compound capable of decomposing under the action of an acid to generate a sulfonic acid.

(10) The positive photoresist composition for far ultraviolet exposure as described in (9) above, further comprising a fluorine-containing surfactant and/or a silicon-containing surfactant.

(11) The positive photoresist composition for far ultraviolet exposure as described in (9) above, further comprising a nitrogen-containing basic compound.

(12) The positive photoresist composition for far ultraviolet exposure as described in (11) above, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

As a result of extensive studies on the constituent material of a resist composition in the positive chemical amplification system, the present inventors have found that the fourth object of the present invention can be attained by using a specific acid-decomposable resin and a specific photo-acid generator. The present invention has been accomplished based on this finding.

More specifically, the fourth object can be attained by the following construction according to the fifth aspect of the present invention.

(13) A positive photoresist composition for far ultraviolet exposure, comprising (A') a compound capable of generating an acid upon irradiation with actinic rays or radiation represented by the following formula [Ia] or [IIa], and (B) a resin having a repeating unit represented by formula (I) and being capable of decomposing under the action of an acid to increase the solubility in alkali:

[Ia]

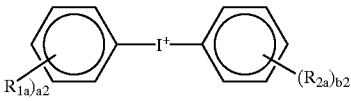

[IIa]

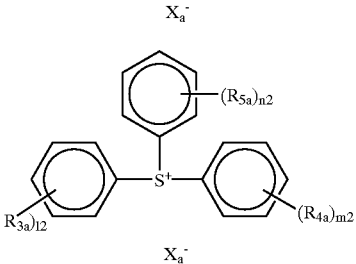

wherein $R_{1a}$ to $R_{5a}$ each represents a hydrogen atom, an alkyl group which may have a substituent, a cycloalkyl group which may have a substituent, an alkoxy group which may have a substituent, an alkoxycarbonyl group which may have a substituent, an acyl group which may have a substituent, an acyloxy group which may have a substituent, a nitro group, a halogen atom, a hydroxyl group or a carboxyl group; $a_2$, $b_2$ and $l_2$ each represents an integer of from 1 to 5; $m_2$ and $n_2$ each represents an integer of from 0 to 5, provided that at least either one of $R_{1a}$ and $R_{2a}$ represents an alkyl group which may have a substituent having 5 or more carbon atoms, a cycloalkyl group which may have a substituent, an alkoxy group which may have a substituent, an alkoxycarbonyl group which may have a substituent, an acyl group which may have a substituent or an acyloxy group which may have a substituent, and that when $l_2+m_2+n_2=1$, $R_{3a}$ represents an alkyl group which may have a substituent, a cycloalkyl group which may have a substituent, an alkoxy group which may have a substituent, an alkoxycarbonyl group which may have a substituent, an acyl group which may have a substituent or an acyloxy group which may have a substituent; $X_a$ represents $R_a$—$SO_3$; and $R_a$ represents an aliphatic hydrocarbon group which may have a substituent or an aromatic hydrocarbon group which may have a substituent.

As a result of extensive studies on the constituent material of a resist composition in the positive chemical amplification system, the present inventors have found that the fifth object of the present invention can be attained by using a specific acid-decomposable resin and a specific additive. The present invention has been accomplished based on this finding.

More specifically, the fifth object can be attained by the following constructions according to the sixth aspect of the present invention.

(14) A positive photoresist composition for far ultraviolet exposure, comprising (A) a compound capable of generating an acid upon irradiation with actinic rays or radiation, (B) a resin having a repeating unit represented by the following formula (I) and being capable of decomposing under the action of an acid to increase the solubility in alkali, and (S1) a solvent containing (a) ethyl lactate in an amount of from 60 to 90 wt % based on the entire solvent and (b) ethyl 3-ethoxypropionate in an amount of from 10 to 40 wt % based on the entire solvent:

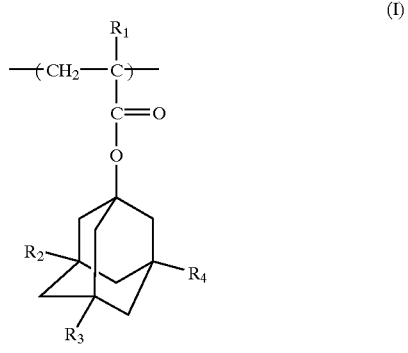

(I)

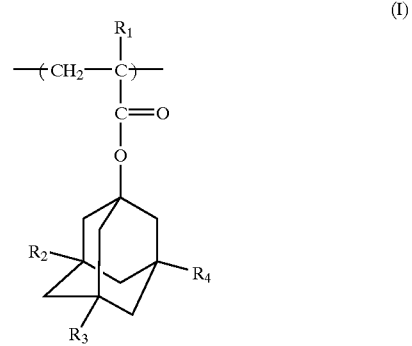

(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

(15) The positive photosensitive resin composition as described in (14) above, wherein the solvent (S1) further contains (c) a solvent having a boiling point of 180° C. or more and a solubility parameter of 12 or more in an amount of from 1 to 20 wt % based on the entire solvent.

(16) The positive photosensitive resin composition as described in (15) above, wherein the solvent (c) is at least one selected from γ-butyrolactone, ethylene carbonate and propylene carbonate.

(17) The positive photoresist composition for far ultraviolet exposure as described in (14) to (16) above, further comprising a fluorine-containing surfactant and/or a silicon-containing surfactant.

(18) The positive photoresist composition for far ultraviolet exposure as described in (14) to (17) above, further comprising a nitrogen-containing basic compound.

(19) The positive photoresist composition for far ultraviolet exposure as described in (18) above, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

(20) A positive photoresist composition for far ultraviolet exposure, comprising (A) a compound capable of generating an acid upon irradiation with actinic rays or radiation, (B) a resin having a repeating unit represented by the following formula (I) and being capable of decomposing under the action of an acid to increase the solubility in alkali, and (S2) a solvent containing (a) a first solvent shown below in an amount of from 60 to 90 wt % based on the entire solvent and (b) a second solvent shown below in an amount of from 10 to 40 wt % based on the entire solvent:

(a) at least one first solvent selected from ethyl lactate, propylene glycol monomethyl ether acetate, propylene glycol monomethyl ether propionate, methyl 3-methoxypropionate, ethyl 3-ethoxypropionate and 2-heptanone; and (b) a second solvent having a viscosity at a temperature of 20° C. of 1 cps or less:

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

(21) The positive photosensitive resin composition as described in (20) above, wherein the solvent (S2) further contains (c) a third solvent having a boiling point of 180° C. or more and a solubility parameter of 12 or more in an amount of from 1 to 20 wt % based on the entire solvent.

(22) The positive photosensitive resin composition as described in (21) above, wherein the third solvent (c) is at least one selected from γ-butyrolactone, ethylene carbonate and propylene carbonate.

(23) The positive photoresist composition for far ultraviolet exposure as described in (20) to (22) above, further comprising a fluorine-containing surfactant and/or a silicon-containing surfactant.

(24) The positive photoresist composition for far ultraviolet exposure as described in (20) to (23) above, further comprising a nitrogen-containing basic compound.

(25) The positive photoresist composition for far ultraviolet exposure as described in (24) above, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

DETAILED DESCRIPTION OF THE INVENTION

The compounds for use in the present invention are described in detail below.

Compound Capable of Generating Acid Upon Irradiation with Actinic Rays or Radiation (Photo-Acid Generator)

The photo-acid generator for use in the present invention is a compound which generates an acid upon irradiation with actinic rays or radiation.

Examples of the compound capable of generating an acid upon irradiation with actinic rays or radiation for use in the present invention include the compounds which can generate an acid by a known ray (for example, ultraviolet ray and far ultraviolet ray of from 200 to 400 nm, preferably g ray, h ray, i ray and KrF excimer laser ray), an ArF excimer laser ray, an electron beam, an X ray, a molecular beam or an ion beam, used in a photocationic polymerization initiator, a photoradical polymerization initiator, a photo-decoloring agent for dyes, a photo-discoloring agent or a microresist.

These compounds may be appropriately selected and used either individually or in combination.

Other examples of the compound capable of generating an acid upon irradiation with actinic rays or radiation for use in the present invention include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re27,992, JP-A-3-140140, etc., phosphonium salts described in D. C. Necker et al., *Macromolecules*, 17, 2468 (1984), C. S. Wen et al., *Teh. Proc. Conf. Red. Curing ASIA*, p. 478, Tokyo, October. (1988), U.S. Pat. Nos. 4,069,055 and 4,069,056, etc., iodonium salts described in J. V. Crivello et al., *Macromolecules*, 10 (6) 1307 (1977), *Chem. & Eng. News*, Nov. 28, p. 31 (1988), European Patent 104,143, U.S. Pat. Nos. 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), European Patents 370,693, 161,811, 410,201, 339,049, 233, 567, 297,443 and 297,442, U.S. Pat. Nos. 3,902,114, 4,933, 377, 4,760,013, 4,734,444 and 2,833,827, German Patent 2,904,626, 3,604,580 and 3,604,581, JP-A-7-28237, JP-A-8-27102, etc., selenonium salts described in J. V. Crivello et al., *Macromolecules*, 10 (6), 1307 (1977), J. V. Crivello et al., *J. Polymer Sci.*, Polymer Chem. Ed., 17, 1047 (1979), etc., and arsonium salts described in C. S. Wen et al., *Teh, Proc. Conf. Rad. Curing ASIA*, p. 478, Tokyo, October. (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photo-acid generators having an o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al.,*J. Imaging Technol.*, 11 (4), 191 (1985), H. M. Houlihan et al., *Macromolecules*, 21, 2001 (1988), P. M. Collins et al., *J. Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851, and 0,388, 343, U.S. Pat. Nos. 3,901,710 and 4,181,531, JP-A-60-198538, JP-A-53-133022, etc., compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 044,115, 618,564 and 0,101,122, U.S. Pat. Nos. 4,371,605 and 4,431, 774, JP-A-64-18143, JP-A-2-245756, JP-A-3-140109, etc., disulfone compounds described in JP-A-61-166544 and JP-A-2-71270, and diazoketosulfone and diazosulfone compounds described in JP-A-3-103854, JP-A-3-103856 and JP-A-4-210960, etc.

In addition, compounds in which the above-described group or compound capable of generating an acid by light is introduced in the main chain or a side chain may also be used and examples thereof include compounds described in M. E. Woodhouse et al., *J. Am. Chem. Soc.*, 104, 5586 (1982), S. P. Pappas et al.,*J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al.,*J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, compounds capable of generating an acid by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, European Patent 126,712, etc. may also be used.

Among these compounds capable of decomposing upon irradiation with actinic rays or radiation and thereby generating an acid, particularly effective compounds are described below.

(1) Oxazole Derivative Represented by Formula (PAG1) and S-Triazine Derivative Represented by Formula (PAG2), Each Substituted by Trihalomethyl Group:

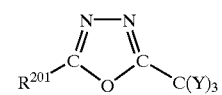

(PAG1)

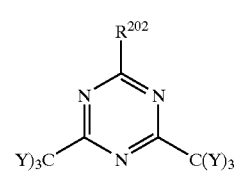

(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —C(Y)$_3$, and Y represents chlorine atom or bromine atom.

Specific examples thereof include the following compounds, however, the present invention is by no means limited thereto.

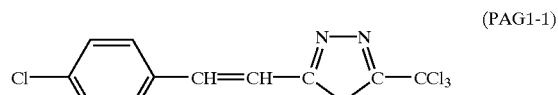

(PAG1-1)

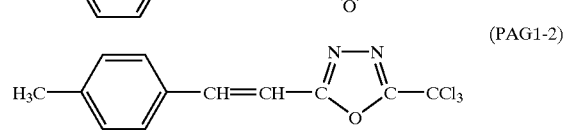

(PAG1-2)

-continued
(PAG1-3)
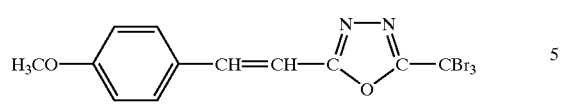
(PAG1-4)
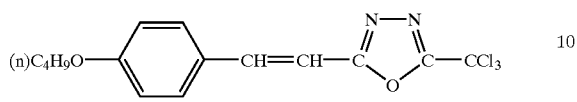
(PAG1-5)
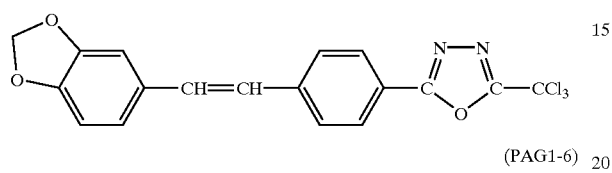
(PAG1-6)
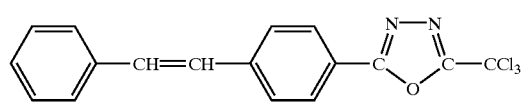
(PAG1-7)
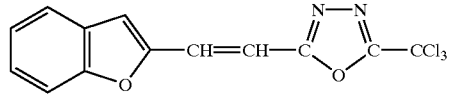
(PAG1-8)
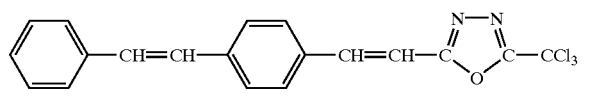
(PAG2-1)
(PAG2-2)
(PAG2-3)
-continued
(PAG2-4)
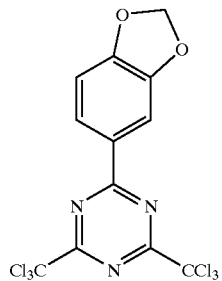
(PAG2-5)
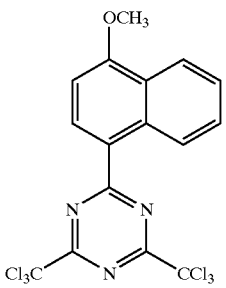
(PAG2-6)
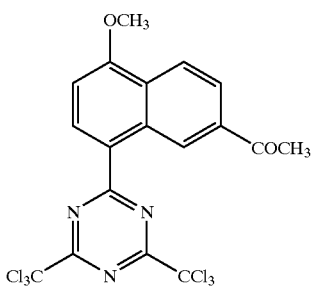
(PAG2-7)
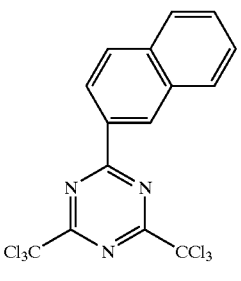
(PAG2-8)
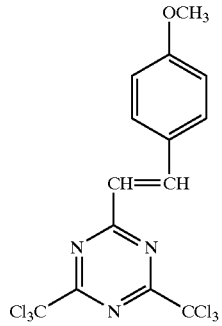

-continued

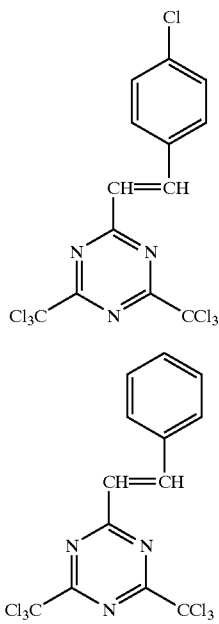

(PAG2-9)

(PAG2-10)

(2) Iodonium Salt Represented by Formula (PAG3) and Sulfonium Salt Represented by Formula (PAG4):

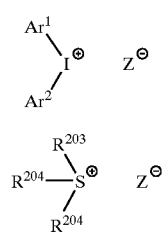

(PAG3)

(PAG4)

wherein $Ar^1$ and $Ar^2$ each independently represents a substituted or unsubstituted aryl group (wherein the substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom), $R^{203}$, $R^{204}$ and $R^{205}$ each independently represents a substituted or unsubstituted alkyl group or a substituted or unsubstituted aryl group, and preferably an aryl group having from 6 to 14 carbon atoms, an alkyl group having from 1 to 8 carbon atoms or a substituted derivative thereof (wherein the substituent of the aryl group is preferably an alkoxy group having from 1 to 8 carbon atoms, an alkyl group having from 1 to 8 carbon atoms, a nitro group, a carboxyl group, a hydroxy group or a halogen atom, and the substituent of the alkyl group is preferably an alkoxy group having from 1 to 8 carbon atoms, a carboxyl group or an alkoxycarbonyl group), and $Z^-$ represents a counter anion and examples thereof include $BF_4^-$, $AsF_6^-$, $PF_6^-$, $SbF_6^-$, $SiF_6^{2-}$, $ClO_4^-$, perfluoroalkane sulfonate anion such as $CF_3SO_3^-$, pentafluorobenzene sulfonate anion, condensed polynuclear aromatic sulfonate anion such as naphthalene-1-sulfonate anion, anthraquinone sulfonate anion, and sulfonic acid group-containing dye, but the anion is not limited thereto.

Two of $R^{203}$, $R^{204}$ and $R^{205}$, or $Ar^1$ and $Ar^2$ may be bonded through a single bond or a substituent.

Specific examples thereof include the following compounds, however, the present invention is by no means limited thereto.

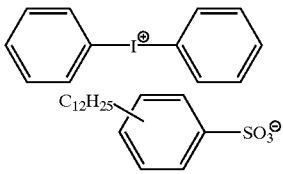

(PAG3-1)

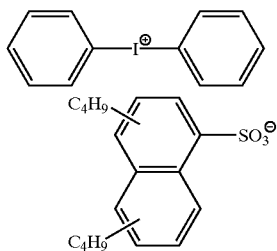

(PAG3-2)

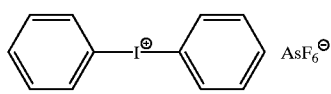

(PAG3-3)

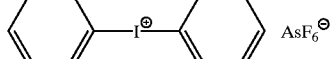

(PAG3-4)

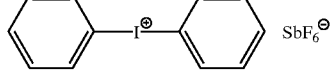

(PAG3-5)

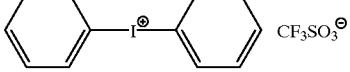

(PAG3-6)

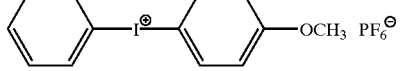

(PAG3-7)

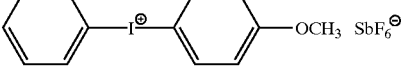

(PAG3-8)

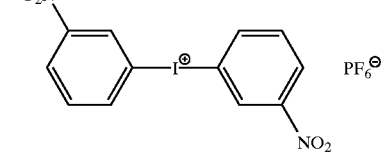

(PAG3-9)

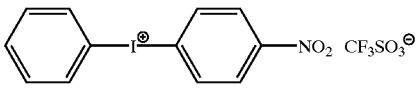

(PAG3-10)

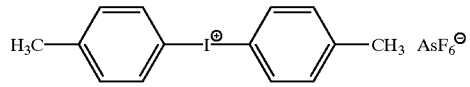

(PAG3-11)

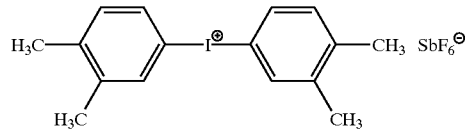

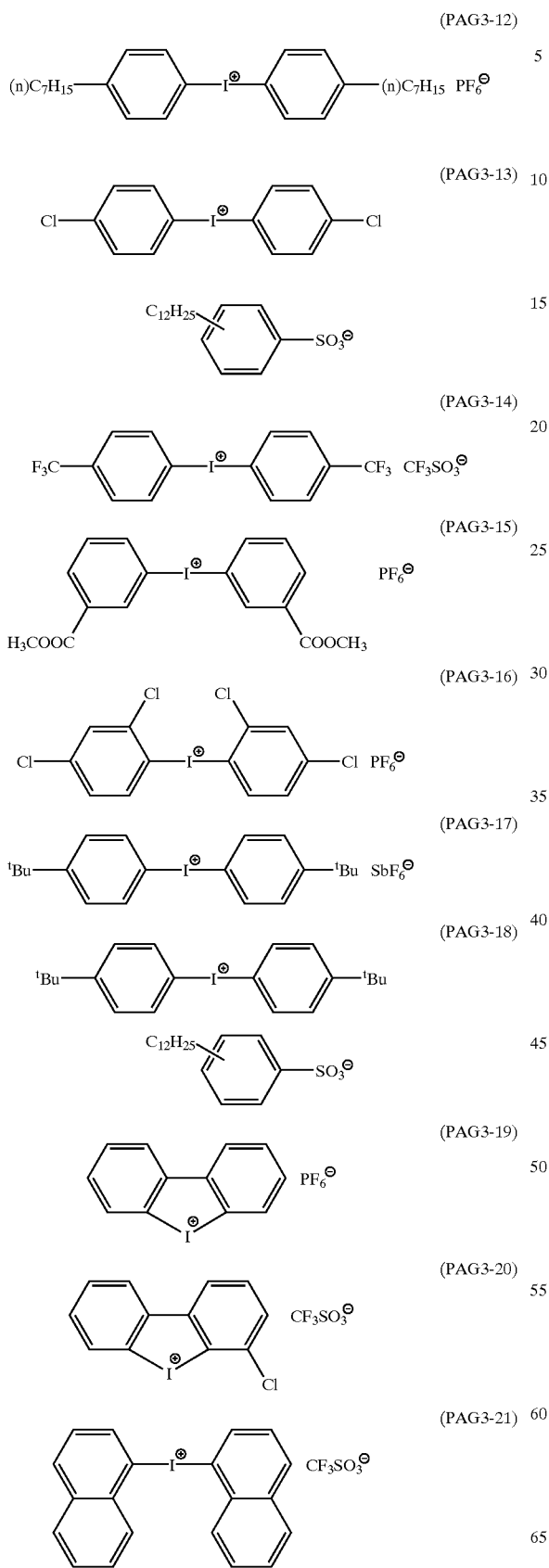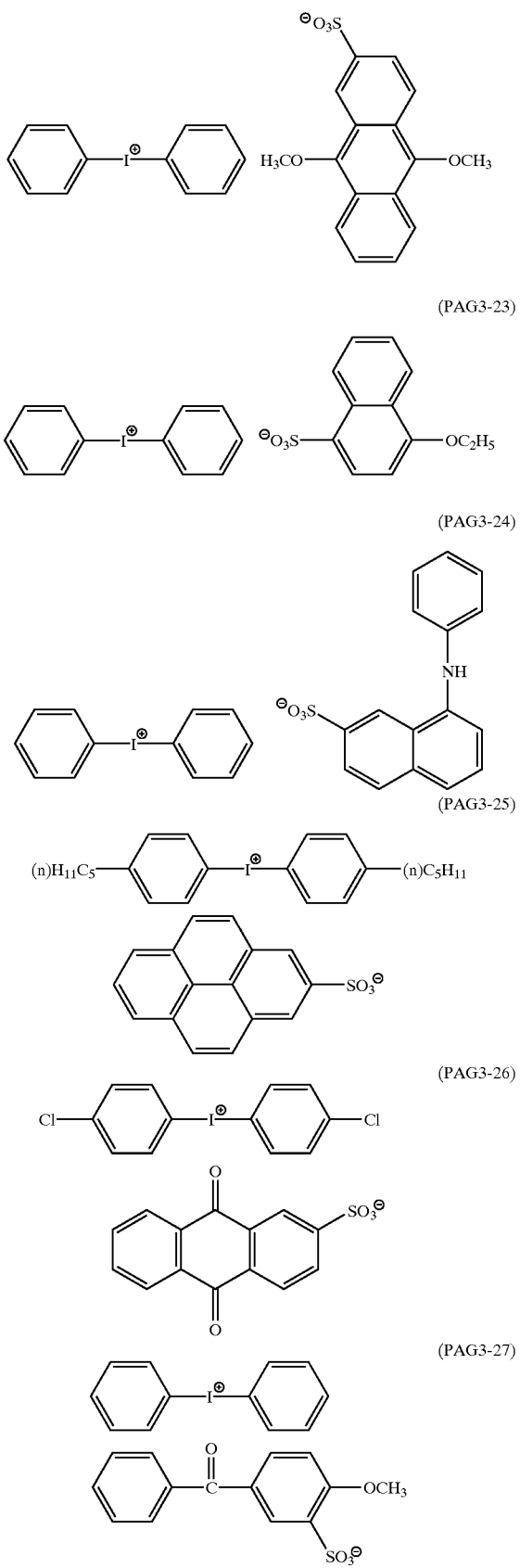

(PAG3-28)
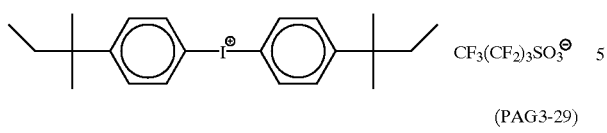
(PAG3-29)
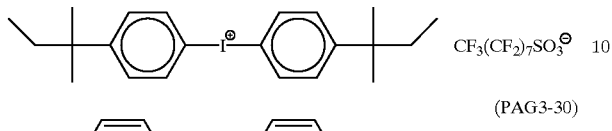
(PAG3-30)
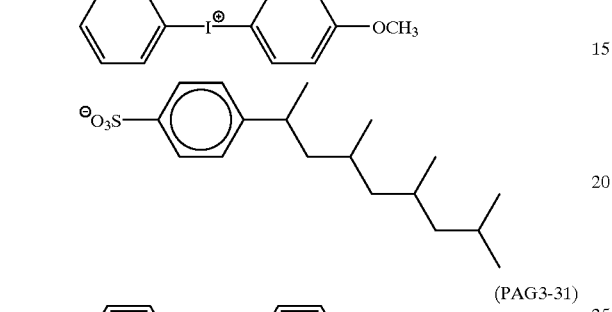
(PAG3-31)
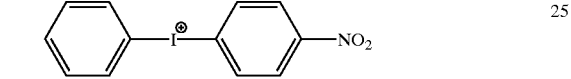
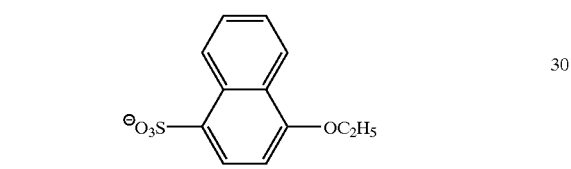
(PAG3-32)
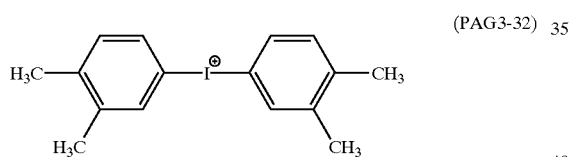
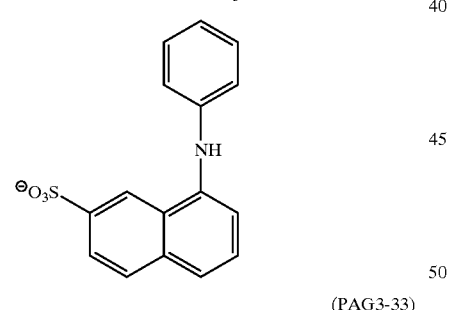
(PAG3-33)
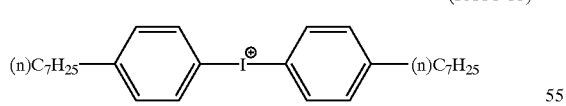
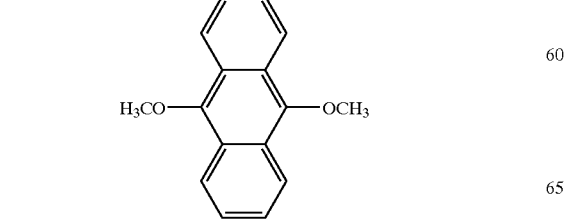
(PAG3-34)
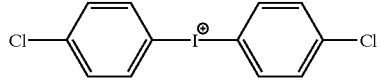
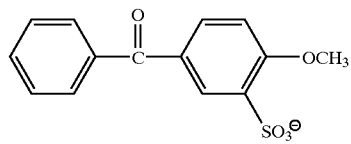
(PAG3-35)
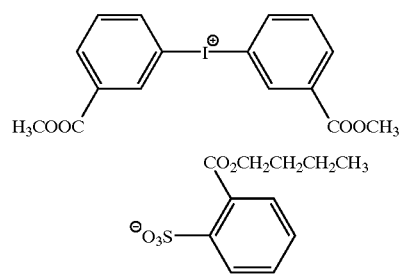
(PAG3-36)
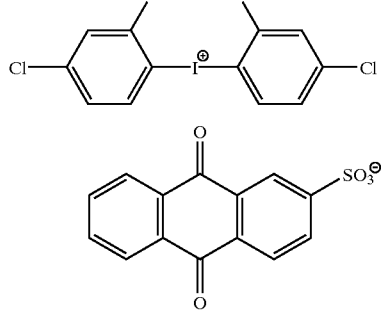
(PAG3-37)
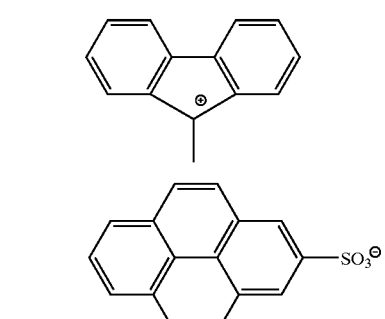
(PAG3-38)
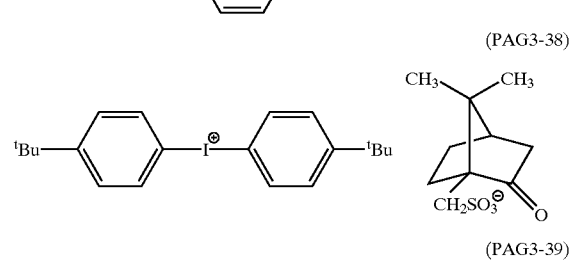
(PAG3-39)
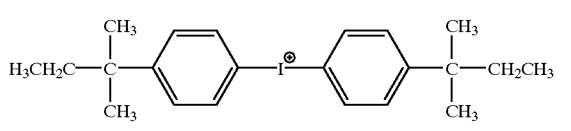

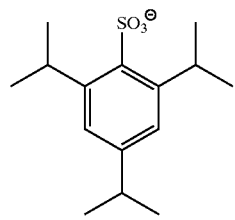
(PAG3-40)
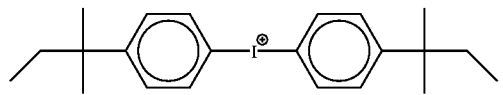
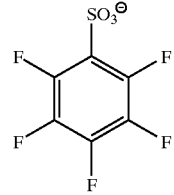
(PAG3-41)
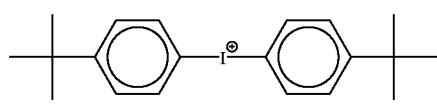
(PAG3-42)
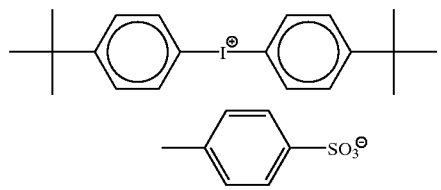
(PAG3-43)
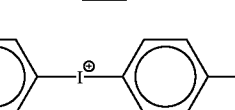
(PAG4-1)
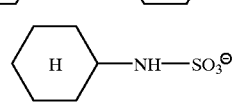
(PAG4-2)
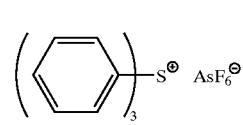
(PAG4-3)
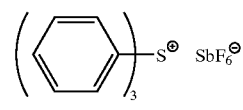
(PAG4-4)
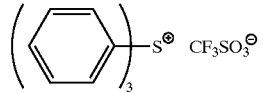
(PAG4-5)
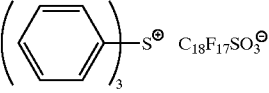
(PAG4-6)
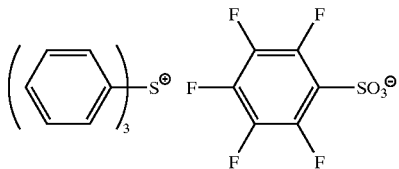
(PAG4-7)
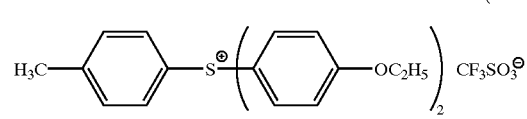
(PAG4-8)
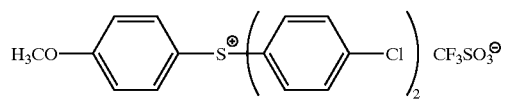
(PAG4-9)
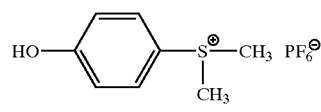
(PAG4-10)
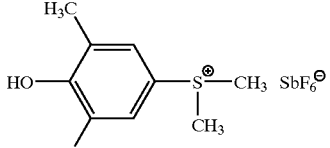
(PAG4-11)
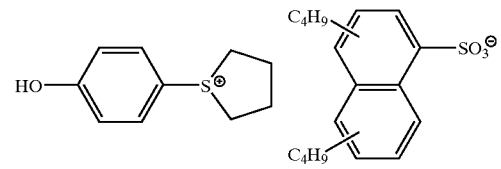
(PAG4-12)
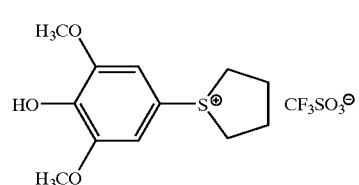
(PAG4-13)
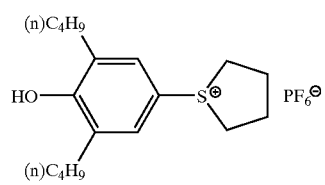
(PAG4-14)

-continued
(PAG4-15)
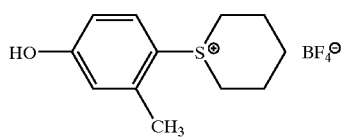
(PAG4-16)
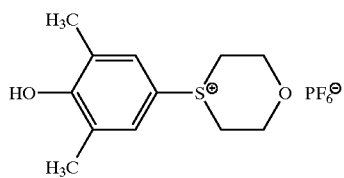
(PAG4-17)
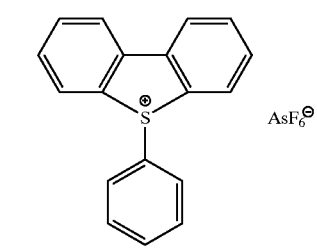
(PAG4-18)
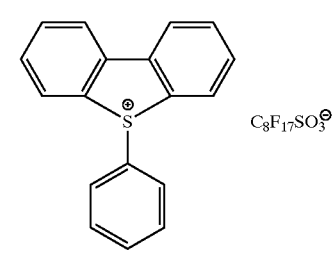
(PAG4-19)
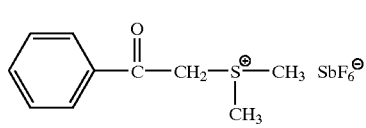
(PAG4-20)
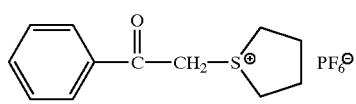
(PAG4-21)
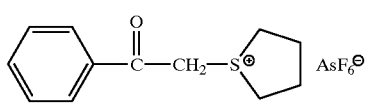
(PAG4-22)
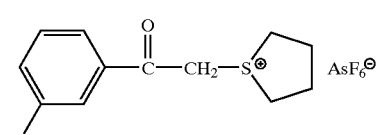
(PAG4-23)
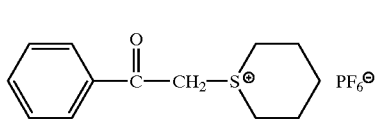
(PAG4-24)
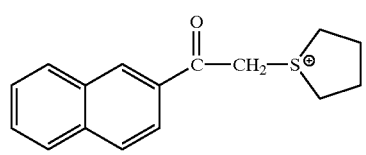
-continued
(PAG4-15)
(PAG4-25)
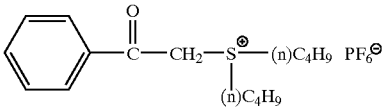
(PAG4-26)
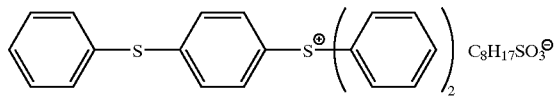
(PAG4-27)
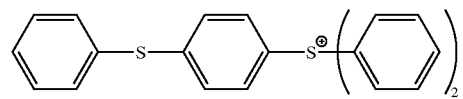
(PAG4-28)
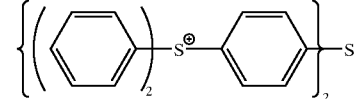
(PAG4-29)
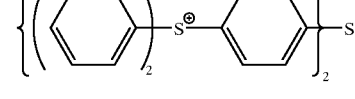
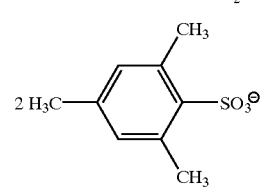
(PAG4-30)
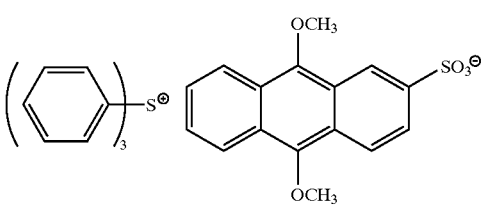
(PAG4-31)
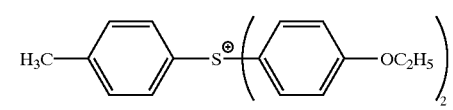
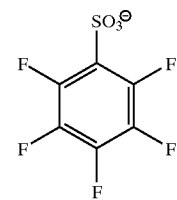

-continued
(PAG4-32)
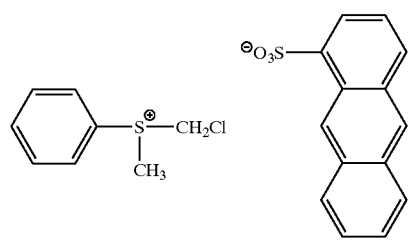
(PAG4-33)
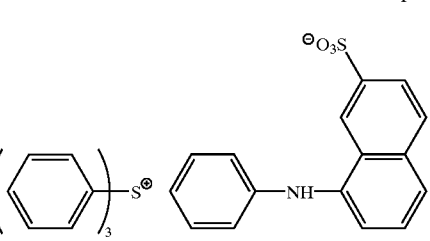
(PAG4-34)
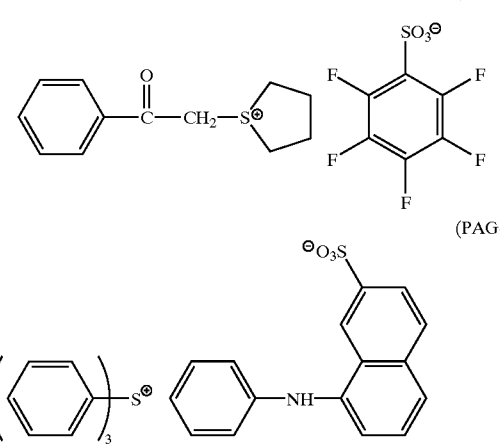
(PAG4-35)
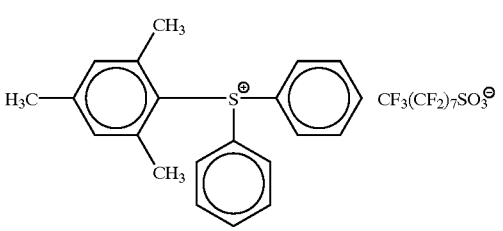
(PAG4-36)
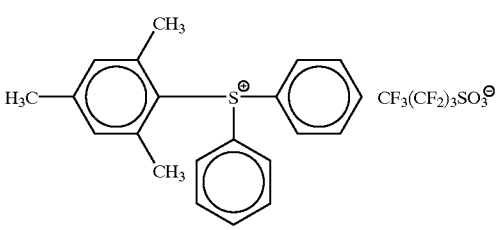
(PAG4-37)
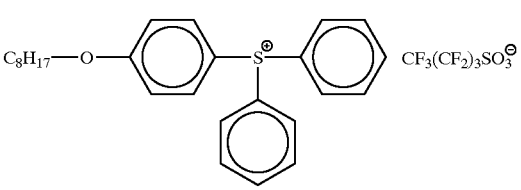
(PAG4-38)
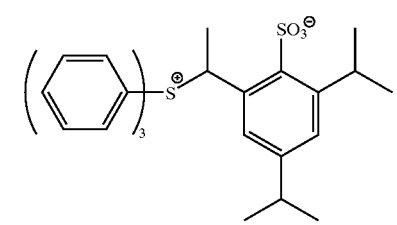
-continued
(PAG4-39)
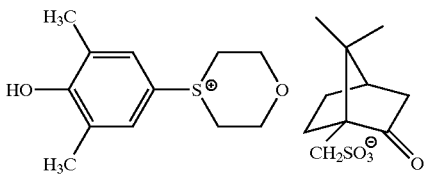
(PAG4-40)
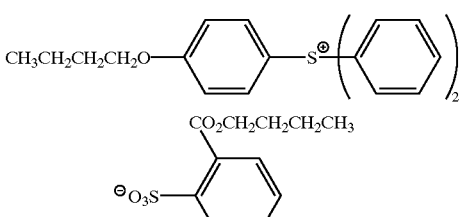
(PAG4-41)
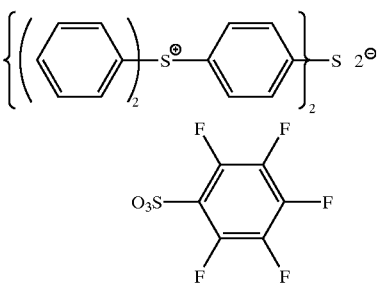
(PAG4-42)
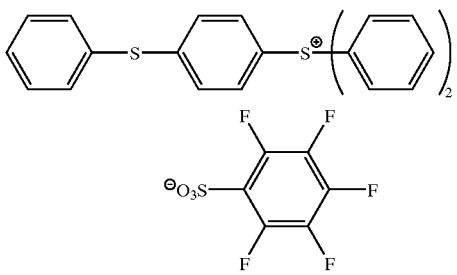
(PAG4-43)
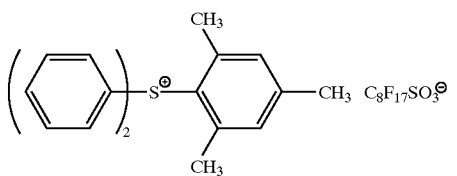
(PAG4-44)
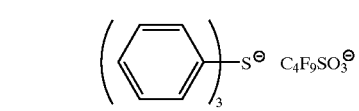
(PAG4-45)
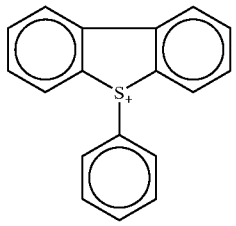
The above-mentioned onium salts represented by formulae (PAG3) and (PAG4) are known and may be synthesized by a method described, for example, in J. W. Knapczyl et al., *J. Am. Chem. Soc.*, 91, 145 (1969), A. L. Maycok et al., *J.*

Org. Chem., 35, 2532 (1970), E. Goethas et al., *Bull Soc. Chem. Belg.*, 73, 546 (1964), H. M. Leicester, *J. Am. Chem. soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfonic Acid Derivative Represented by Formula (PAG5) and Iminosulfonate Derivative Represented by Formula (PAG6):

$$Ar^3—SO_2—SO_2—Ar^4 \quad (PAG5)$$

(PAG6) structure with $R^{206}—SO_2—O—N$ bonded to a cyclic imide containing group A.

wherein $Ar^3$ and $Ar^4$ each independently represents a substituted or unsubstituted aryl group, $R^{206}$ represents a substituted or unsubstituted alkyl group or a substituted or unsubstiltuted aryl group, A represents a substituted or unsubstituted alkylene group, a substituted or unsubstituted alkenylene group or a substituted or unsubstituted arylene group.

Specific examples thereof include the following compounds, however, the present invention is by no means limited thereto.

(PAG5-1) through (PAG5-15) and (PAG6-1), (PAG6-2) structural formulas.

PAG6-3 through PAG6-18: chemical structures (N-oxysulfonyl imide photoacid generators).

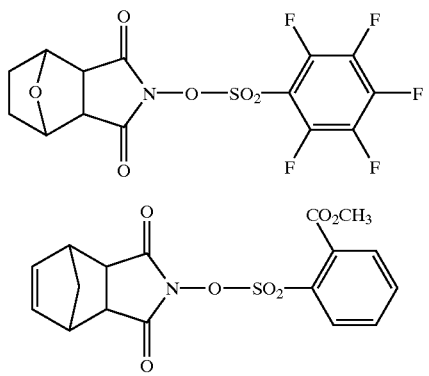

(PAG6-19)

(PAG6-20)

(4) Diazodisulfone derivative Represented by Formula (PAG7)

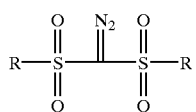

(PAG7)

wherein R represents a linear, branched or cyclic alkyl group or an aryl group which may be substituted.

Specific examples thereof include the following compounds, however, the present invention is not limited thereto.

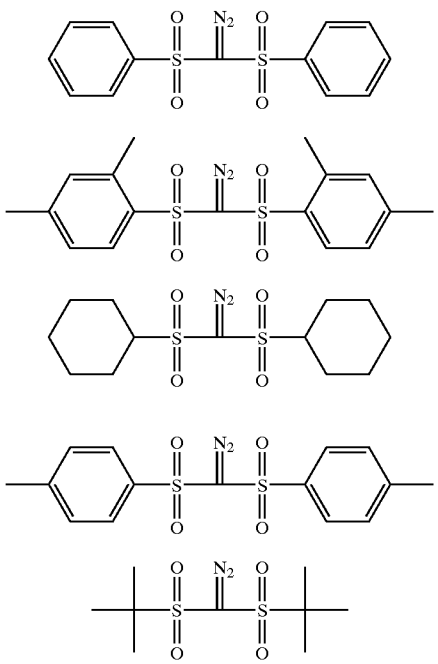

(PAG7-1)

(PAG7-2)

(PAG7-3)

(PAG7-4)

(PAG7-5)

The photo-acid generator is usually used in an amount of, based on the solid content in the composition, from 0.001 to 40 wt %, preferably from 0.01 to 20 wt %, more preferably from 0.1 to 5 wt %. If the amount of the photo-acid generator added is less than 0.001 wt %, the sensitivity decreases, whereas if the added amount exceeds 40 wt %, the resist is excessively increased in the light absorption to disadvantageously cause deterioration of the profile or narrowing of the process (particularly, bake) margin.

Photo-Acid Generator Represented by Formula [Ia] or [IIa]

In formula [Ia] or [IIa], examples of the alkyl group represented by $R_1$ to $R_5$ include an alkyl group having from 1 to 25 carbon atoms which may have a substituent, such as methyl group, ethyl group, propyl group, n-butyl group, isobutyl group, sec-butyl group, t-butyl group, pentyl group, hexyl group, heptyl group, octyl group, t-amyl group, decanyl group, dodecanyl group and hexadecanyl group. Examples of the cycloalkyl group include a cycloalkyl group having from 3 to 25 carbon atoms which may have a substituent, such as cyclopropyl group, cyclopentyl group, cyclohexyl group, cyclooctyl group cyclododecanyl group and cyclohexadecanyl group. Examples of the alkoxy group include an alkoxy group having from 1 to 25 carbon atoms which may have a substituent, such as methoxy group, ethoxy group, propoxy group, isopropoxy group, n-butoxy group, isobutoxy group, sec-butoxy group, t-butoxy group, pentyloxy group, t-amyloxy group, n-hexyloxy group, n-octyloxy group and n-dodecanoxy group.

Examples of the alkoxycarbonyl group include an alkoxycarbonyl group having from 2 to 25 carbon atoms which may have a substituent, such as methoxycarbonyl group, ethoxycarbonyl group, propoxycarbonyl group, isopropoxycarbonyl group, n-butoxycarbonyl group, isobutoxycarbonyl group, sec-butoxycarbonyl group, t-butoxycarbonyl group, pentyloxycarbonyl group, t-amyloxycarbonyl group, n-hexyloxycarbonyl group, n-octyloxycarbonyl group and n-dodecanoxycarbonyl group. Examples of the acyl group include an acyl group having from 1 to 25 carbon atoms which may have a substituent, such as formyl group, acetyl group, butyryl group, valeryl group, hexanoyl group, octanoyl group, t-butylcarbonyl group and t-amylcarbonyl group. Examples of the acyloxy group include an acyloxy group having from 2 to 25 carbon atoms which may have a substituent, such as acetoxy group, ethylyloxy group, butyryloxy group, t-butyryloxy group, t-amylyloxy group, n-hexanecarbonyloxy group, n-octanecarbonyloxy group, n-dodecanecarbonyloxy group and n-hexadecanecarbonyloxy group. Examples of the halogen atom include fluorine atom, chlorine atom, bromine atom and iodine atom.

Preferred examples of the substituent of these groups include an alkoxy group having from 1 to 4 carbon atoms, a halogen atom (e.g., fluorine, chlorine, bromine, iodine), an acyl group, an acyloxy group, a cyano group, a hydroxy group, a carboxy group, an alkoxycarbonyl group and a nitro group.

At least one of $R_{1a}$ and $R_{2a}$ is an alkyl group which may have a substituent having 5 or more carbon atoms, a cycloalkyl group which may have a substituent having 5 or more carbon atoms, an alkoxy group which may have a substituent having 5 or more carbon atoms, an alkoxycarbonyl group which may have a substituent having 5 or more carbon atoms, an acyl group which may have a substituent having 5 or more carbon atoms or an acyloxy group which may have a substituent having 5 or more carbon atoms.

Examples of the substituent having 5 or more carbon atoms include those having from 5 to 25 carbon atoms out of the above-described specific examples.

When $l_2+m_2+n_2=1$, $R_{3a}$ represents an alkyl group which may have a substituent, a cycloalkyl group which may have a substituent, an alkoxy group which may have a substituent, an alkoxycarbonyl group which may have a substituent, an acyl group which may have a substituent or an acyloxy group which may have a substituent. $R_{3a}$ preferably has 2 or more carbon atoms, more preferably 4 or more carbon atoms.

Among those groups, the alkyl group represented by $R_{1a}$ to $R_{5a}$, which may have a substituent, is preferably a methyl group, an ethyl group, a propyl group, an isopropyl group, a butyl group, a t-butyl group, an n-pentyl group, a t-amyl group, an n-hexyl group, an n-octyl group or a decanyl group; the cycloalkyl group is preferably a cyclohexyl group which may have a substituent, a cycooctyl group which may have a substituent or a cyclododecanyl group which may have a substituent; the alkoxy group is preferably a methoxy group which may have a substituent, an ethoxy group which may have a substituent, an isopropoxy group which may have a substituent, an n-butoxy group which may have a substituent, a sec-butoxy group which may have a substituent, a t-butoxy group which may have a substituent, a pentyloxy group which may have a substituent, a t-amyloxy group which may have a substituent, an n-hexyloxy group which may have a substituent, an n-octyloxy group which may have a substituent or an n-dodecanoxy group which may have a substituent; the alkoxycarbonyl group is preferably a methoxycarbonyl group which may have a substituent, an ethoxycarbonyl group which may have a substituent, an isopropoxycarbonyl group which may have a substituent, an n-butoxycarbonyl group which may have a substituent, a sec-butoxycarbonyl group which may have a substituent, a t-butoxycarbonyl group which may have a substituent, a pentyloxycarbonyl group which may have a substituent, a t-amyloxycarbonyl group which may have a substituent, an n-hexyloxycarbonyl group which may have a substituent, an n-octyloxycarbonyl group which may have a substituent or an n-dodecanoxycarbonyl group which may have a substituent; the acyl group is preferably a formyl group which may have a substituent, an acetyl group which may have a substituent, a butyryl group which may have a substituent, a valeryl group which may have a substituent, a hexanoyl group which may have a substituent, an octanoyl group which may have a substituent, a t-butylcarbonyl group which may have a substituent or a t-amylcarbonyl group which may have a substituent; and the acyloxy group is preferably an acetoxy group which may have a substituent, an ethylyloxy group which may have a substituent, a butyryloxy group which may have a substituent, a t-butyryloxy group which may have a substituent, a t-amylyloxy group which may have a substituent, an n-hexanecarbonyloxy group which may have a substituent or an n-octanecarbonyloxy group which may have a substituent.

The alkyl group which may have a substituent having 5 or more carbon atoms is preferably an n-pentyl group, a t-amyl group, an n-hexyl group, an n-octyl group or a decanyl group; the cycloalkyl group which may have a substituent having 5 or more carbon atoms is preferably a cyclohexyl group, a cyclooctyl group or a cyclododecanyl group; the alkoxy group which may have a substituent having 5 or more carbon atoms is preferably a pentyloxy group, a t-amyloxy group, a hexyloxy group, an n-octyloxy group or a dodecanoxy group; the alkoxycarbonyl group which may have a substituent having 5 or more carbon atoms is preferably a pentyloxycarbonyl group, a t-amyloxycarbonyl group, a hexyloxycarbonyl group, an n-octyloxycarbonyl group or a dodecanoxycarbonyl group; the acyl group which may have a substituent having 5 or more carbon atoms is preferably a valeryl group, a hexanoyl group, an octanoyl group or a t-amylcarbonyl group; and the acyloxy group which may have a substituent having 5 or more carbon atoms is preferably a t-amyloxy group, an n-hexanecarbonyloxy group or an n-octanecarbonyloxy group.

The substituent of these groups is preferably a methoxy group, an ethoxy group, a t-butoxy group, chlorine atom, bromine atom, a cyano group, a hydroxyl group, a methoxycarbonyl group, an ethoxycarbonyl group, a t-butoxycarbonyl group or a t-amyloxycarbonyl group.

The sulfonium and iodonium compounds represented by formulae [Ia] and [IIa], respectively, each uses a sulfonium acid having a specific structure as the counter anion $X_a^-$.

Examples of the aliphatic hydrocarbon group which may have a substituent, represented by $R_a$ in the counter anion, include a linear or branched alkyl group having from 1 to 20 carbon atoms and a cyclic alkyl group. $R_a$ also includes an aromatic group which may have a substituent.

Examples of the alkyl group represented by $R_a$ include an alkyl group having from 1 to 20 carbon atoms, such as methyl group which may have a substituent, ethyl group which may have a substituent, propyl group which may have a substituent, n-butyl group which may have a substituent, n-pentyl group which may have a substituent, n-hexyl group which may have a substituent, n-octyl group which may have a substituent, 2-ethylhexyl group which may have a substituent, decyl group which may have a substituent and dodecyl group which may have a substituent. Examples of the cyclic alkyl group include a cyclopentyl group which may have a substituent, a cyclohexyl group which may have a substituent, a cyclooctyl group which may have a substituent, a cyclododecyl group which may have a substiltuent, an adamantyl group which may have a substituent, a norbornyl group which may have a substituent, a camphor group which may have a substituent, a tricyclodecanyl group which may have a substituent and a menthyl group which may have a substituent. Examples of the aromatic group include a phenyl group which may have a substituent and a naphthyl group which may have a substituent.

Among these groups, the alkyl group which may have a substituent, represented by $R_a$, is preferably a methyl group, a trifluoromethyl group, an ethyl group, a pentafluoroethyl group, a 2,2,2-trifluoroethyl group, an n-propyl group, an n-butyl group, a nonafluorobutyl group, an n-pentyl group, an n-hexyl group, an n-octyl group, a heptadecafluorooctyl group, a 2-ethylhexyl group, a decyl group or a dodecyl group; the cyclic alkyl group is preferably a cyclopentyl group, a cyclohexyl group or a camphor group; and the aromatic group is preferably a phenyl group, a naphthyl group, a pentafluorophenyl group, a p-toluyl group, a p-fluorophenyl group, a p-chlorophenyl group, a p-hydroxyphenyl group, a p-methoxyphenyl group, a dodecylphenyl group, a mesityl group, a triisopropylphenyl group, a 4-hydroxy-1-naphthyl group or a 6-hydroxy-2-naphthyl group, which may have a substituent.

More preferred specific examples of the substituents $R_{1a}$ to $R_{5a}$ include a methyl group, an ethyl group, a propyl group, an isopropyl group, an n-butyl group, a t-butyl group, an n-pentyl group, a t-amyl group, an n-hexyl group, an n-octyl group, a cyclohexyl group, a methoxy group, an ethoxy group, an isopropoxy group, an n-butoxy group, a t-butoxy group, a pentyloxy group, a t-amyloxy group, a hexyloxy group, an n-octyloxy group, a methoxycarbonyl group, an ethoxycarbonyl group, an n-butoxycarbonyl group, a t-butoxycarbonyl group, a t-amyloxycarbonyl group, a hexyloxycarbonyl group, an n-octyloxycarbonyl group, a formyl group, an acetyl group, a butyryl group, a hexanoyl group, an octanoyl group, a t-butylcarbonyl group, a t-amylcarbonyl group, an acetoxy group, an ethylyloxy group, a butyryloxy group, a t-butyryloxy group, a t-amylyloxy group, an n-hexanecarbonyloxy group, an n-octanecarbonyloxy group, a hydroxyl group, chlorine atom, bromine atom and a nitro group.

More preferred specific examples of the group having 5 or more carbon atoms include an n-pentyl group, a t-amyl group, an n-hexyl group, an n-octyl group, a decanyl group, a cyclohexyl group, a pentyloxy group, a t-amyloxy group, a hexyloxy group, an n-octyloxy group, a dodecanoxy group, a pentyloxycarbonyl group, a t-amyloxycarbonyl group, a hexyloxycarbonyl group, an n-octyloxycarbonyl group, a decanoxycarbonyl group, a valeryl group, a hexanoyl group, an octanoyl group, a t-amylcarbonyl group, a t-amylyloxy group, an n-hexanecarbonyloxy group and an n-octanecarbonyloxy group.

More preferred specific examples of the substituent $R_a$ of the sulfonic acid include a methyl group, a trifluoromethyl group, an ethyl group, a pentafluoroethyl group, a 2,2,2-trifluoroethyl group, an n-butyl group, a nonafluorobutyl group, an n-hexyl group, an n-octyl group, a heptadecafluorooctyl group, a 2-ethylhexyl group, a camphor group, a phenyl group, a naphthyl group, a pentafluorophenyl group, a p-toluyl group, a p-fluorophenyl group, a p-chlorophenyl group, a p-methoxyphenyl group, a dodecylphenyl group, a mesityl group, a trilsopropylphenyl group, a 4-hydroxy-1-naphthyl group and a 6-hydroxy-2-naphthyl group.

The acid generated preferably has a total carbon number of from 1 to 30, more preferably from 1 to 28, still more preferably from 1 to 25. If the total carbon number is less than 1, the pattern formation may have a trouble such as formation of a t-top shape, whereas if it exceeds 30, the development residue may disadvantageously result.

Specific examples of the compounds represented by formulae [Ia] and [IIa] as the acid generator for use in the present invention include the following compounds [Ia-1] to [Ia-18] and [IIa-1] to [IIa-20], however, the present invention is by no means limited thereto. These compounds are used individually or in combination of two or more thereof.

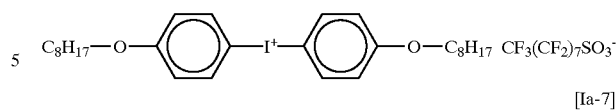

[Ia-1]

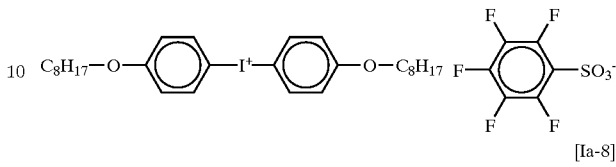

[Ia-2]

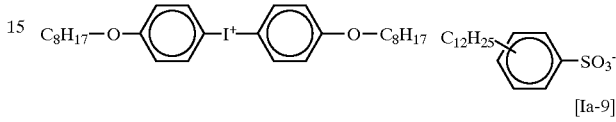

[Ia-3]

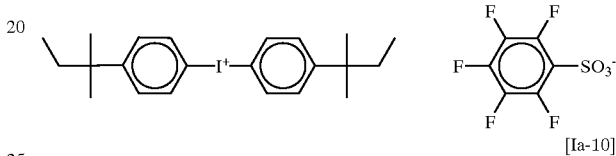

[Ia-4]

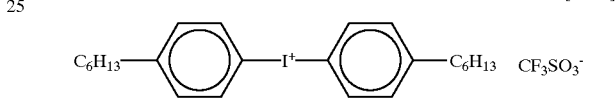

[Ia-5]

[Ia-6]

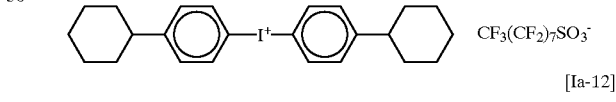

[Ia-7]

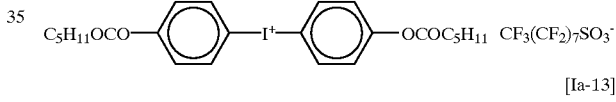

[Ia-8]

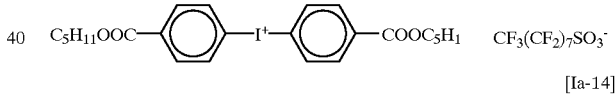

[Ia-9]

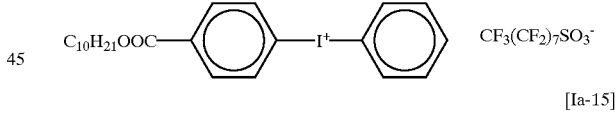

[Ia-10]

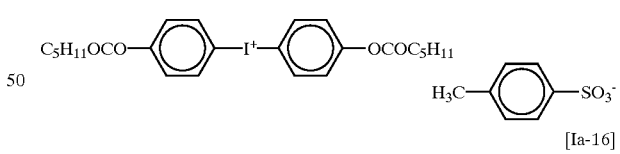

[Ia-11]

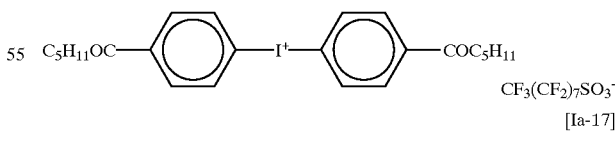

[Ia-12]

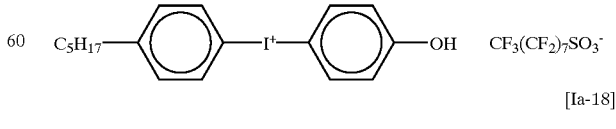

[Ia-13]

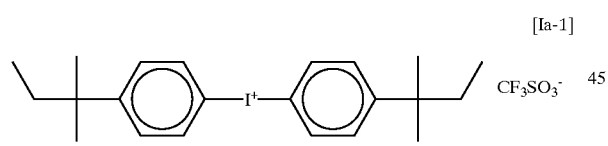

[Ia-14]

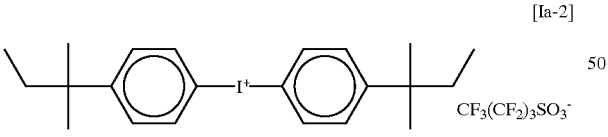

[Ia-15]

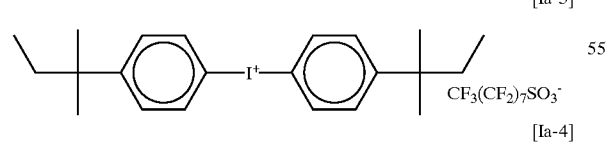

[Ia-16]

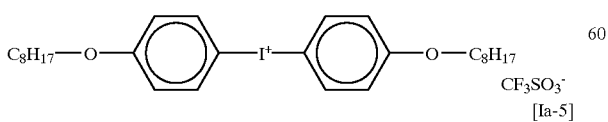

[Ia-17]

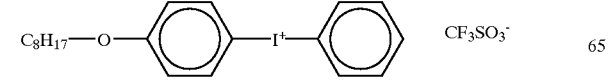

[Ia-18]

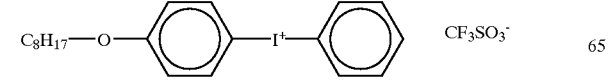
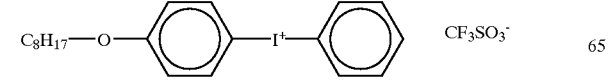

[IIa-1]
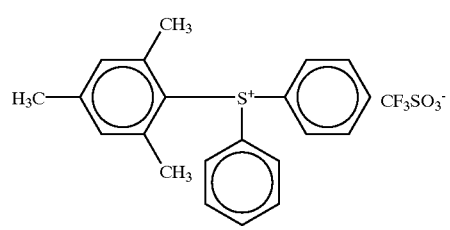
[IIa-2]
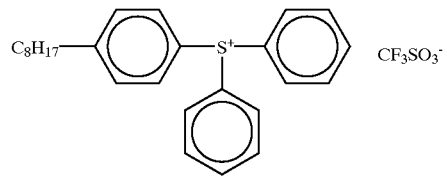
[IIa-3]
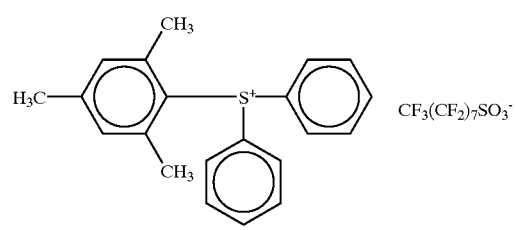
[IIa-8]
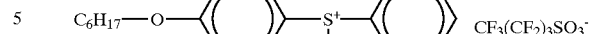
[IIa-9]
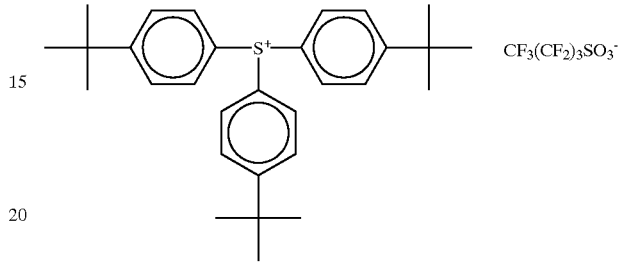
[IIa-4]
[IIa-10]
[IIa-5]
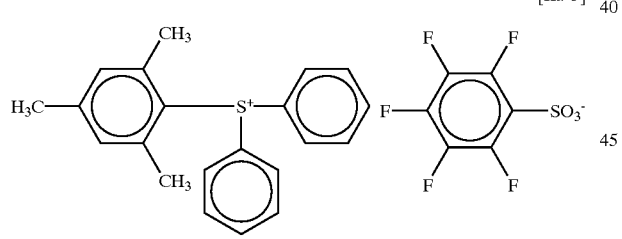
[IIa-11]
[IIa-6]
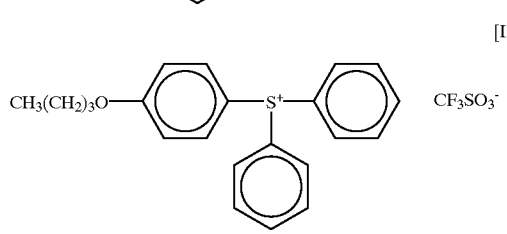
[IIa-12]
[IIa-7]
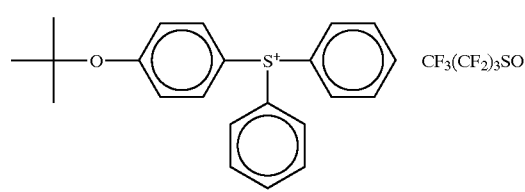
[IIa-13]
[IIa-14]

-continued

[IIa-15]
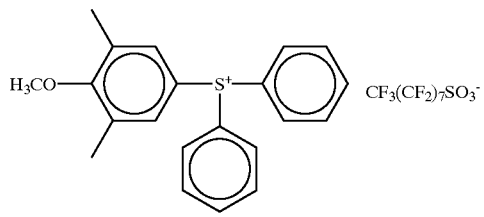

[IIa-16]
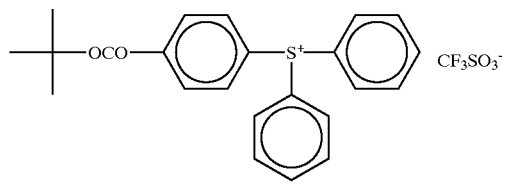

[IIa-17]
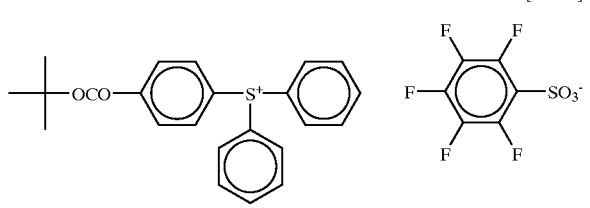 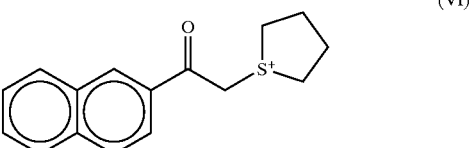

[IIa-18]
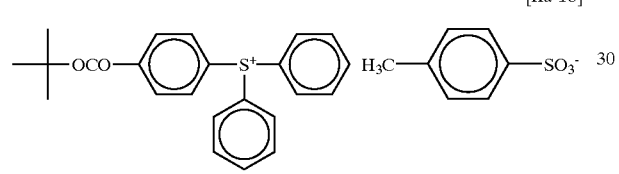 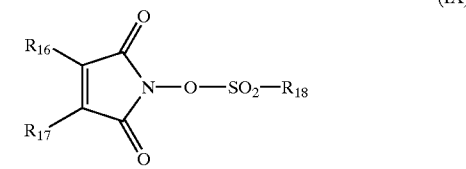

[IIa-19]
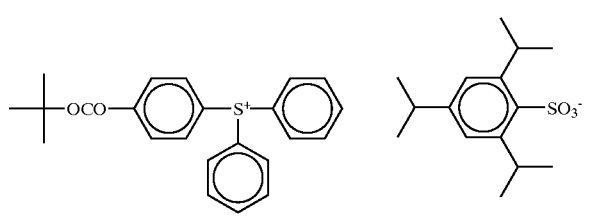

[IIa-20]
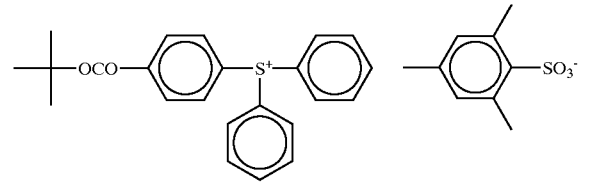

The photo-acid generator which can be used in combination with the compound capable of generating an acid upon irradiation with actinic rays or radiation (photo-acid generator) represented by formula [Ia] or [IIa] in the positive photoresist composition of the present invention is described below.

This photo-acid generator must satisfy two properties, namely, (1) transparency to exposure light (but not having light bleaching property) and (2) light resolving property sufficiently high to ensure the resist sensitivity. Although a clear guide is not known at present for the molecular design to satisfy these contradictory requirements, the following examples may be used.

Namely, aliphatic alkylsulfonium salts having a 2-oxocyclohlexyl group and N-hydroxysuccinimide sulfonates described i JP-A-7-25846, JP-A-7-28237, JP-A-7-92675 and JP-A-8-27102 may be used. Furthermore, sulfonium salts represented by the following formula (VI), disulfones represented Try toe following formula (VI) and compounds represented by the following formula (VIII), described in *J. Photopolym. Sci. Technol.*, Vol. 7, No. 3, p. 423 (1994) may be used.

(VI)
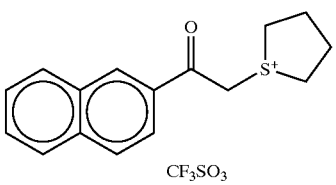

(VII)
$$R_{12}-SO_2SO_2-R_{13}$$

(VIII)
$$R_{14}-SO_2-\overset{N_2}{\underset{}{C}}-SO_2-R_{15}$$

wherein $R_{12}$ to $R_{15}$, which may be the same or different, each represents an alkyl group or a cyclic alkyl group.

Also, N-hydroxymaleinimide sulfonates represented by the following formula (IX) may be suitably used.

(IX)
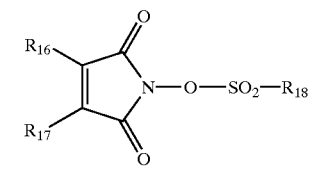

wherein $R_{14}$ and $R_{17}$, which may be the same or different, each represents a hydrogen atom, an alkyl group having from 1 to 6 carbon atoms or a cycloalkyl group having from 1 to 6 carbon atoms, $R_{14}$ and $R_{17}$ may be combined through an alylene group to form a ring, and $R_{14}$ represents an alkyl group, a perfluoroalkyl group, a cycloalkyl group or a camphor substitution product. These N-hydroxymaleinimide sulfonates are particularly preferred in view of the light sensitivity.

In formula (IX), examples of the alkyl group having from 1 to 6 carbon atoms, represented by $R_{14}$ or $R_{17}$ include a methyl group, an ethyl group, a propyl group, an isopropyl group, an n-butyl group, an isobutyl group, a tert-butyl group, an n-pentyl group and an n-hexyl group. Among these, preferred are a methyl group, an ethyl group and a propyl group, more preferred are a methyl group and an ethyl group. Examples of the cycloalkyl group having 6 or less carbon atoms include a cyclopropyl group, a cyclopentyl group and a cyclohexyl group. Among these, preferred are a cyclopenlyl group and a cyclohexyl group. Examples of the ring formed by the combining of $R_{16}$ and $R_{17}$ through an alkylene chain include a cyclohexyl group, a norbornyl group and a tricyclodecanyl group.

Examples of the alkyl group represented by $R_{18}$ include a linear alkyl group having from 1to 20 carbon atoms, such as methyl group, ethyl group and propyl group, and a branched alkyl group having from 1 to 20 carbon atoms, such as isopropyl group, isobutyl group, tert-butyl group and neopentyl group. Among these, preferred is a linear or branched alkyl group having from 1 to 16 carbon atoms, more preferred is a linear or branched alkyl group having from 4 to 15 carbon atoms. Examples of the perfluoroalkyl group include a linear perfluoroalkyl group having from 1 to 20 carbon atoms, such as trifluoromethyl group and pentafluoroethyl group, and a branched perfluoroalkyl group having from 1 to 20 carbon atoms, such as heptafluoroisopropyl group and nonafluoro-tert-butyl group. Among these, preferred is a linear or branched perfluoroalkyl group having from 1 to 16 carbon atoms. Examples of the cyclic alkyl group include a monocyclic or cyclic alkyl group such as cyclopentyl group and cyclohexyl group, and a multi-cyclic alkyl group such as decalyl, norbornyl group and tricyclodecanyl group.

This photo-acid generator which can be used in combination is usually added to the composition in an amount of preferably from 0.01 to 5 wt %, more preferably from 0.03 to 3 wt %, still more preferably from 0.05 to 2 wt %, based on the entire solid content of the positive photoresist composition.

In the positive photoresist composition of the present invention, the photo-acid generator disclosed in this patent application other than the photo-acid generators represented by formulae (Ia) and (IIa) may be used in combination.

The resin (B) having a repeating unit represented by formula (I) and capable of decomposing under the action of an acid to increase the solubility in alkali is described below.

In formula (I), the alkyl group represented by $R_1$ is a linear or branched alkyl group having from 1 to 4 carbon atoms. Specific examples thereof include methyl, ethyl, n-propyl, isopropyl, n-butyl, isobutyl, sec-butyl and t-butyl. The alkyl group may be substituted and examples of the substituent include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

Examples of the halogen atom represented by $R_1$ include fluorine atom, chlorine atom, bromine atom and iodine atom.

In formula (I), as described above, at least one of $R_2$ to $R_4$ is a hydroxyl group, preferably a dihydroxy form or a monohydroxy form, more preferably a monohydroxy form.

This resin used in the present invention has a group capable of decomposing under the action of an acid (also called an acid-decomposable group). For such an acid-decomposable group, those conventionally used in this field can be used.

Examples of the acid-decomposable group include those represented by the formula: —C(=O)—$X_1$—$R_0$ (wherein $R_0$ is a tertiary alkyl group such as t-butyl group and t-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxyimethyl group, a tetrahydropyranyl group, a tetrahydrofuranyl group, a trialkylsilylester group or a 3-oxocyclohexylester group; $X_1$ represents oxygen atom, sulfur atom, —NH—, —NHSO$_2$— or —NHSO$_2$NH—). Also, a group represented by the following formula (II) and a group in which the alkali-soluble group is protected by the group represented by the following formula (pI), (pII), (pIII), (pIV), (pV) or (pVI) may be used.

In the present invention, the acid-decomposable group is preferably a group represented by the following formula (II) or a group in which the alkali-soluble group is protected by the group represented by the following formula (pI), (pII), (pIII), (pIV), (pV) or (pVI).

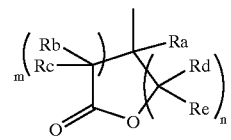
(II)

wherein Ra represents a hydrogen atom, an alkyl group having from 1 to 4 carbon toms, provided that when m is 0 or 2, Ra represents an alkyl group having from 1 to 4 carbon atoms, Rb to Re each independently represents a hydrogen atom or an alkyl group which may have a substituent, and m represents an integer of from 0 to 2, and n represents an integer of from 1 to 3, provided that m+n is a number of from 2 to 6.

(pI)

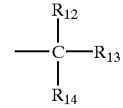
(pII)

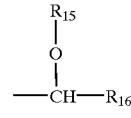
(pIII)

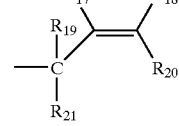
(pIV)

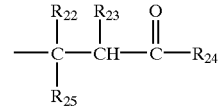
(pV)

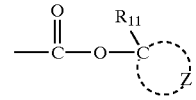
(pVI)

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ to $R_{21}$ each independently represents a hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of $R_{22}$ to $R_{25}$ represents an alicyclic hydrocarbon group.

In formulae (pI) to (pVI), the alkyl group represented by any one of $R_{12}$ to $R_{25}$ is a linear or branched alkyl group having from 1 to 4 carbon atoms, which may be substituted or unsubstituted. Examples of the alkyl group include a methyl group, an ethyl group, an n-propyl group, an isopropyl group, an n-butyl group, an isobutyl group, a sec-butyl group and a t-butyl group.

Examples of the substituent of this alkyl group include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group represented by any one of $R_{11}$ to $R_{25}$ or the alicyclic hydrocarbon group formed by Z and the carbon atom may be either monocyclic or polycyclic. Specific examples thereof include a group having 5 or more carbon atoms and having a monocyclo-, bicyclo-, tricyclo- or tetracyclo-structure. The carbon number is preferably from 6 to 30, more preferably from 7 to 25. The alicyclic hydrocarbon group may have a substituent.

Examples of the structure in the alicyclic moiety of the group containing an alicyclic hydrocarbon structure are set forth below.

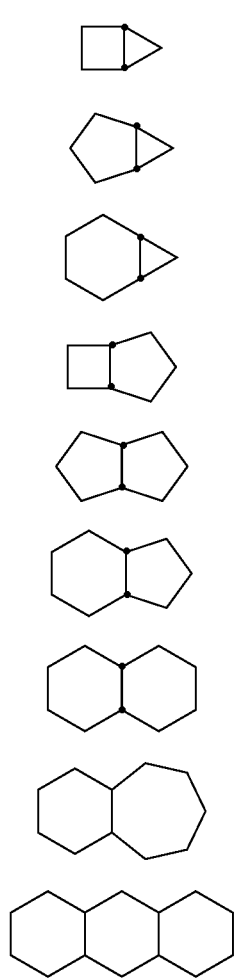

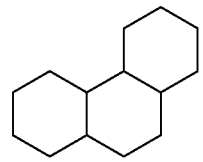

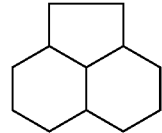

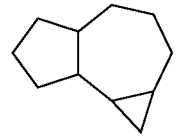

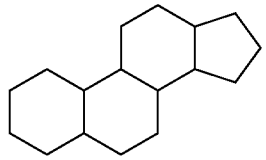

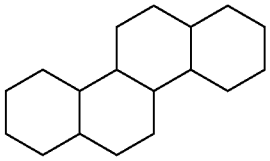

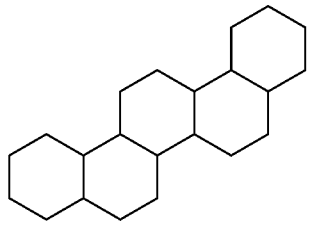

-continued
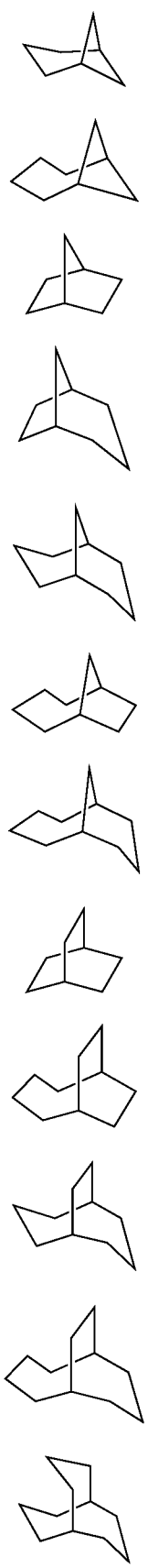
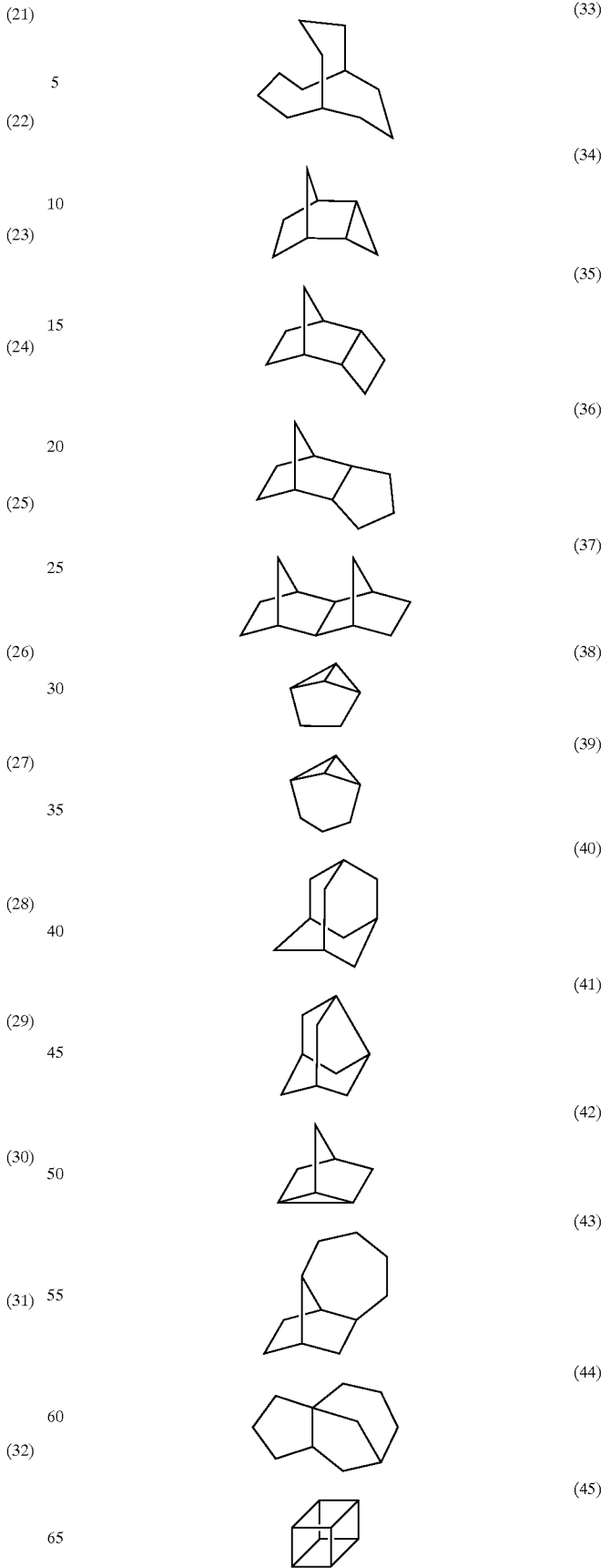

(46)

(47)

(48)

(49)

(50)

Among these alicyclic moieties, preferred in the present invention are an adamantyl group, a noradamantyl group, a decaline residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decaline residue, a norbornyl group, a cedrol group, a cyclohexyl group, a cycloheptyl group, a cyclooctyl group, a cyclodecanyl group and a cyclododecanyl group.

Examples of the substituent of the alicyclic hydrocarbon group include an alkyl group, a substituted alkyl group, a halogen atom, a hydroxyl group, an alkoxy group, a carboxy group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group.

Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group.

Examples of the alkali-soluble group represented by formula (II) or protected by a structure represented by formula (pI), (pII), (pIII), (pIV), (pV) or (pVI) include various groups known in this technical field. Specific examples thereof include a carboxylic acid group, a sulfonic acid group, a phenol group and a thiol group. Among these, preferred are a carboxylic acid group and a sulfonic acid group.

Preferred examples of the alkali-soluble group protected by a structure represented by formula (pI), (pII), (pIII), (pIV), (pV) or (pVI) in the resin include the groups represented by the following formulae (pVII) to (pXI):

(pVII)

(pVIII)

(pIX)

(pX)

(pXI)

wherein $R_{11}$ to $R_{25}$ and Z have the same meanings as defined above.

The repeating unit having an alkali-soluble group protected by a structure represented by formula (pI), (pII), (pIII), (pIV), (pV) or (pVI), constituting the alkali-soluble resin is preferably a repeating unit represented by the following formula (pA):

(pA)

wherein R represents a hydrogen atom, a halogen atom or a substituted or unsubstituted, linear or branched alkyl group having from 1 to 4 carbon atoms, and Rs in plurality may be the same or different; A' represents a single bond, a group selected from the group consisting of an alkylene group, a substituted alkylene group, an ether group, a thioether group, a carbonyl group, an ester group, an amino group, a sulfonamido group, a urethane group and a urea group, or a group comprising a combination of two or more of these groups; and $R_p$ represents any one group of (pI), (pII), (pIII), (pIV), (pV) and (pVI).

Specific examples of the monomer corresponding to the repeating unit represented by formula (pA) are set forth below.

1

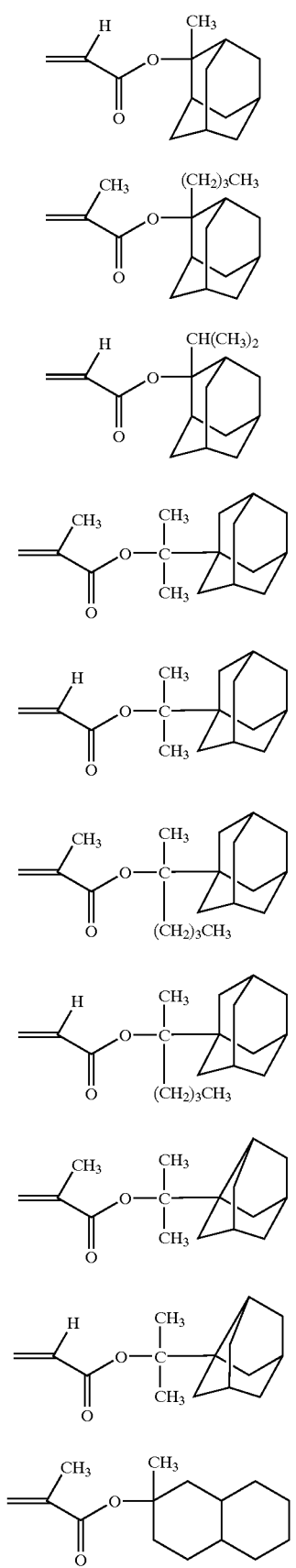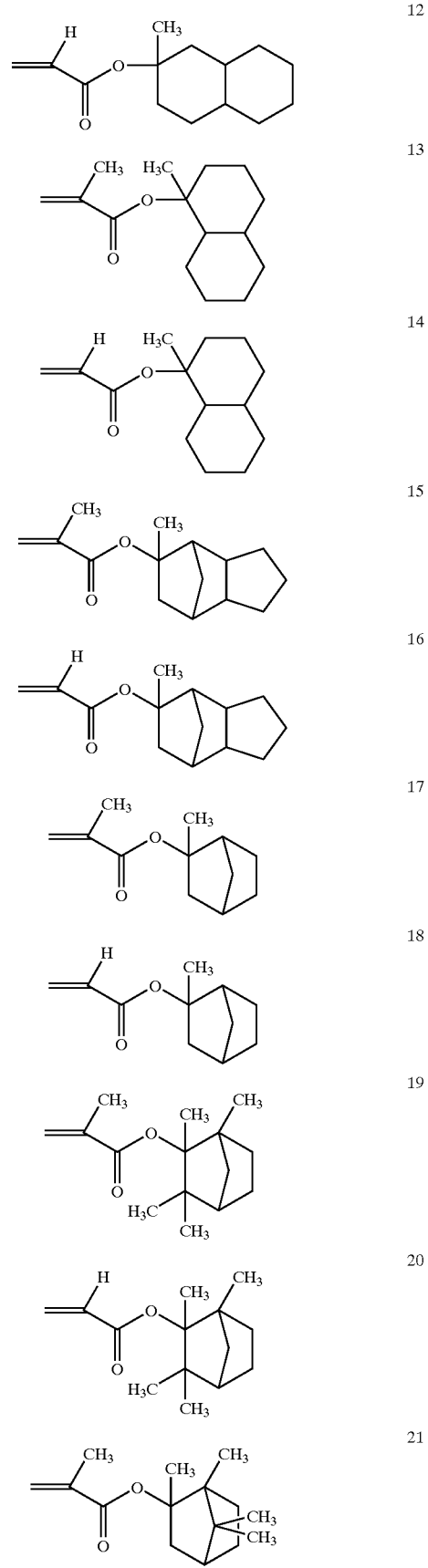

-continued
22
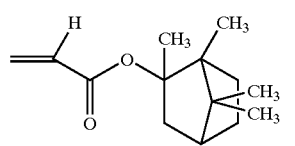
23
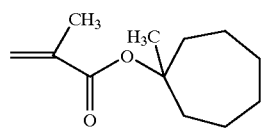
24
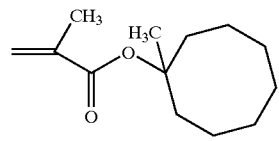
25
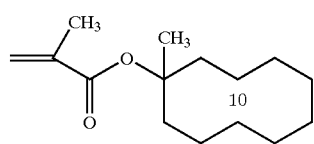
26
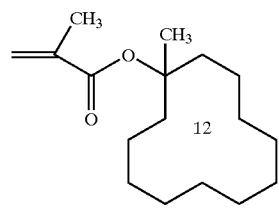
27
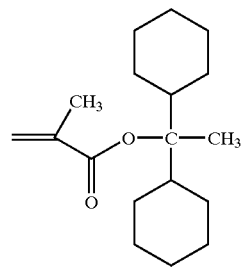
28
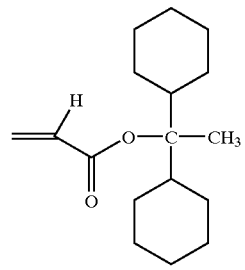
29
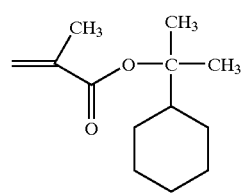
-continued
30
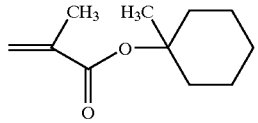
31
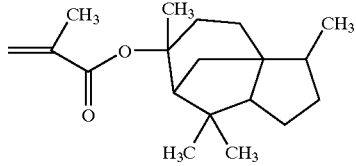
32
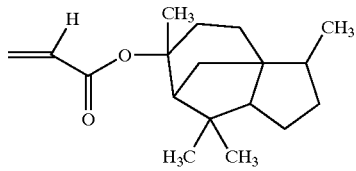
33
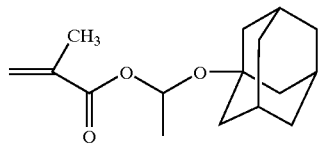
34
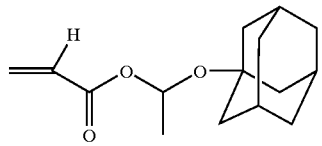
35
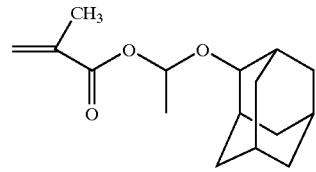
36
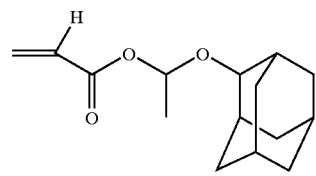
37
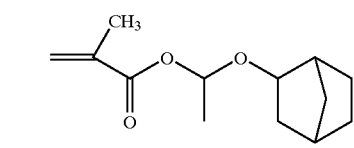
38
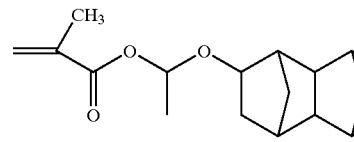
39
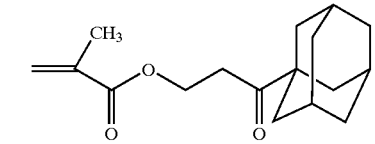

-continued

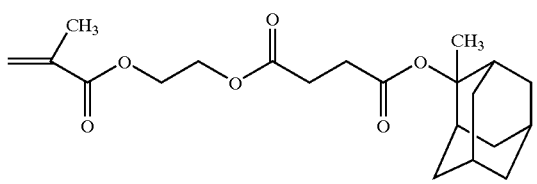
40

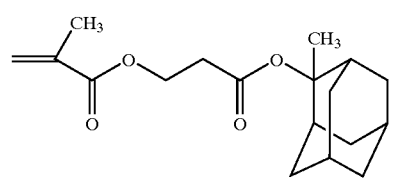
41

In the group represented by formula (II), Ra represents a hydrogen atom or an alkyl group having from 1 to 4 carbon toms, provided that when m is 0 or 2, Ra represents an alkyl group having from 1 to 4 carbon atoms, Rb to Re each Independently represents a hydrogen atom or an alkyl group Which may have a substituent, and m represents an integer of from 0 to 2, and n represents an integer of from 1 to 3, provided that m+n is a number of from 2 to 6.

The alkyl group represented by Ra in formula (II) represents a linear or branched alkyl group having from 1 to 4 carbon atoms. Examples of the alkyl group include a methyl group, an ethyl group, an n-propyl group, an isopropyl group, an n-butyl group, an isobutyl group, a sec-butyl group and a t-butyl group. When m is 0 or 2, Ra represents a linear or branched alkyl group having from 1 to 4 carbon atoms.

Examples of the alkyl group represented by any one of Rb to Re include a linear or branched alkyl group which may have a substituent. The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group or a decyl group.

Examples of the substituent of this alkyl group include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

In formula (II), Ra is preferably a methyl group or an ethyl group when m is 0 or 2, or a hydrogen atom when m is 1, and Rb to Re each is preferably a hydrogen atom or a methyl group.

The repeating unit having a group represented by formula (II) is preferably a repeating unit represented by the following formula (AI):

(AI)

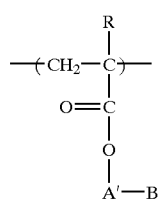

wherein R and A' have the same meanings as defined in formula (pA), and B represents a group represented by formula (AI). A' is preferably a single bond, a sole group selected from the group consisting of an alkylene group having from 1 to 10 carbon atoms, an ether group, a carbonyl group and an ester group, or a divalent group comprising a combination of two or more of these groups. The divalent group comprising a combination of two or more of those groups preferably has a structure shown below.

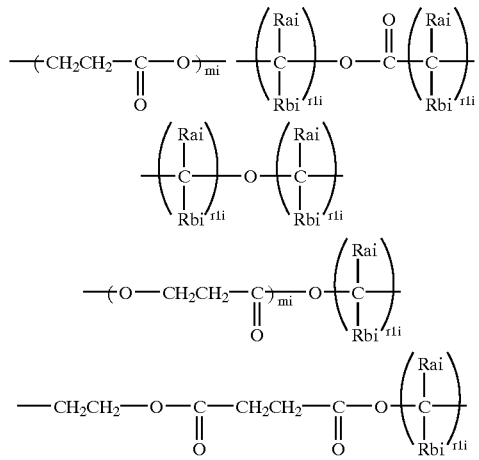

wherein Rai, Rbi and rli have the same meanings as defined later, and mi is a number of from 1 to 3.

The resin for use in the present invention may further contain another copolymer component in addition to the above-described repeating unit. Examples of this another copolymer component include the repeating units represented by the following formulae (III-a) to (III-d) By containing this, the resist is increased in the hydrophilicity and improved in the adhesion and the like.

(III-a)

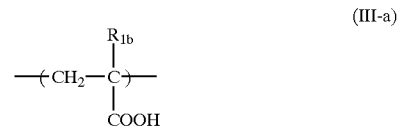

(III-b)

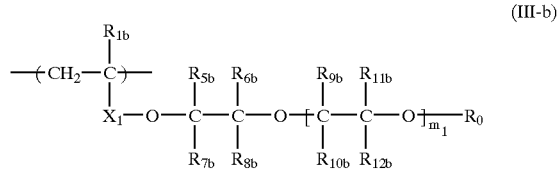

(III-c)

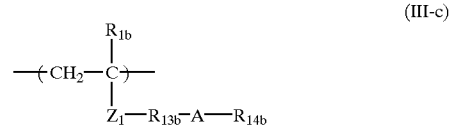

(III-d)

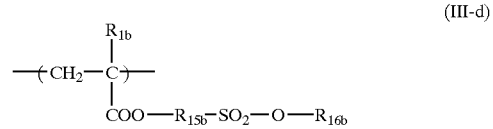

wherein $R_{1b}$ has the same meaning as defined above, $R_{5b}$ to $R_{12b}$ each independently represents a hydrogen atom or an alkyl group which may have a substituent, $R_0$ represents a hydrogen atom, an alkyl group which may have a substituent, a cyclic alkyl group which may have a substituent, an aryl group which may have a substituent or an aralkyl group which may have a substituent, m represents an integer of from 1 to 10, $X_1$ represents a single bond, an alkylene group which may have a substituent, a cyclic alkylene group which may have a substituent, an arylene group which may have a substituent, or a divalent group which comprises a sole group or a combination of at least two or more groups selected from the group consisting of an ether group, a thioether group, a carbonyl group, an ester group, an amido group, a sulfonamido group, a urethane group and a urea group, and which does not decompose under the action of an acid, $Z_1$ represents a single bond, an ether group, an ester group, an amido group, an alkylene group or a divalent group comprising a combination thereof, $R_{13b}$ represents a single bond, an alkylene group, an arylene group or a divalent group comprising a combination thereof, $R_{15b}$ represents an alkylene group, an arylene group or a divalent group comprising a combination thereof, $R_{14b}$ represents an alkyl group which may have a substituent, a cyclic alkyl group which may have a substituent, an aryl group Which may have a substituent or an aralkyl group which may have a substituent, $R_{14b}$ represents a hydrogen atom, an alkyl group which may have a substituent, a cyclic alkyl group which may have a substituent, an alkenyl group which may have a substituent, an aryl group which may have a substituent or an aralkyl group which may have a substituent, and A represents any one of the functional groups shown below:

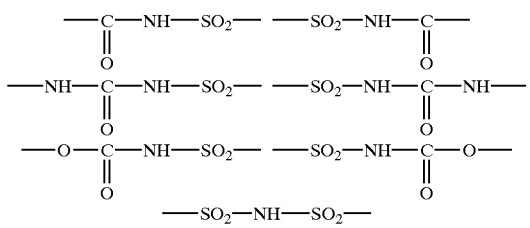

Examples of the alkyl group represented by any one of $R_{5b}$ to $R_{11b}$, $R_0$, $R_{14b}$ and $R_{16b}$ include a linear or branched alkyl group which may have a substituent. The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group or a decyl group.

Examples of the cyclic alkyl group represented by $R_0$, $E_{14b}$ or $R_{16b}$ include a cyclic alkyl group having from 3 to 30 carbon atoms and specific examples thereof include a cyclopropyl group, a cyclopentyl group, a cyclohexyl group, an adamantyl group, a norbornyl group, a boronyl group, a tricyclodecanyl group, a dicyclopentenyl group, a norbornane epoxy group, a menthyl group, an isomenthyl group, a neomenthyl group, a tetracyclododecanyl group and a steroid residue.

Examples of the aryl group represented by $R_0$, $R_{14b}$ or $R_{16b}$ include an aryl group having from 6 to 20 carbon atoms, which may have a substituent. Specific examples thereof include a phenyl group, a tolyl group and a naphthyl group.

Examples of the aralkyl group represented by $R_0$, $R_{14b}$ or $R_{16b}$ include an aralkyl group having from 7 to 20 carbon atoms, which may have a substituent. Specific examples thereof include a benzyl group, a phenethyl group and a cumyl group.

Examples of the alkenyl group represented by $R_{16b}$ include an alkenyl group having from 2 to 6 carbon atoms. Specific examples thereof include a vinyl group, a propenryl group, an allyl group, a butenyl group, a pentenyl group, a hexenyl group, a cyclopentenyl group, a cyclohexenyl group, a 3-oxocyclohexenyl group, a 3-oxocyclopentenyl group and a 3-oxoindenyl group. Among these, the cyclic alkenyl group each may contain oxygen atom.

Examples of the linking group $X_1$, include an alkylene group which may have a substituent, a cyclic alkylene group which may have a substituent, an arylene group which may have a substituent, or a divalent group which comprises a sole group or a combination of at least two or more groups selected from the group consisting of an ether group, a thioether group, a carbonyl group, an ester group, an amido group, a sulfonamido group, a urethane group and a urea group and which does not decompose under the action of an acid.

$Z_1$ represents a single bond, an ether group, an ester group, an amido group, an alkylene group or a divalent group comprising a combination thereof. $R_{13b}$ represents a single bond, an alkylene group, an arylene group or a divalent group comprising a combination thereof. $R_{15b}$ represents an alkylene group, an arylene group or a divalent group comprising a combination thereof.

Examples of the arylene group represented by $X_1$, $R_{13b}$ or $R_{15b}$ include an arylene group having from 6 to 10 carbon atoms, Which may have a substituent. Specific examples thereof include a phenylene group, a tolylene group and a naphthalene group.

Examples of the cyclic alkylene group represented by $X_1$ include the above-described cyclic alkyl groups which are divalent.

Examples of the alkylene group represented by $X_1$, $Z_1$, $R_{13b}$ or $R_{15b}$ include a group represented by the following formula:

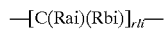

wherein Rai and Rbi, which may be the same or different, each represents a hydrogen atom, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the halogen Atom include chlorine atom, bromine atom, fluorine atom and iodine atom. rli represents an integer of from 1 to 10.

Specific examples of the linking group $X_1$ are set forth below, however, the present invention is by no means limited thereto.

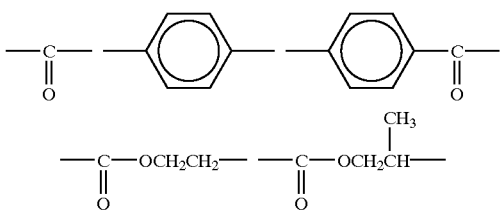

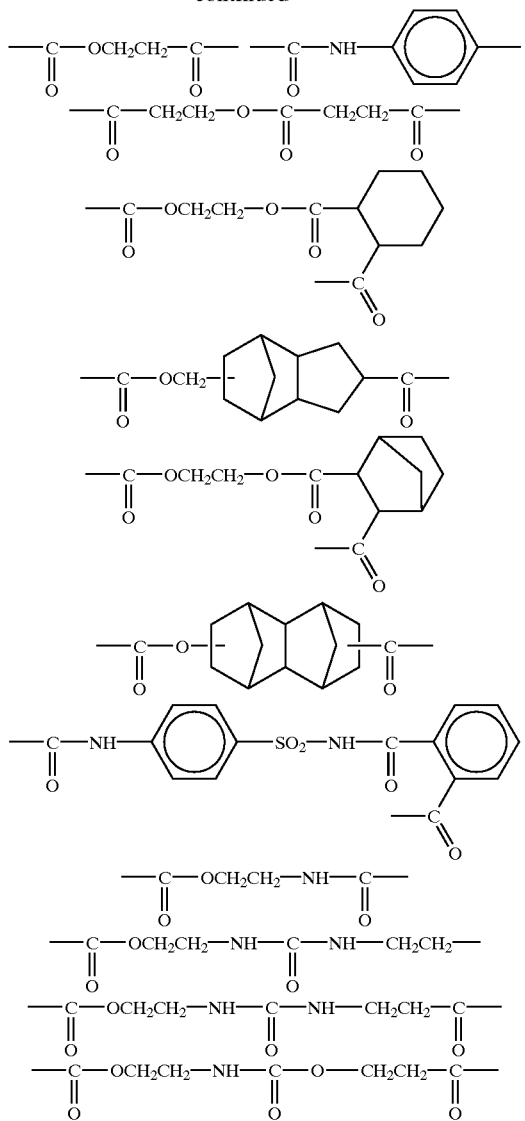

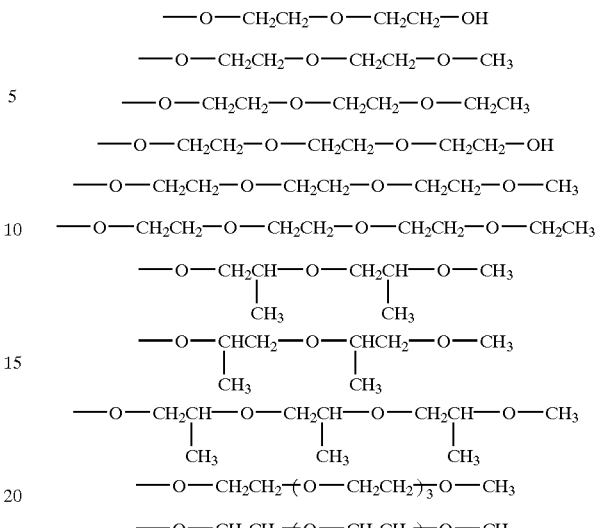

—O—CH$_2$CH$_2$—(O—CH$_2$CH$_2$)$_{\overline{3}}$O—CH$_3$

—O—CH$_2$CH$_2$—(O—CH$_2$CH$_2$)$_{\overline{4}}$O—CH$_3$

Examples of the substituent in the above-described alkyl group, cyclic alkyl group, alkenyl group, aryl group, aralkyl group, alkylene group, cyclic alkylene group and arylene group include a carboxyl group, an acyloxy group, a cyano group, an alkyl group, a substituted alkyl group, a halogen atom, a hydroxyl group, an alkoxy group, an acetylamido group, an alkoxycarbonyl group and an acyl group. Examples of the alkyl group include a lower alkyl group such as methyl group, ethyl group, propyl group, isopropyl group, butyl group, cyclopropyl group, cyclobutyl group and cyclopentyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the acyloxy group include an acetoxy group. Examples of the halogen atom include chlorine atom, bromine atom, fluorine atom and iodine atom.

Specific examples of the structure of the side chain in formula (III-b) are set forth below, where specific examples of the structure of the terminal moiety exclusive of X$_1$ are shown, however, the present invention is by no means limited thereto.

Specific examples of the monomer corresponding to the repeating structural unit represented by formula (III-c) are set forth below, however, the present invention is by no means limited thereto.

(1)

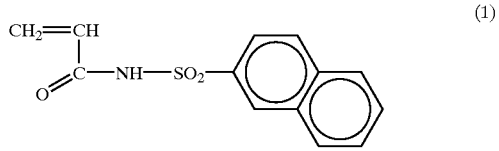

(2)

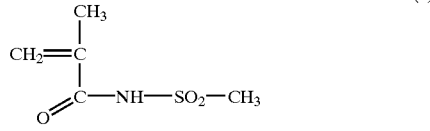

(3)

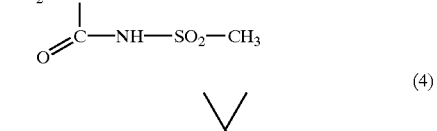

(4)

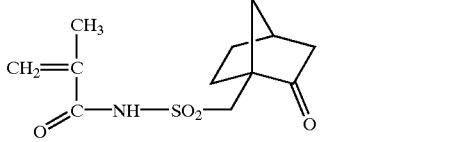

(5)

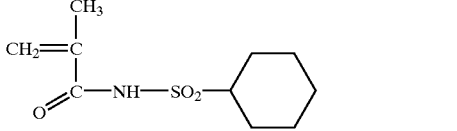

(6)

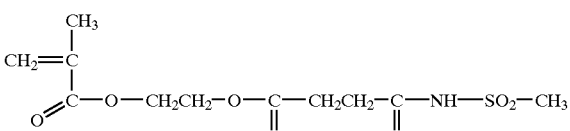

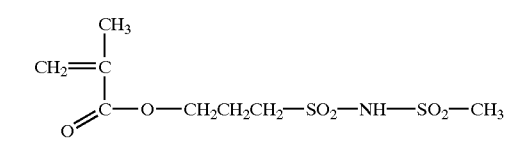
(7)
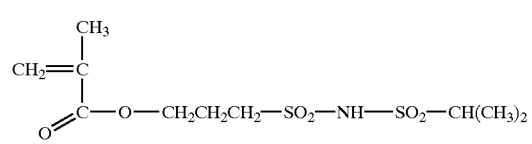
(8)
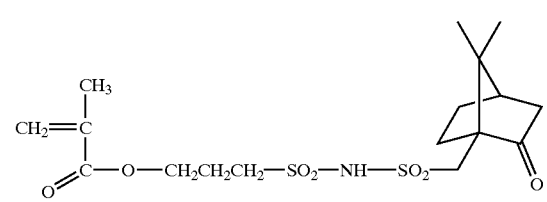
(9)
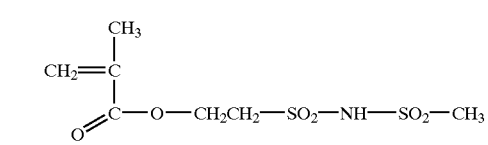
(10)
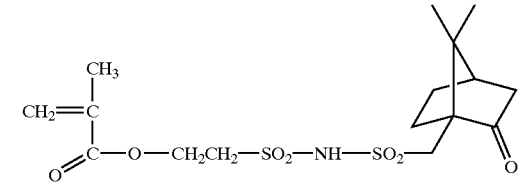
11
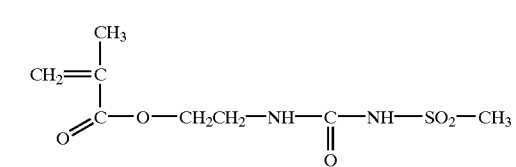
12
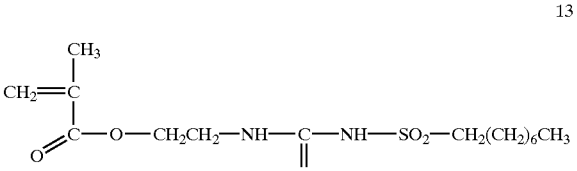
13
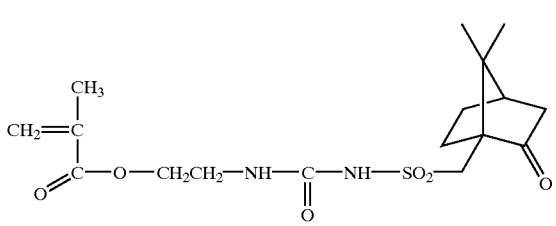
14
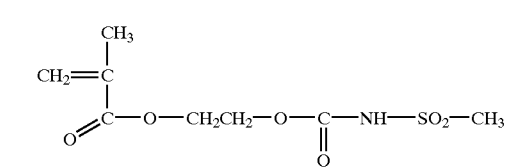
15
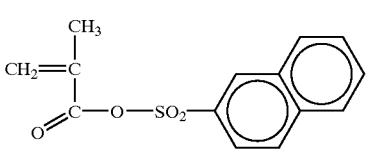
16
17
Specific examples of the repeating structural unit represented by formula (III-d) are set forth below, however, the present invention is by no means limited thereto.
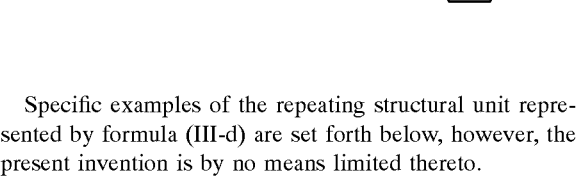
(1)
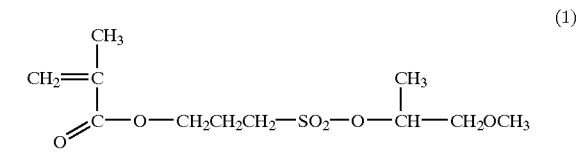
(2)
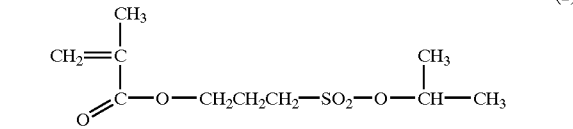
(3)
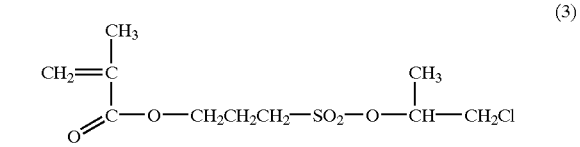
(4)
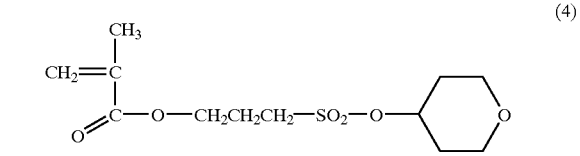
(5)
(6)
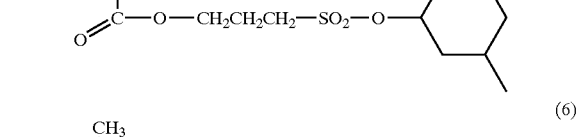
(7)

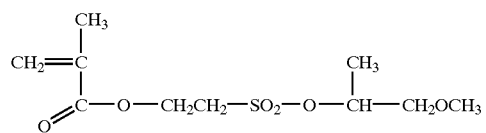
(8)

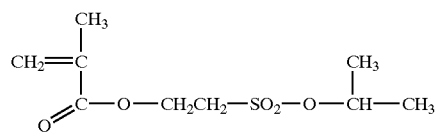
(9)

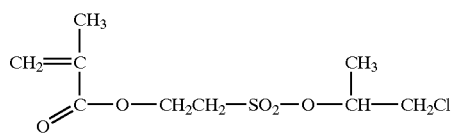
(10)

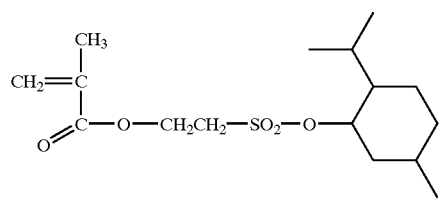
(11)

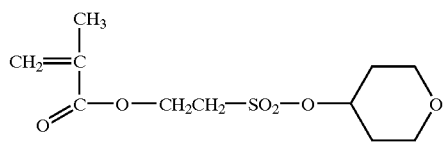
(12)

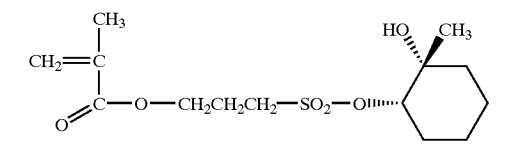
(13)

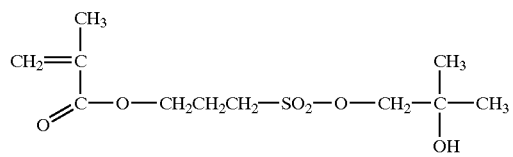
(14)

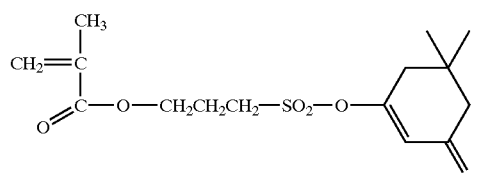
(15)

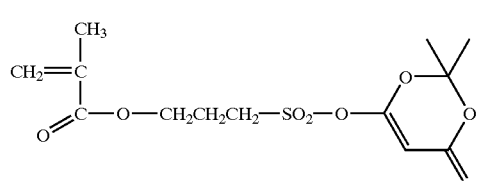
(16)

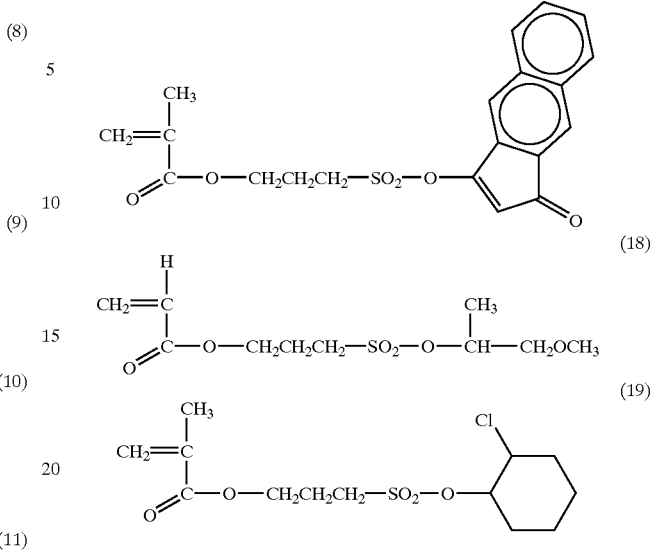
(17)

(18)

(19)

In formula (III-b), $R_{5b}$ to $R_{12b}$ each is preferably a hydrogen atom or a methyl group. R is preferably a hydrogen atom or an alkyl group having from 1 to 4 carbon atoms. $m_1$ is preferably a number of from 1 to 6.

In formula (III-c), $R_{13b}$ is preferably a single bond or an alkylene group such as methylene group, ethylene group, propylene group and butylene group. $R_{14b}$ is preferably an alkyl group having from 1 to 10 carbon atoms, such as methyl group and ethyl group, a cyclic alkyl group such as cyclopropyl group, cyclohexyl group and camphor residue, a naphthyl group or a naphthylmethyl group. Z is preferably a single bond, an ether bond, an ester bond, an alkylene group having from 1 to 6 carbon atoms or a combination thereof, more preferably a single bond or an ester bond.

In formula (III-d), $R_{15b}$ is preferably an alkylene group having from 1 to 4 carbon atoms. $R_{16b}$ is preferably an alkyl group having from 1 to 8 carbon atoms, such as methyl group which may have a substituent, ethyl group which may have a substituent, propyl group which may have a substituent, isopropyl group which may have a substituent, butyl group which may have a substituent, neopentyl group which may have a substituent and octyl group which may have a substituent, a cyclohexyl group, an adamantyl group, a norbornyl group, a boronyl group, an isoboronyl group, a menthyl group, a morphoryl group, a 4-oxocyclohexyl group, a phenyl group which may have a substituent, a toluyl group which may have a substituent, a mesityl group which may have a substituent, a naphthyl group which may have a substituent or a camphor residue which may have a substituent. The substituent of these groups is preferably a halogen atom such as fluorine atom, or an alkoxy group having from 1 to 4 carbon atoms.

In the present invention, among the repeating units represented by formulae (III-a) to (III-d), those represented by formulae (III-b) and (III-d) are preferred.

Preferred embodiments of the resin for use in the present invention are described below.

1) A resin containing a repeating unit represented by formula (I) and a repeating unit having a group represented by formula (II) and being capable of decomposing under the action of an acid to increase the solubility in alkali. The resin preferably further contains a repeating unit represented by formula (III-a), (III-b), (III-c) or (III-d).

2) A resin containing a repeating unit having an alkali-soluble group protected by at least one group containing an alicyclic hydrocarbon structure represented by any one of formulae (pI) to (pVI) and a repeating unit represented by formula (I) and being capable of decomposing under the action of an acid to increase the solubility in alkali. The resin preferably further contains a repeating unit having a group represented by the following formula (II'):

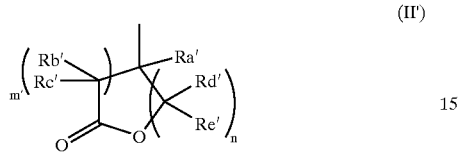

(II')

wherein Ra' to Re' each represents a hydrogen atom or an alkyl group having from 1 to 4 carbon atoms, preferably a hydrogen atom or a methyl group, m' and n' each independently represents an integer of from 0 to 3, provided that when m'+n' is from 2 to 6, m' is preferably 0 or 1, and n' is preferably an integer of from 1 to 3.

The resin more preferably further contains a repeating unit represented by formula (III-a), (III-b), (III-c) or (III-d).

This resin may be used, in addition to the above-described usage, as a copolymer with a monomer repeating unit of various types for the purpose of controlling the dry etching resistance, the suitability for standard developer, the adhesion to the substrate, the resist profile and the general factors required for the resist, such as resolution, heat resistance and sensitivity.

Examples of such a repeating unit include the repeating units corresponding to the following monomers, however, the present invention is by no means limited thereto.

By virtue of this repeating unit, the capabilities required for the resin, particularly (1) solubility in the coating solvent, (2) film-forming property (glass transition point), (3) alkali developability, (4) film loss (selection of hydrophilic/hydrophobic or alkali-soluble group), (5) adhesion to a substrate in the unexposed area and (6) dry etching resistance, can be subtly controlled.

Examples of such copolymerization monomers include compounds having one addition-polymerizable unsaturated bond selected from acrylic acid esters, methacrylic acid esters, acrylamides, methacrylamides, allyl compounds, vinyl ethers and vinyl esters.

Specific examples thereof include acrylic acid esters such as alkyl (the alkyl group preferably having from 1 to 10 carbon atoms) acrylates (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate);

methacrylic acid esters such as alkyl (the alkyl group preferably having from 1 to 10 carbon atoms) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate);

acrylamides such as acrylamide, N-alkylacrylamides (where the alkyl group has from 1 to 10 carbon atoms, such as methyl group, ethyl group, propyl group, butyl group, t-butyl group, heptyl group, octyl group, cyclohexyl group and hydroxyethyl group), N,N-dialkylacrylamides (where the alkyl group has from 1 to 10 carbon atoms, such as methyl group, ethyl group, butyl group, isobutyl group, ethylhexyl group and cyclohexyl group), N-hydroxyethyl-N-methylacrylamide and N-2-acetamidoethyl-N-acetylacrylamide;

methacrylamides such as methacrylamide, N-alkylmethacrylamides (where the alkyl group has from 1 to 10 carbon atoms, such as methyl group, ethyl group, t-butyl group, ethylhexyl group, hydroxyethyl group and cyclohexyl group), N,N-dialkylmethacrylamides (where the alkyl group is an ethyl group, a propyl group or a butyl group) and N-hydroxyethyl-N-methylmethacrylamide;

allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate and vinyl chlorohexylcarboxylate;

dialkyl itaconates (e.g., dimethyl itaconate, diethyl itaconate, dibutyl itaconate); dialkyl esters of fumaric acid (e.g., dibutyl fumarate) and monoalkyl esters of fumaric acid; and acrylic acid, methacrylic acid, crotonic acid, itaconic acid, maleic acid anhydride, maleimide, acrylonitrile, methacrylonitrile and maleylonitrile. Other than these, addition-polymerizable unsaturated compounds capable of copolymerizing with the above-described various repeating units may be used.

In the above-described resin, the content in molar ratio of each repeating unit may be appropriately selected so as to control the acid value, the dry etching resistance of the resist, the suitability for the standard developer, the adhesion to a substrate, the defocus latitude depended on line pitch of the resist profile, and general properties required for the resist, such as resolution, heat resistance and sensitivity.

The content of each repeating unit in the resin used in the present invention is described below by taking the above-described preferred embodiments as examples.

Embodiment 1

The content of the repeating unit represented by formula (I) in the resin is from 20 to 75 mol %, preferably from 25 to 70 mol %, more preferably from 30 to 65 mol %, based on all repeating units.

The content of the repeating unit represented by formula (II) in the resin is from 30 to 70 mol %, preferably from 35 to 65 mol %, more preferably from 40 to 60 mol %, based on all repeating units.

The content of the repeating unit represented by any one of formulae (IIIa) to (III-d) in the resin is usually from 0.1 to 30 mol %, preferably from 0.5 to 25 mol %, more preferably from 1 to 20 mol %, based on all repeating units.

Embodiment 2

The content of the repeating unit represented by formula (I) in the resin of the present invention is from 0.1 to 25 mol %, preferably from 0.5 to 22 mol %, more preferably from 1 to 20 mol %, based on all repeating units.

The content of the repeating unit having an alkali-soluble group protected by a structure represented by any one of formulae (pI) to (pVI) is from 10 to 70 mol %, preferably from 15 to 65 mol %, more preferably from 20 to 60 mol %, based on all repeating units.

The content of the repeating unit represented by formula (II) in the resin is usually from 20 to 70 mol %, preferably from 25 to 65 mol %, more preferably from 30 to 60 mol %, based on all repeating units.

The content of the repeating unit represented by any one of formulae (III-a) to (III-d) in the resin is from 0.1 to 30 mol %, preferably from 0.5 to 25 mol %, more preferably from 1 to 20 mol %, based on all repeating units.

The content in the resin, of the repeating unit based on the monomer as another copolymer component may also be appropriately selected according to the desired resist performance, however, in general, it is preferably 99 mol % or less, more preferably 90 mol % or less, still more preferably 80 mol % or less, based on the total molar number of the acid-decomposable group-containing repeating unit and the repeating unit represented by formula (I).

The above-described resin preferably has a weight-average molecular weight Mw on a polystyrene basis by gel permeation chromatography, of from 1,000 to 1,000,000, more preferably from 1,500 to 500,000, still more preferably from 2,000 to 200,000, particularly preferably from 2,500 to 100,000. As the weight-average molecular weight is larger, the heat resistance increases but, the developability decreases. Therefore, the Mw is controlled to a preferred range by taking account of the balance therebetween.

The resin for use in the present invention can be synthesized according to an ordinary method, for example, by a radical polymerization method.

In the positive photoresist composition for far ultraviolet exposure of the present invention, the amount of the acid-decomposable resin added in the entire composition is preferably from 40 to 99.99 wt %, more preferably from 50 to 99.97 wt %, based on all solid contents in the resist.

The fluorine-containing and/or silicon-containing surfactant, which is used or may be used in the positive photoresist composition for far ultraviolet exposure of the present invention, is at least one surfactant selected from a fluorine-containing surfactant, a silicon-containing surfactant and a surfactant containing both fluorine atom and silicon atom.

When the positive photoresist composition for far ultraviolet exposure of the present invention contains the acid-decomposable resin and the surfactant, the resist pattern obtained using an exposure light source of 250 nm or less, preferably 220 nm or less, can have excellent properties in the sensitivity, resolution, adhesion to a substrate and dry etching resistance, and at the same time, can be reduced in the development failure and scumming.

Examples of the surfactant include surfactants described in JP-A-62-36663, JP-A-61-226746, JP-A-61-226745, JP-A-62-170950, JP-A-63-34540, JP-A-7-230165, JP-A-8-62834, JF-A-9-54432 and JP-A-9-5988. Also, the commercially available surfactants described below each may be used as it is.

Examples of the commercially available surfactants which can be used include fluorine-containing surfactants and silicon-containing surfactants, such as EFtop EF301 and EF303 (produced by Shin-Akita Kasei K. K.), Florad FC430 and 431 (produced by Sumitomo 3M Inc.), Megafac F171, F173, F176, F189 and R08 (produced by Dainippon Ink & Chemicals, Inc.), Surflon S-382, SC 101, 102, 103, 104, 105 and 106 (produced by Asahi Glass Co., Ltd.), and polysiloxane polymer KP-341 (produced by Shin-Etsu Chemical Co., Ltd.). may be used as a silicon-containing surfactant.

The amount of the surfactant blended is usually from 0.001 to 2 wt %, preferably from 0.01 to 1 wt %, based on the solid content in the composition of the present invention.

These surfactants may be used either individually or in combination of two or more thereof.

Specific examples of surfactants other than those described above include nonionic surfactants including polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of this surfactant blended is usually 2 parts by weight or less, preferably 1 part by weight or less, per 100 parts by weight of the solid content in the composition of the present invention.

These surfactants may be used either individually or in combination.

Compounds Represented by Formula (CI) or (CII):

The positive photosensitive composition of the present invention may contain a compound represented by the foregoing formula (CI) or (CII) as a fundamental constituent component, in addition to the above-described resin and photo-acid generator.

In formula (CI), $X_c$ represents oxygen atom, sulfur atom, —N($R_{53}$)— or a single bond.

Examples of the alkyl group represented by $R_{51}$, $R_{52}$ or $R_{53}$ in formula (CI) include an alkyl group having from 1 to 8 carbon atoms, such as methyl group, ethyl group, n-propyl group, isopropyl group, n-butyl group, isobutyl group, sec-butyl group, tert-butyl group, hexyl group, 2-ethylhexyl group and octyl group.

In formula (CI), —C(=O)—O—$R_c$' is a group capable of decomposing under the action of an acid (also called acid-decomposable group).

In the above-described formula, examples of $R_c$' include a tertiary alkyl group such as t-butyl group, methoxy t-butyl group and t-amyl group, an isoboronyl group, a 1-alkoxyethyl group which may have a substituent, such as 1-ethoxyethyl group, 1-butoxyethyl group, 1-isobutoxyethyl group, 1-cyclohexyloxyethyl group and 1-[2-(n-butoxy)-ethoxy]ethyl, an alkoxymethyl group such as 1-methoxymethyl group and 1-ethoxymethyl group, a trialkylsilyl group such as tetrahydropyranyl group, tetrahydrofuranyl group, trimethylsilyl group, t-butyldimethylsilyl group and diisopropylmethylsilyl group, and a 3-oxocyclohexyl group.

$R_c$ is a n1-valent residue containing a bridge-containing hydrocarbon group or a naphthalene ring. Examples of the n1-valent residue containing a bridge-containing hydrocarbon group include adamantane, norbornane, tricyclodecane, tetracycloundecane, pinene, terpene and steroid each having bonds in the number of n1.

Examples of the n1-valent residue containing a naphthalene ring include a naphthalene ring having bonds in the number of n1.

The bridge-containing hydrocarbon group or naphthalene ring may have a substituent in the site other than the bonds. Preferred examples of the substituent include a halogen atom, a cyano group, an alkyl group having from 1 to 4 carbon atoms, an alkoxy group having from 1 to 4 carbon atoms, an acyl group having from 1 to 4 carbon atoms, an acyloxy group having from 1 to 4 carbon atoms, and an alkoxycarbonyl group having from 2 to 5 carbon atoms.

q1 is an integer of from 0 to 10, preferably from 0 to 7, more preferably from 0 to 5.

Examples of the alkyl group represented by $R_{60}$ in formula (CII) include an alkyl group having from 1 to 8 carbon atoms, such as methyl group, ethyl group, n-propyl group, isopropyl group, n-butyl group, isobutyl group, sec-butyl group, t-butyl group, hexyl group, 2-ethylhexyl group and octyl group.

In formula (II), —O—$R_{61}$ is a group capable of decomposing under the action of an acid (acid-decomposable group).

Examples of $R_{61}$ include a tertiary alkyl group such as t-butyl group, methoxy t-butyl group and t-amyl group, a 1-alkoxyethyl group which may have a substituent, such as 1-ethoxyethyl group, 1-butoxyethyl group, 1-isobutoxyethyl group, 1-cyclohexyloxyethyl group and 1-[2-(n-butoxy)-ethoxy]ethyl, an alkoxymethyl group such as 1-methoxymethyl group and 1-ethoxymethyl group, a tertiary alkoxycarbonyl group such as t-butoxycarbonyl group and t-amyloxycarbonyl group, a trialkylsilyl group such as tetrahydropyranyl group, tetrahydrofuranyl group, trimethylsilyl group, t-butyldimethylsilyl group and diisopropylmethylsilyl group, and a 3-oxocyclohexyl group.

The compound represented by formula (CI) or (CII) of the present invention may be synthesized by reacting the corresponding carboxylic acid or carboxylic acid derivative such as acid chloride, or the corresponding naphthol derivative with $R_c'$—OH, $R_c'$—$X_c$ (halogen) or the corresponding olefin, or by reacting a naphthol derivative with a dialkoxycarbonyl ether.

In the positive photosensitive composition of the present invention, the dissolution inhibitors comprising the compound represented by formula (CI) or (CII) may be used individually or in combination of two or more thereof.

In the positive photosensitive composition of the present invention, the content of the compound represented by formula (CI) or (CII) is usually from 1 to 40 wt %, preferably from 3 to 30 wt %, based on the all solid contents.

Specific examples of the compound represented by formula (CI) are set froth below as Compounds [CI-1] to [CI-108] and specific examples of the compound represented by formula (CII) are set forth below as Compounds [CII-1] to [CII-52], however, the compound which can be used in the present invention is by no means limited thereto.

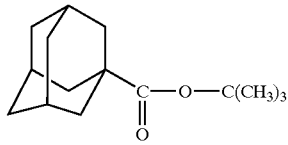

[CI-1]

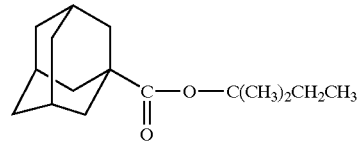

[CI-2]

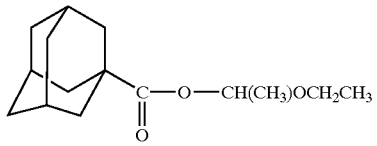

[CI-3]

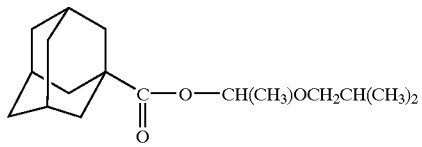

[CI-4]

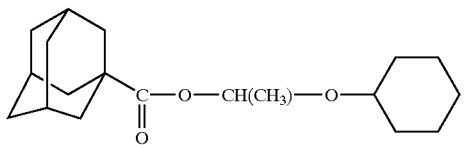

[CI-5]

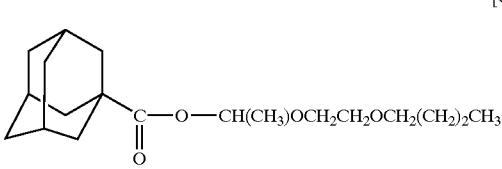

[CI-6]

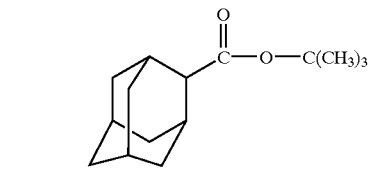

[CI-7]

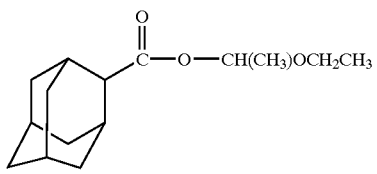

[CI-8]

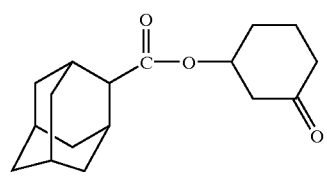

[CI-9]

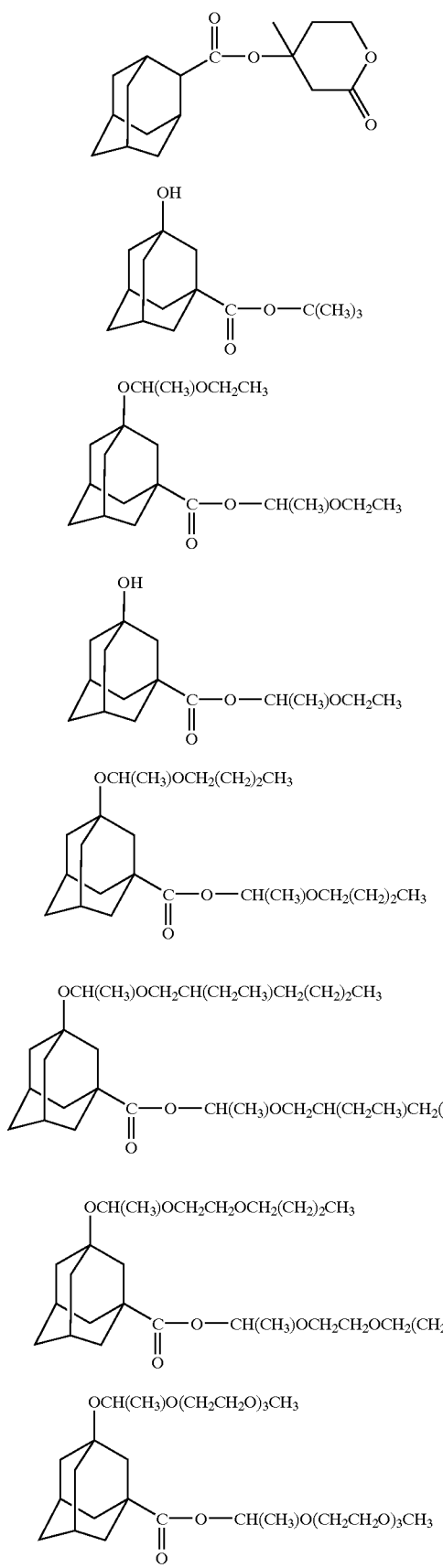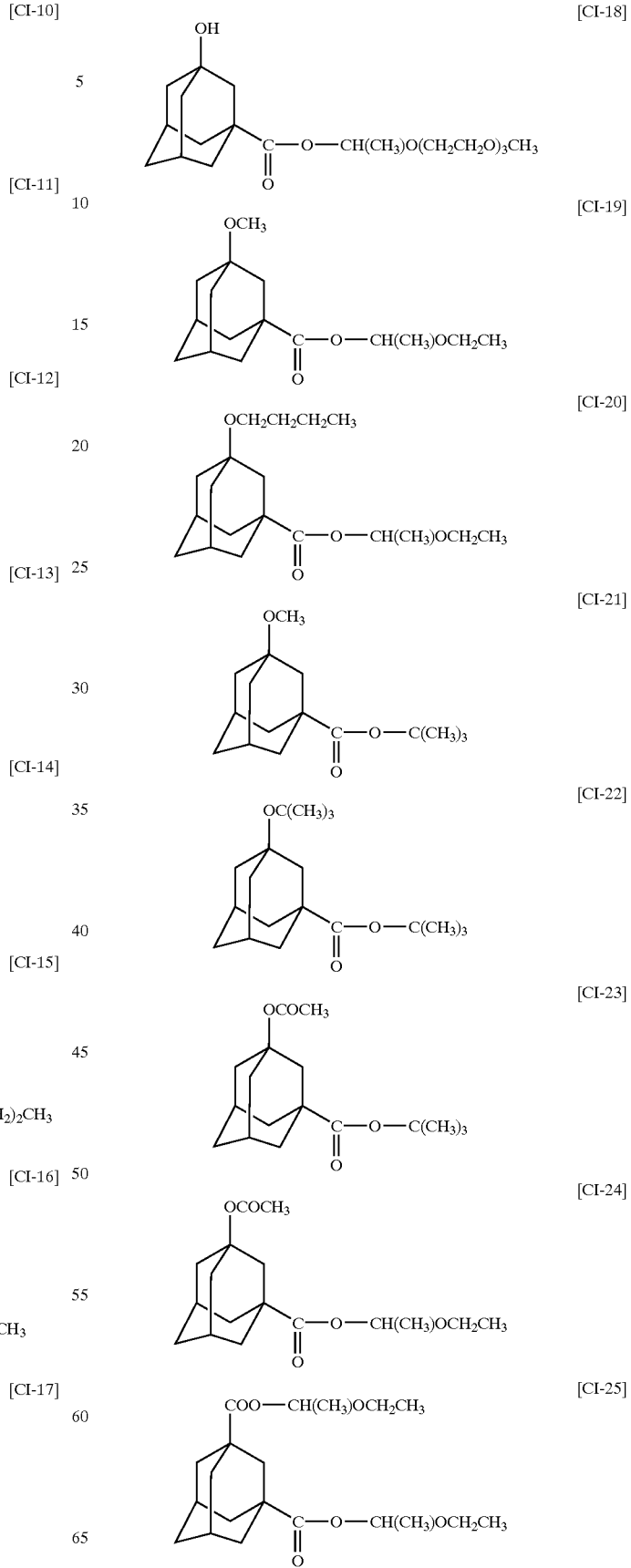

[CI-26] 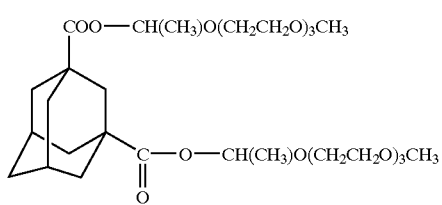
[CI-27] 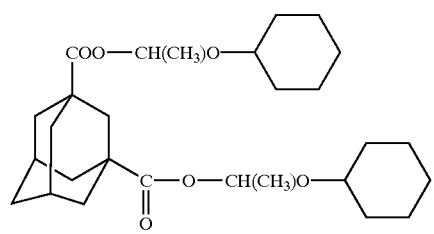
[CI-28] 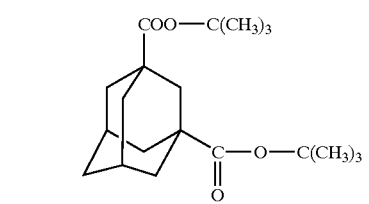
[CI-29] 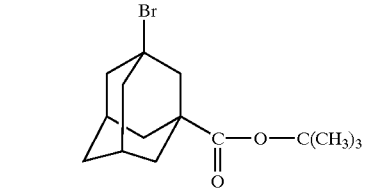
[CI-30] 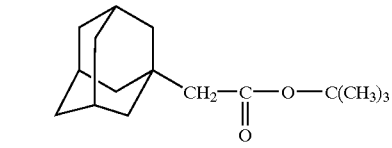
[CI-31] 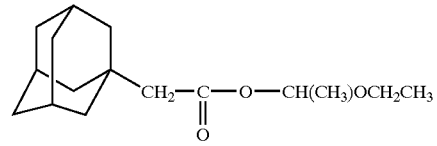
[CI-32] 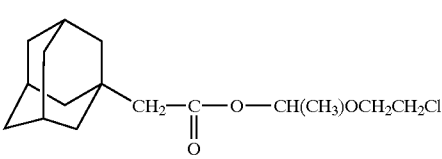
[CI-33] 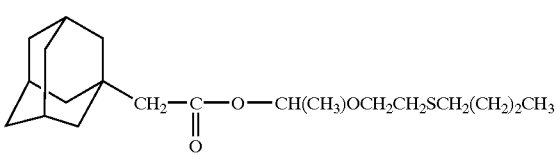
[CI-34] 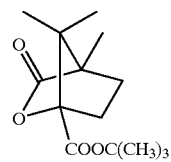
[CI-35] 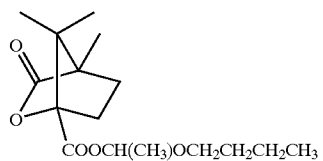
[CI-36] 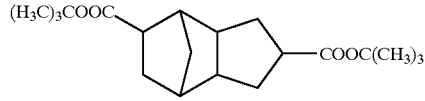
[CI-37] 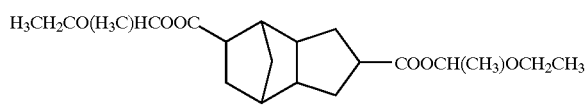
[CI-38] 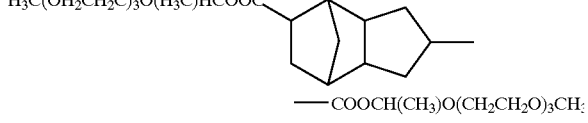
[CI-39] 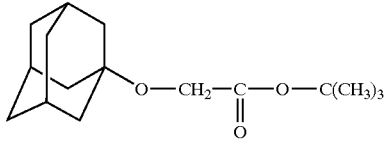
[CI-40] 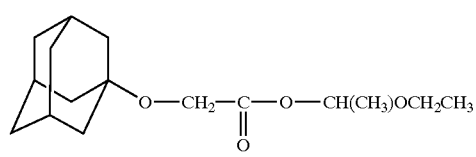
[CI-41] 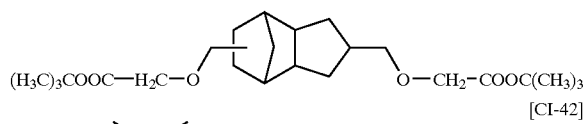
[CI-42] 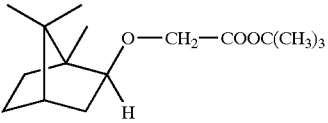
[CI-43] 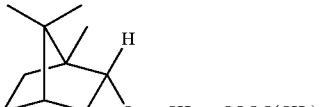
[CI-44] 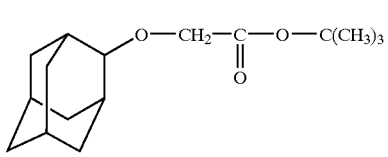

-continued
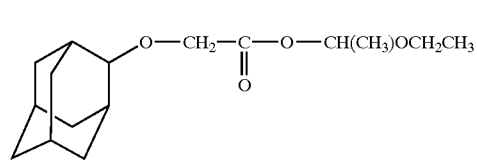
[CI-45]
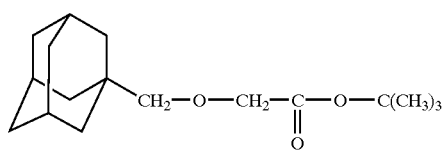
[CI-46]
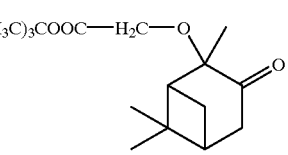
[CI-47]
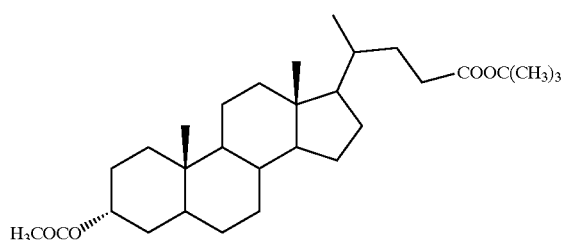
[CI-48]
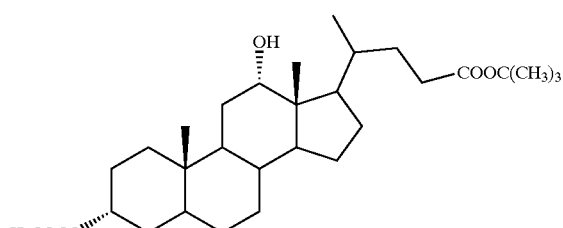
[CI-49]
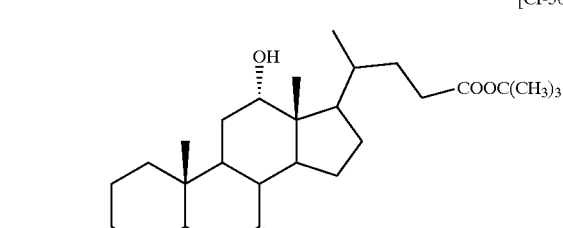
[CI-50]
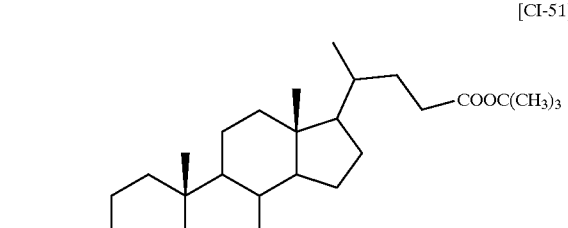
[CI-51]
-continued
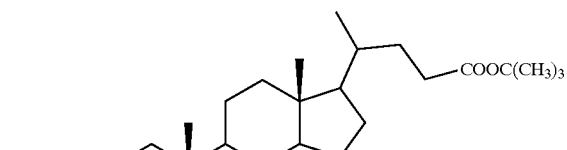
[CI-52]
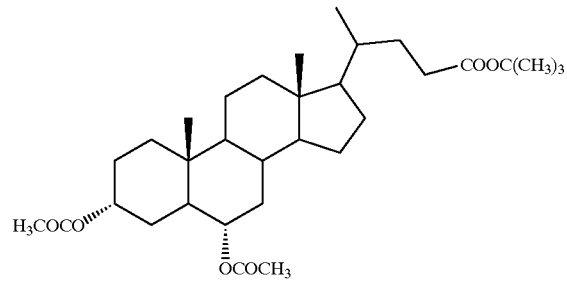
[CI-53]
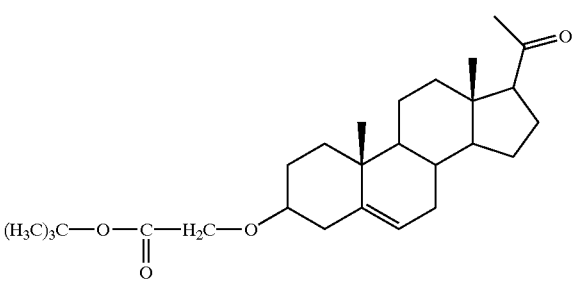
[CI-54]
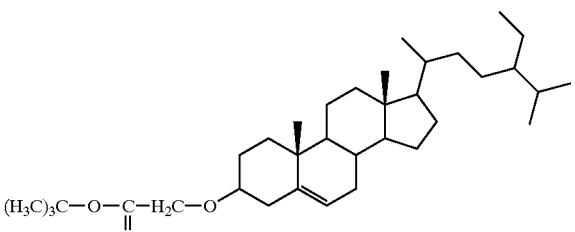
[CI-55]
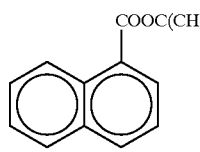
[CI-56]
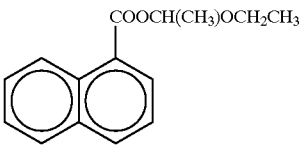
[CI-57]
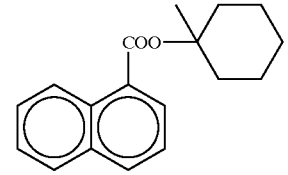
[CI-58]

[CI-59] [CI-60] [CI-61] [CI-62] [CI-63] [CI-64] [CI-65] [CI-66] [CI-67] [CI-68] [CI-69] [CI-70] [CI-71] [CI-72] [CI-73] [CI-74] [CI-75] [CI-76] [CI-77] [CI-78] [CI-79]

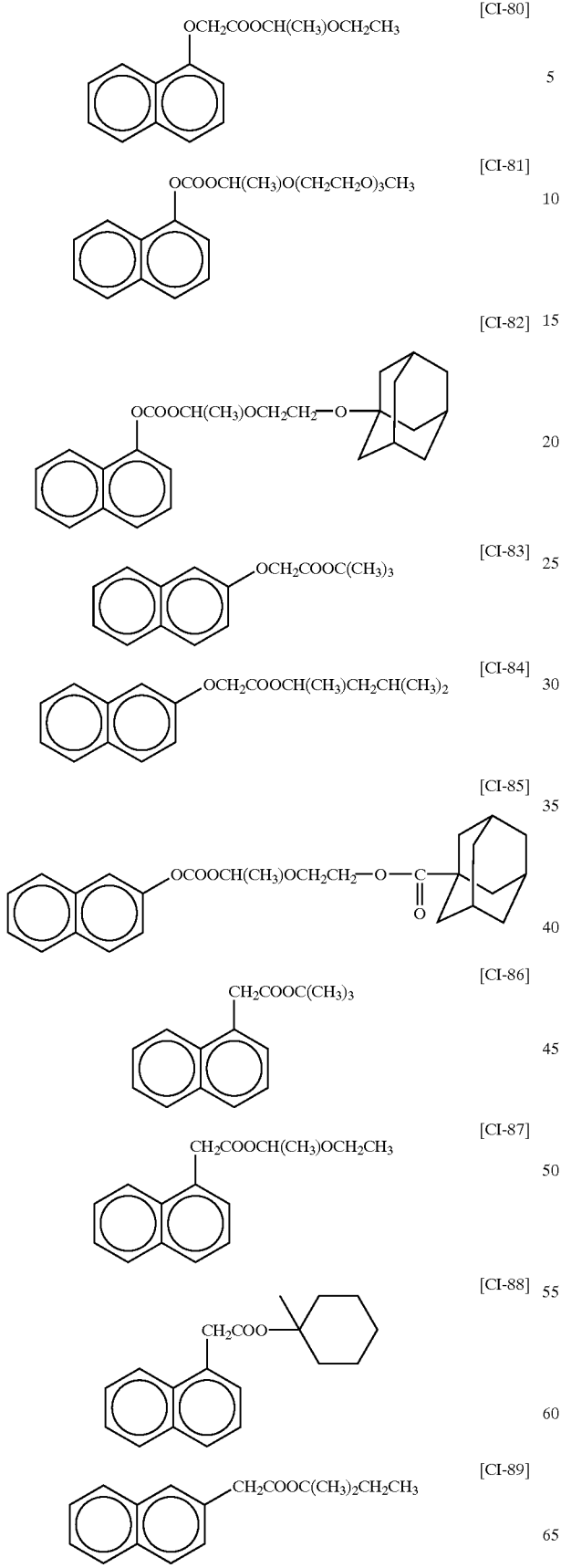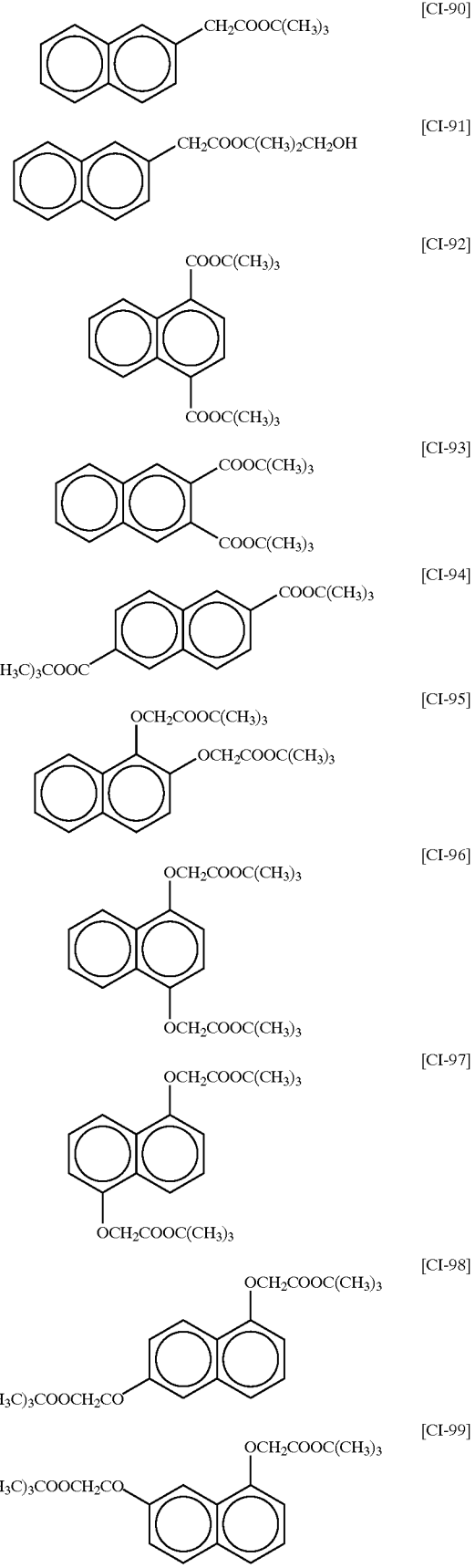

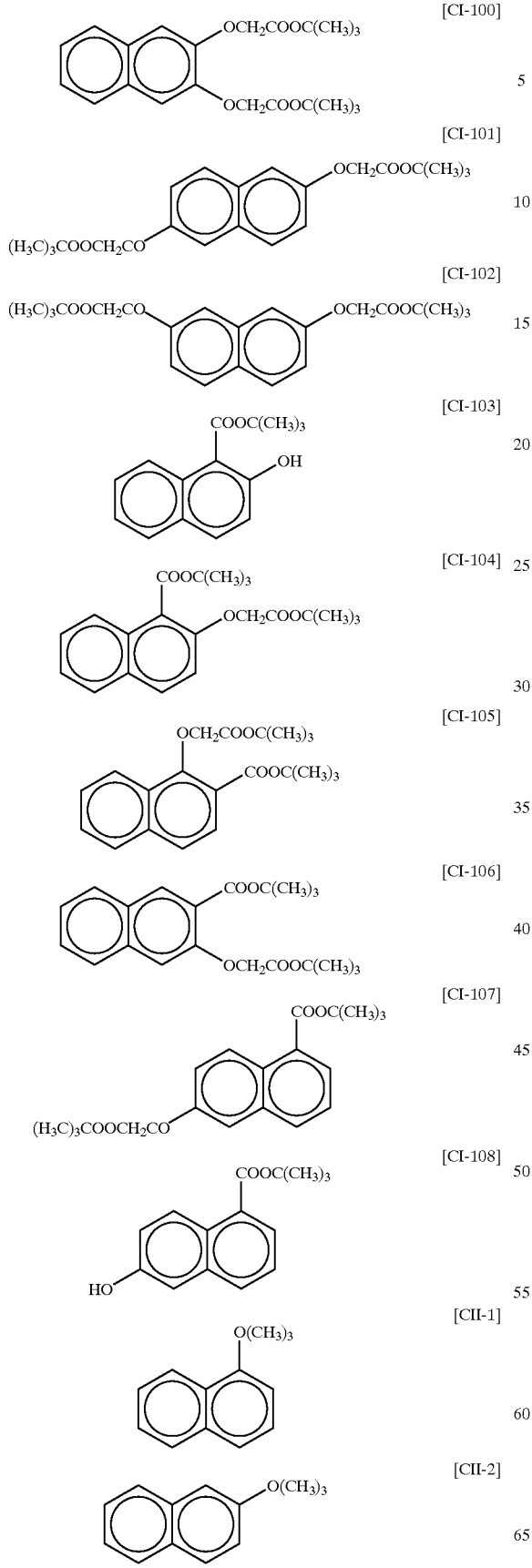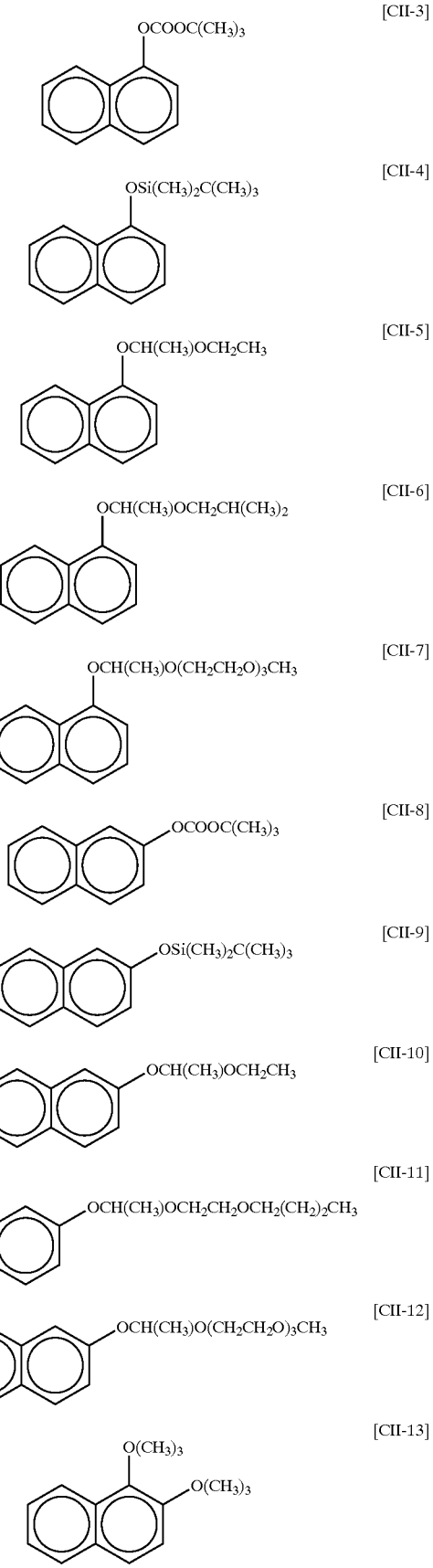

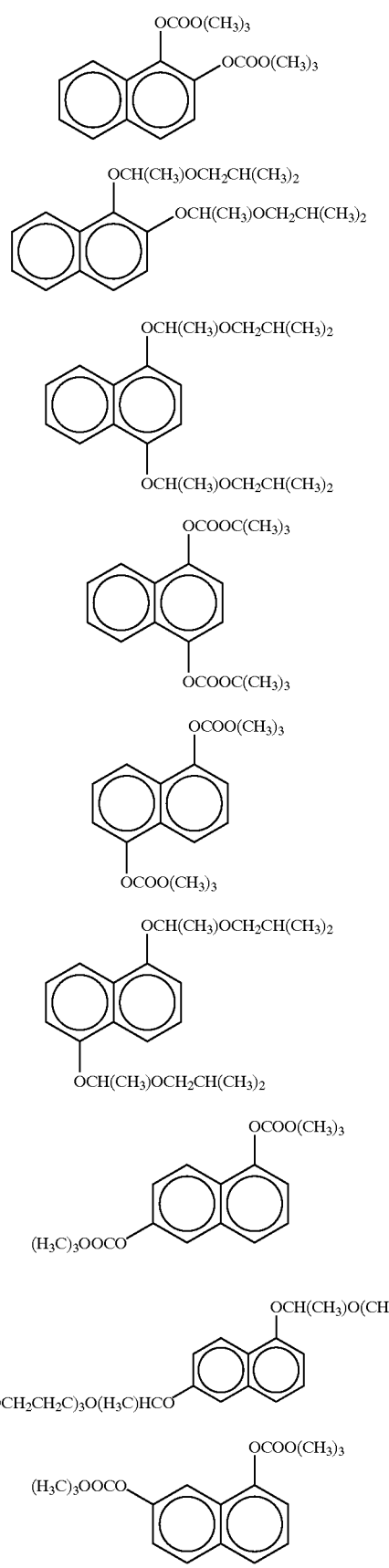
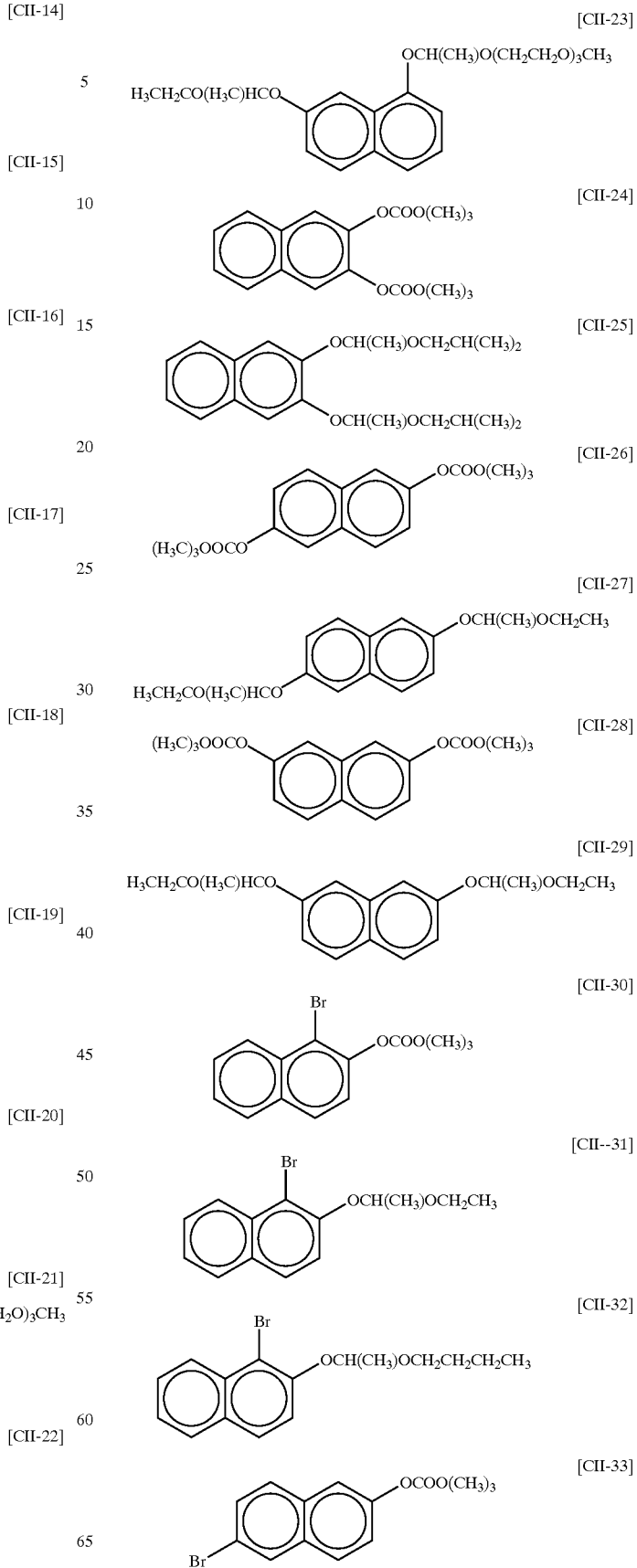

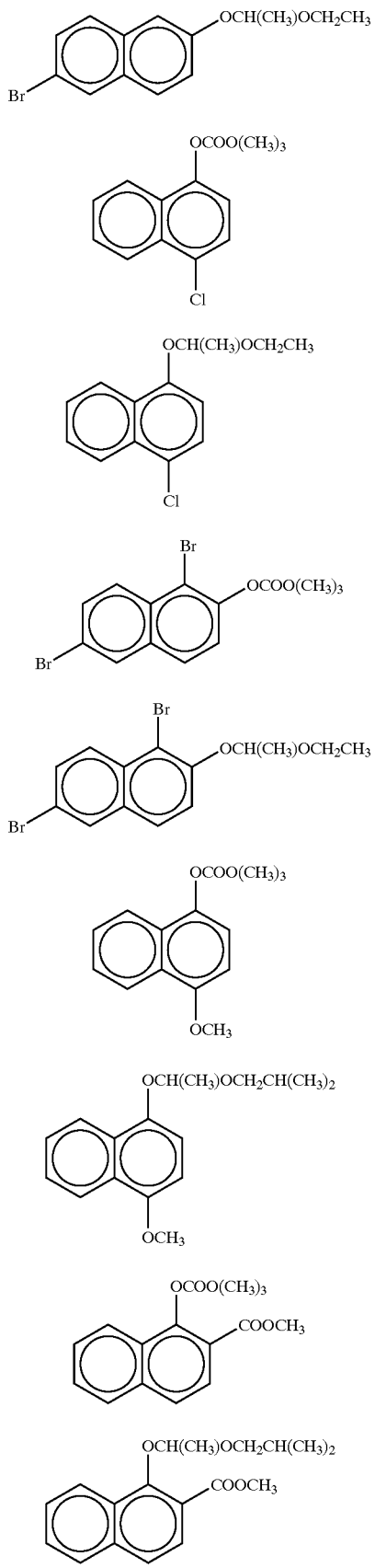
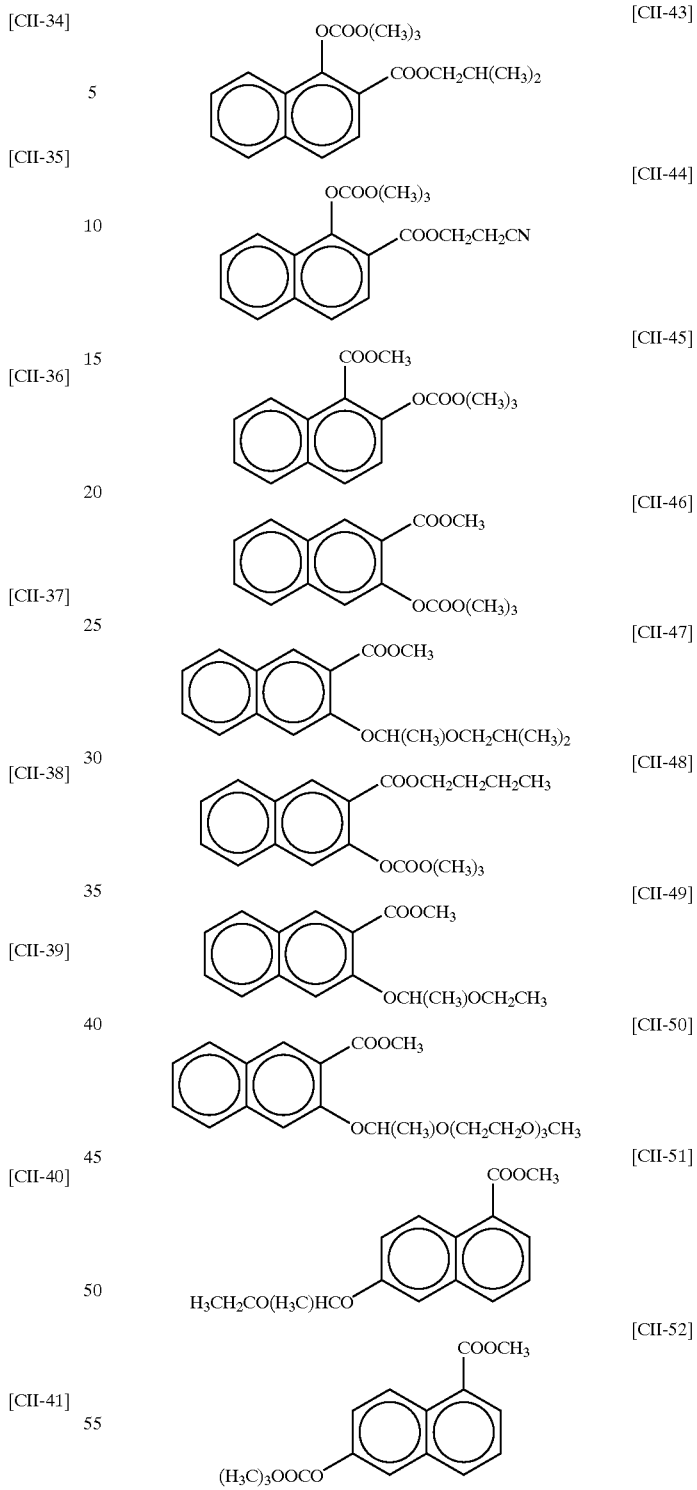

The compound capable of decomposing under the action of an acid to generate a sulfonic acid (hereinafter referred to as a "sulfonic acid-generating compound") is described below.

In the present invention, the sulfonic acid-generating compound is stable in the absence of an acid but by the action of an acid generated from the photo-acid generator upon exposure, decomposes to produce a sulfonic acid. The acid produced from the sulfonic acid-generating compound preferably has a large acid strength, more specifically, the dissociation constant (pKa) of the acid is preferably 3 or less, more preferably 2 or less.

The acid generated from the sulfonic acid-generating compound is preferably a sulfonic acid having an alkyl group, a cyclic alkyl group, an aryl group or an aralkyl group. The sulfonic acid-generating compound is preferably a compound represented by any one of the following formulae (1) to (5):

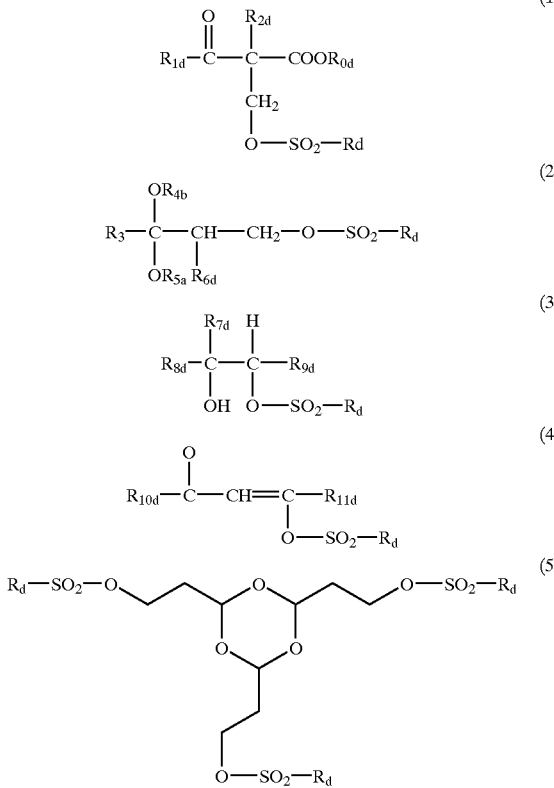

wherein
  $R_d$ represents an alkyl group, a cyclic alkyl group, an aryl group or an aralkyl group,
  $R_{0d}$ represents a group constituting as —$COOR_0$ the group capable of decomposing under the action of an acid,
  $R_{1d}$ represents an alkyl group, a cyclic alkyl group, an aryl group, an aralkyl group, an alkoxy group or an aryloxy group,
  $R_{2d}$ represents an alkyl group or an aralkyl group,
  $R_{3d}$ represents an alkyl group, a cyclic alkyl group, an aryl group or an aralkyl group,
  $R_{4d}$ and $R_{5d}$ each independently represents an alkyl group and $R_{4d}$ and $R_{5d}$ may be combined with each other to form a ring,
  $R_{6d}$ represents a hydrogen atom or an alkyl group,
  $R_{7d}$ represents a hydrogen atom, an alkyl group, a cyclic alkyl group, an aryl group or an aralkyl group,
  $R_{8d}$ represents an alkyl group, a cyclic alkyl group, an aryl group or an aralkyl group,
  $R_{9d}$ represents a hydrogen atom, an alkyl group, a cyclic alkyl group, an aryl group or an aralkyl group, provided that $R_{9d}$ and $R_{7d}$ may be combined with each other to form a ring,
  $R_{10d}$ represents an alkyl group, a cyclic alkyl group, an alkoxy group, an aryl group, an aralkyl group, an aryloxy group or an alkenyloxy group, and
  $R_{11d}$ represents an alkyl group, a cyclic alkyl group, an alkoxy group, an aryl group, an aralkyl group, an aryloxy group or an alkenyl group, provided that $R_{10d}$ and $R_{11d}$ may be combined with each other to form a ring.

In formulae (1) to (5), the alkyl group includes an alkyl group having from 1 to 8 carbon atoms and specific examples thereof include a methyl group, an ethyl group, a propyl group, an isopropyl group, a butyl group and an octyl group.

Examples of the cyclic alkyl group includes a cyclic alkyl group having from 4 to 10 carbon atoms and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

Examples of the aryl group includes an aryl group having from 6 to 14 carbon atoms and specific examples thereof include a phenyl group, a naphthyl group and a tolyl group.

Examples of the aralkyl group includes an aralkyl group having from 7 to 20 carbon atoms and specific examples thereof include a benzyl group, a phenethyl group and a naphthylethyl group.

Examples of the alkoxy group include an alkoxy group having from 1 to 8 carbon atoms and specific examples thereof include a methoxy group, an ethoxy group, a propoxy group and a butoxy group.

Examples of the alkenyl group includes an alkenyl group having from 2 to 6 carbon atoms and specific examples thereof include a vinyl group, a propenyl group, an allyl group, a butenyl group, a pentenyl group, a hexenyl group and a cyclohexenyl group.

Examples of the aryloxy group includes an aryloxy group having from 6 to 14 carbon atoms and specific examples thereof include a phenoxy group and a naphthoxy group.

Examples of the alkenyloxy group includes an alkenylxoy group having from 2 to 8 carbon atoms and specific examples thereof include a vinyloxy group and an allyloxy group.

These substituents each may further have a substituent and examples of the substituent include a halogen atom such as Cl, Br and F, a —CN group, a —OH group, an alkyl group having from 1 to 4 carbon atoms, a cycloalkyl group having from 3 to 8 carbon atoms, an alkoxy group having from 1 to 4 carbon atoms, an acylamino group such as acetylamino group, an aralkyl group such as benzyl group and phenethyl group, an aryloxyalkyl group such as phenoxyethyl group, an alkoxycarbonyl group having from 2 to 5 carbon atoms, and an acyloxy group having from 2 to 5 carbon atoms. However, the scope of the substituent is not limited thereto.

Examples of the ring formed by the combining of $R_{4d}$ and $R_{5d}$ with each other include a 1,3-dioxolane ring and a 1,3-dioxane ring.

Examples of the ring formed by the combining of $R_{7d}$ and $R_{9d}$ with each other include a cyclopentyl ring and a cylohexyl ring.

Examples of the ring formed by the combining of $R_{10d}$ and $R_{11d}$ with each other include a 3-oxocyclohexenyl ring and a 3-oxoindenyl ring, which rings each may contain oxygen atom in the ring.

Examples of the acid-decomposable group include those where Rod is a tertiary alkyl group such as t-butyl group and t-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group or a 3-oxocyclohexyl group.

Preferred embodiments of $R_d$, $R_{0d}$ and $R_{1d}$ to $R_{11d}$ are described below.

$R_d$: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group and a camphor group, $R_{0d}$: a t-butyl group, a methoxymethyl group, an ethoxymethyl group, a 1-ethoxyethyl group and a tetrahydropyranyl group, $R_{1d}$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group and a naphthoxy group, $R_{2d}$: a methyl group, an ethyl group, a propyl group, a butyl group and a benzyl group, $R_{3d}$: a methyl group, an ethyl group, a propyl group, a cyclopropyl group, a cyclopentyl group, a cyclohexyl group, a phenyl group, a naphthyl group, a benzyl group, a phenethyl group and a naphthylmethyl group, $R_{4d}$, $R_{5d}$: a methyl group, an ethyl group and a propyl group, and when combined with each other, an ethylene group and a propylene group, $R_{6d}$: a hydrogen atom, a methyl group and an ethyl group, $R_{7d, R9d}$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group and a phenethyl group, and when combined with each other, a cyclopentyl ring and a cyclohexyl ring, $R_{8d}$: a methyl group, an ethyl group, an isopropyl group, a t-butyl group, a neopentyl group, a cyclohexyl group, a phenyl group and a benzyl group, $R_{10d}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group and a methylvinyloxy group, and when combined with $R_{11d}$, a 3-oxocyclohexenyl ring and a 3-oxoindenyl ring, which rings each may contain oxygen atom, and $R_{11d}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group and an allyl group, and when combined with $R_{10d}$, a 3-oxocyclohexenyl ring and a 3-oxoindenyl ring, which rings each may contain oxygen atom.

Specific examples of the compounds represented by formulae (1) to (5) are set forth below, however, the present invention is by no means limited thereto.

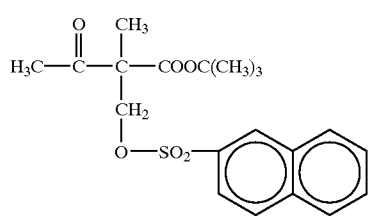

(1-1)

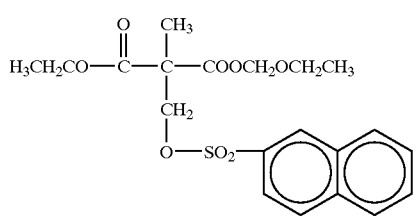

(1-2)

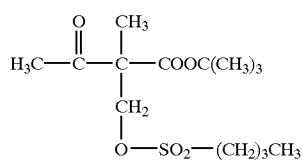

(1-3)

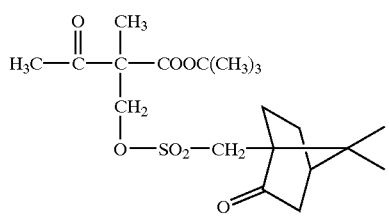

(1-4)

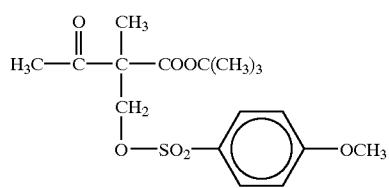

(1-5)

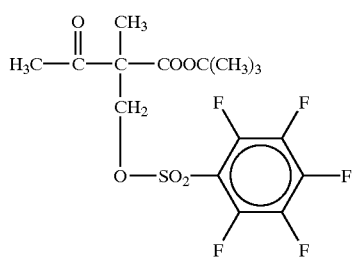

(1-6)

-continued
(2-1)
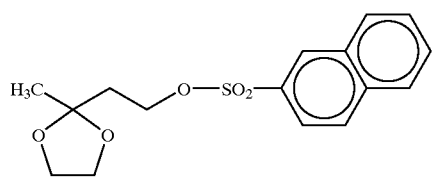
(2-2)
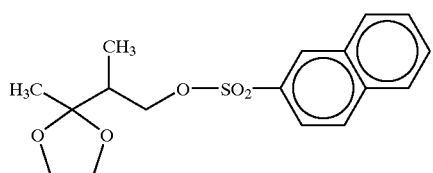
(2-3)
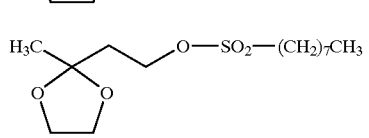
(2-4)
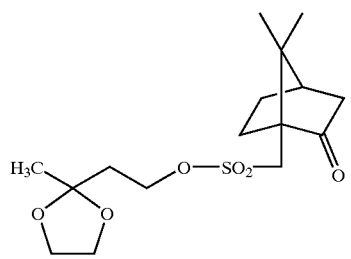
(2-5)
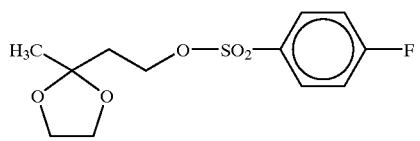
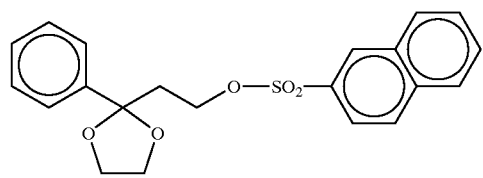
(3-1)
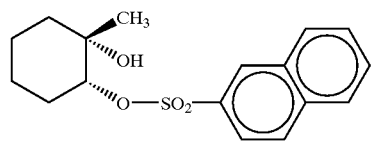
(3-2)
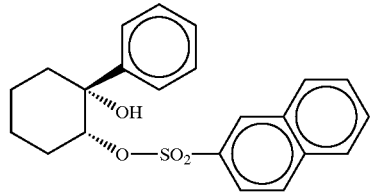
(3-3)
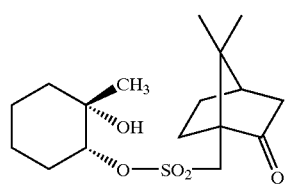
(3-4)
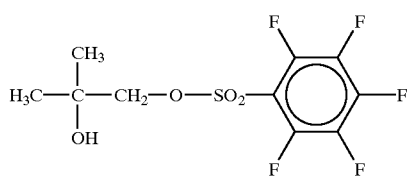
(3-5)
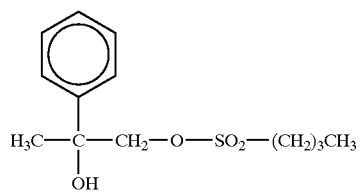
(3-6)
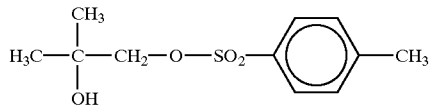
(4-1)
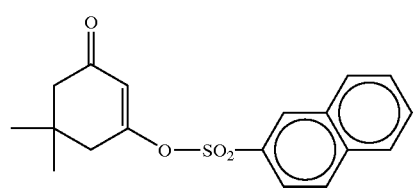
(4-2)
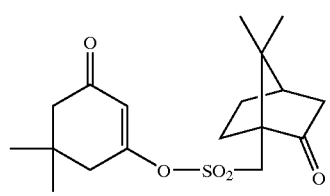
(4-3)
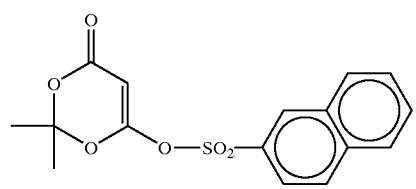
(4-4)
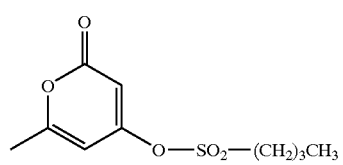

-continued
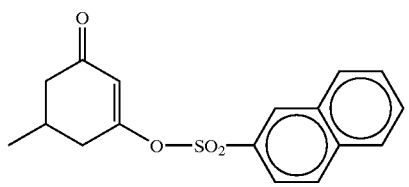 (4-5)
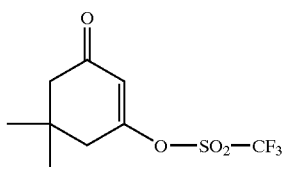 (4-6)
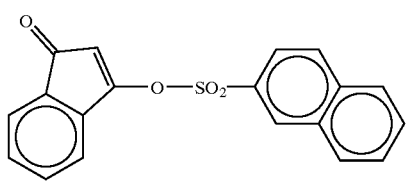 (4-7)
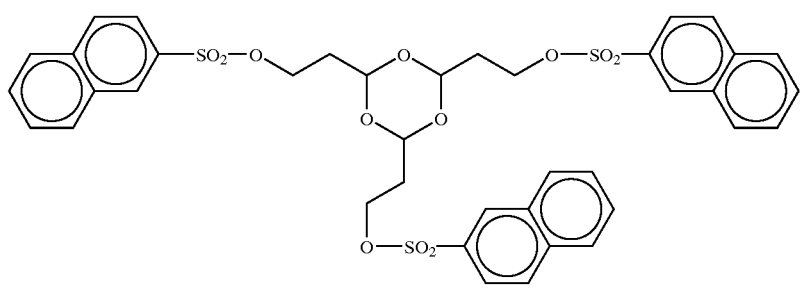 (5-1)
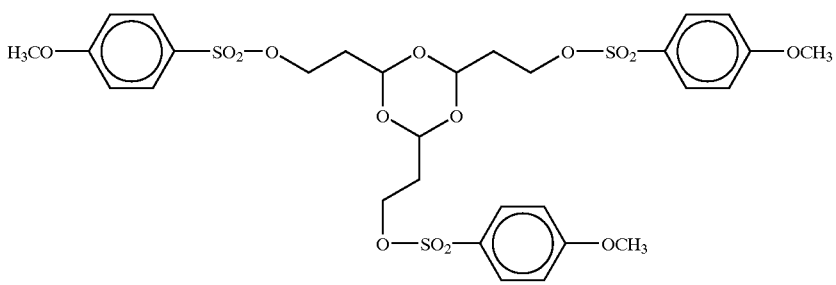 (5-2)
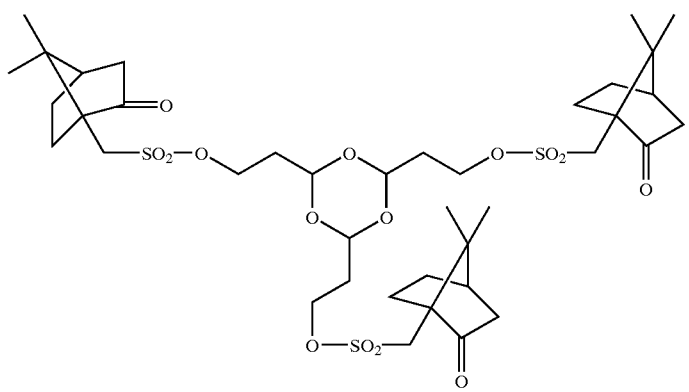 (5-3)
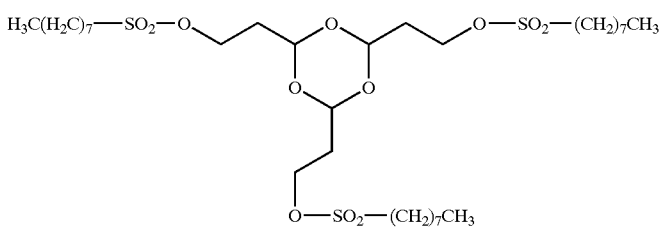 (5-4)

In the present invention, the sulfonic acid-generating compound is preferably a compound represented by formula (4).

In the present invention, the amount of the sulfonic acid-generating compound added in the composition is preferably from 0.01 to 10 wt %, more preferably from 0.05 to 5 wt %, based on all solid contents of the composition.

The organic basic compound which can be used in the present invention is preferably a compound having stronger basicity than that of phenol. In particular, a nitrogen-containing basic compound is preferred. Examples of the nitrogen-containing basic compound include those having the following structure:

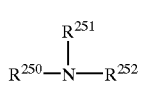
(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring.

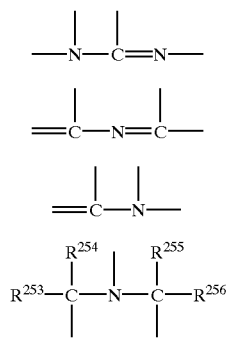

(wherein $R^{253}$, $R^{254}$, $R^{255}$ and $R^{256}$, which may be the same or different, each represents an alkyl group having from 1 to 6 carbon atoms).

The compound is more preferably a nitrogen-containing basic compound having two or more nitrogen atoms different in the chemical environment within one molecule, still more preferably a compound having both a substituted or unsubstituted amino group and a ring structure containing nitrogen atom, or a compound having an alkylamino group. Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Specific examples of preferred compounds include guanidine, 1,1-dimethylguanidine, 1,1,3,3-tetramethylguanidine, 2-aminopyridine, 3-aminopyridine, 4-amino-pyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethyl-pyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]non-5-ene, 1,8-diazabicyclo[5,4,0]undec-7-ene, 2,4,5-triphenylimidazole, N-methylmorpholine, N-ethylmorpholine, N-hydroxyethylmorpholine, N-benzylmorpholine, tertiary morpholine derivatives such as cyclohexyl-morpholinoethylthiourea (CHMETU), and hindered amines described in JP-A-11-52575 (for example, those described in [0005]), however, the present invention is by no means limited thereto.

Specific examples of more preferred compounds include 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-pyperidyl) sebacate. By using such a compound, excellent defocus latitude depended on line pitch can be obtained.

Among these compounds, 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, CHMETU and bis (1,2,2,6,6-pentamethyl-4-piperidyl) sebacate are preferred.

These nitrogen-containing basic compounds may be used either individually or in combination of two or more thereof. The amount of the nitrogen-containing basic compound used is usually from 0.001 to 10 wt %, preferably from 0.01 to 5 wt %, based on all solid contents of the resist composition. If the amount used is less than 0.001 wt %, the effect by the addition of the nitrogen-containing basic compound may not be obtained, whereas if it exceeds 10 wt %, the sensitivity is liable to decrease or the developability in the unexposed area is readily deteriorated.

The positive photoresist composition of the present invention may additionally contain, if desired, an acid-decomposable dissolution-inhibiting compound, a dye, a plasticizer, a sensitizer, a compound capable of accelerating solubility in the developer, and the like.

The photosensitive composition of the present invention is coated on a support after dissolving the above-described components in a solvent. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethylene carbonate, propylene carbonate, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents may be used individually or in combination.

Among these solvents, preferred are 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, propylene carbonate, butyl acetate, methyl lactate, ethyl lactate, methyl methoxypropionate, ethyl ethoxypropionate, N-methylpyrrolidone and tetrahydrofuran.

The solvent (S1) for use in the sixth aspect of the present invention is described below.

The solvent (S1) for use in the present invention contains (a) ethyl lactate and (b) ethyl 3-ethoxypropionate. The ethyl lactate (a) as a main solvent is used in the solvent (S1) in an amount of from 60 to 90 wt %, preferably from 60 to 85 wt %, more preferably from 65 to 80 wt %.

The ethyl 3-ethoxypropionate (b) as a solvent used in combination with the ethyl acetate (a) is used in the solvent in an amount of from 10 to 40 wt %, preferably from 10 to 30 wt %, more preferably from 10 to 25 wt %.

The sum total of the ethyl lactate (a) and the ethyl 3-ethoxypropionate (b) preferably accounts for 70 wt % or more in the solvent (S1). If it is less than 70 wt %, the objects of the present invention may not be fully achieved.

In the present invention, a solvent (c) having a boiling point (b.p.) of 180° C. or more, preferably 185° C. or more and a solubility parameter (SP) of 12 or more, preferably 12.4 or more is preferably contained in the solvent (S1) as a solvent other than (a) and (b) in an amount of from 1 to 20 wt %, preferably from 3 to 15 wt %.

By using the solvent (c) in combination, the development failure can be remarkably improved. However, if the solvent (c) is added in excess of 20 wt %, the adhesion to the substrate is disadvantageously deteriorated.

Specific examples of the solvent (c) include γ-butyrolactone (b.p. 190° C., SP: 12.6), propylene carbonate (b.p.: 242° C., SP: 13.3), ethylene carbonate (b.p. 239° C., SP: 14.7), N,N-dimethylimidazolinone (b.p.: 200° C., SP: 12.4) and dimethylsulfoxide (b.p.: 189° C., SP: 13.0). Among these, γ-butyrolactone, propylene carbonate and ethylene carbonate are preferred from the standpoint of bringing out the effects of the present invention.

These solvents (c) may be used individually or in combination of two or more thereof.

In addition to the above-described solvents (S1), another solvent may further be contained within the range of not impairing the effect of the present invention, preferably in an amount of 5 wt % or less.

Examples of the another solvent which can be used include cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, methyl β-methoxyisobutyrate, ethyl butyrate, propyl butyrate, methyl isobutyl ketone, ethyl acetate, isoamyl acetate, diacetone alcohol and N-methylpyrrolidone.

The photosensitive composition of the present invention is coated on a support after dissolving it in a solvent capable of dissolving the above-described components.

The solvent (S2) for use in the sixth aspect of the present invention is described below.

The first solvent (a) for use in the present invention is at least one solvent selected from ethyl lactate, propylene glycol monomethyl ether acetate, propylene glycol monomethyl ether propionate, methyl 3-methoxypropionate, ethyl 3-ethoxypropionate and 2-heptanone. Among these, ethyl lactate and propylene glycol monomethyl ether acetate are preferred.

The first solvent (a) is used in the solvent (S2) in an amount of from 60 to 90 wt %, preferably from 60 to 85 wt %, more preferably from 65 to 80 wt %.

The second solvent (b) for use in the present invention is a solvent having a viscosity at 20° C. of 1 cps or less, preferably 0.9 cps or less, and any can be used as long as it can satisfy this viscosity condition. Examples of this organic solvent include methyl acetate, ethyl acetate, propyl acetate, isopropyl acetate, butyl acetate, isobutyl acetate, methyl ethyl ketone, methyl amyl ketone and methyl isobutyl ketone. Among these, butyl acetate is preferred. These solvents may be used individually or in combination of two or more thereof.

The second solvent (b) for use in the present invention is used in the solvent (S2) in an amount of from 10 to 40 wt %, preferably from 10 to 30 wt %, more preferably from 10 to 25 wt %.

In the present invention, the sum total of the first solvent (a) and the second solvent (b) preferably accounts for 70 wt % or more in the solvent (S2). If it is less than 70 wt %, the objects of the present invention may not be fully achieved.

In the present invention, a solvent having a boiling point (b.p.) of 180° C. or more, preferably 185° C. or more and a solubility parameter (SP) of 12 or more, preferably 12.4 or more is preferably contained in the solvent (S2) as the third solvent (c) in an amount of from 1 to 20 wt %, preferably from 3 to 10 wt %.

By mixing the third solvent (c), the development failure can be remarkably improved. However, if the third solvent (c) is mixed in excess of 20 wt %, the adhesion to the substrate is disadvantageously deteriorated. Specific examples of the third solvent (c) include γ-butyrolactone (b.p.: 190° C., SP: 12.6), propylene carbonate (b.p.: 242° C., SP: 13.3), ethylene carbonate (b.p.: 239° C., SP: 14.7), N,N-dimethylimidazolinone (b.p.: 200° C., SP: 12.4) and dimethylsulfoxide (b.p. 189° C., SP; 13.0). Among these, γ-butyrolactone, propylene carbonate and ethylene carbonate are preferred from the standpoint of bringing out the effects of the present invention.

In addition to the above-described solvents (S2), another solvent may further be contained within the range of not impairing the effect of the present invention, preferably in an amount of 5 wt % or less.

Examples of the another solvent which can be used include cyclohexanone, propylene glycol monomethyl ether, methyl β-methoxyisobutyrate, ethyl butyrate, propyl butyrate, diacetone alcohol and N-methylpyrrolidone.

The thus-prepared positive resist composition of the present invention is coated on a substrate to form a thin film. The coated film preferably has a thickness of from 0.2 to 1.2 μm. In the present invention, if desired, a commercially available inorganic or organic reflection inhibiting film may be used.

Examples of the reflection inhibiting film which can be used include an inorganic film form such as titanium, titanium dioxide, titanium nitride, chromium oxide, carbon and α-silicon, and an organic film form comprising a light absorbent and a polymer material. The former requires, for the film formation, equipment such as vacuum evaporation apparatus, CVD apparatus and sputtering apparatus. Examples of the organic reflection inhibiting film include a film comprising a condensation product of a diphenylamine derivative and a formaldehyde-modified melamine resin, an alkali-soluble resin and a light absorbent described in JP-B-7-69611, a reactant of a maleic acid anhydride copolymer and a diamine-type light absorbent described in U.S. Pat. No. 5,294,680, a film containing a resin binder and a methylol melamine-base heat cross-linking agent described in JP-A-6-118631, an acrylic resin-type reflection inhibiting film having a carboxylic acid group, an epoxy group and a light-absorbing group within the same molecule described in JP-A-6-118656, a film comprising methylolmelamine and a benzophenone-base light absorbent described in JP-A-8-87115, and a polyvinyl alcohol resin having added thereto a low molecular light absorbent described in JP-A-8-179509.

In addition, organic reflection inhibiting film such as DUV30 series and DUV-40 series produced by Brewer Science, and AC-2 and Ac-3 produced by Shipley may also be used.

The resist solution is coated on a substrate (for example, silicon/silicon dioxide coating, and if desired, after providing the above-described reflection inhibiting film on the substrate) used in the production of precision integrated circuit devices by an appropriate coating method such as spinner and coater, exposed through a predetermined mask, and then developed by baking, whereby a good resist pattern can be obtained. The exposure light used here is preferably light at a wavelength of from 150 to 250 nm. More specifically, a KrF excimer laser (248 nm), an ArF excimer laser (193 nm), an $F_2$ excimer laser (157 nm), an X ray, an electron beam and the like may be used.

The developer which can be used is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol-amine such as dimetylethanolamine and triethanolamine, a quaternary ammonium salt such as tetramethylammonium hydroxide and tetraethylammonium hydroxide, and a cyclic amine such as pyrrole and piperidine.

Furthermore, to this alkaline aqueous solution, an alcohol and a surfactant may be added each in an appropriate amount.

The present invention is described in greater detail below by referring to the Examples, however, the present invention should not be construed as being limited thereto.

Synthesis of Resin

SYNTHESIS EXAMPLE (1)

Synthesis of Resin 1

3-Hydroxyadamantyl methacrylate, mevalonic lactone methacrylate and methacrylic acid were charged in a ratio of 35/50/15 and dissolved in N,N-dimethylacetamide/ tetrahydrofuran (5/5) to prepare 100 ml of a solution having a solid concentration of 20%. To this solution, 3 mol % of V-65 produced by Wako Pure Chemical Industries, Ltd. was added and the resulting solution was added dropwise to 10 ml of N,N-dimethylacetamide heated at 60° C., over 3 hours in a nitrogen atmosphere. After the completion of dropwise addition, the reaction solution was heated for 3 hours and again, 1 mol % of V-65 was added, followed by stirring for 3 hours. After the completion of reaction, the reaction solution was cooled to room temperature and crystallized in 3 liter of distilled water and the white powder precipitated was recovered.

The polymer compositional ratio determined by $C^{13}$ NMR was 35/49/16. The weight-average molecular weight determined by GPC was 7,800 in terms of standard polystyrene.

Resins 2 to 16 each having the compositional ratio and molecular weight shown in the table below were synthesized by the same operation as in the synthesis example above. In the table, the repeating units 1, 2 and 3 show the order from the left in the structural formula.

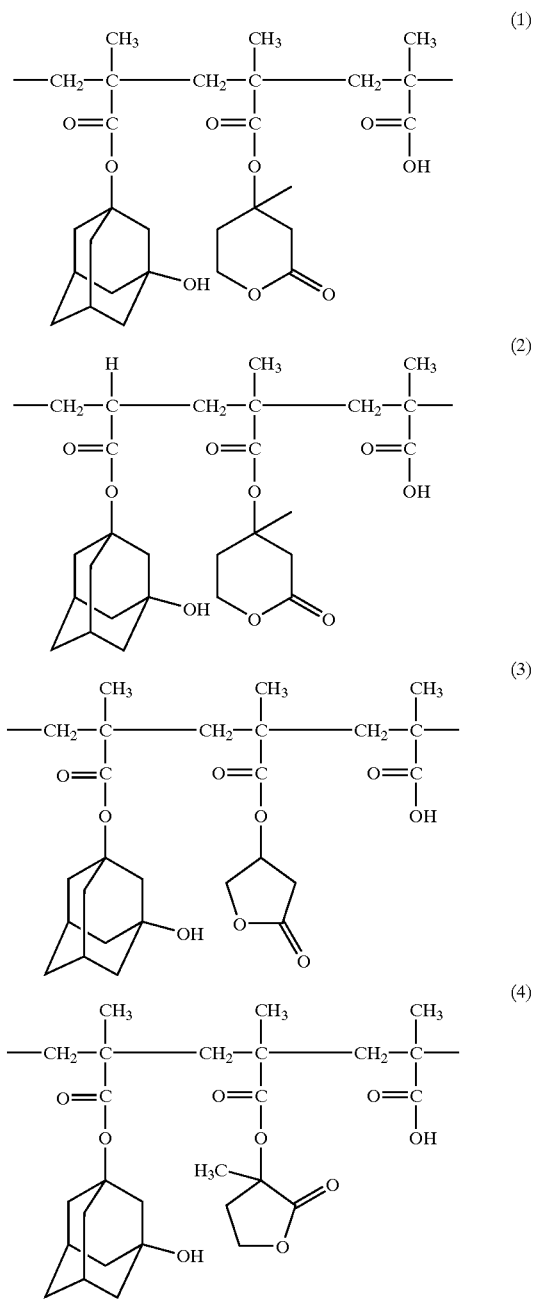

101
-continued
(5)
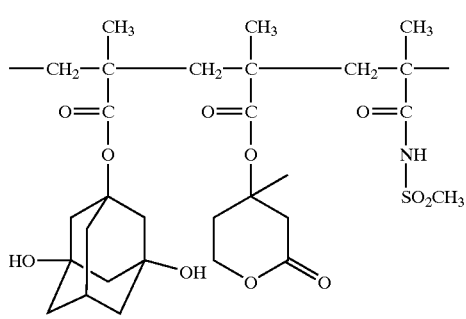
(6)
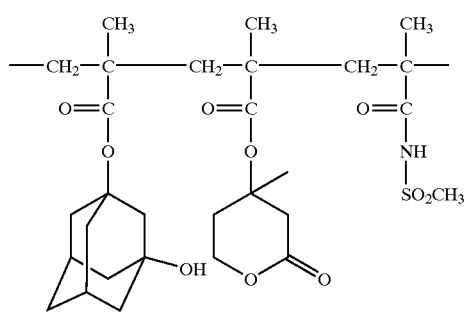
(7)
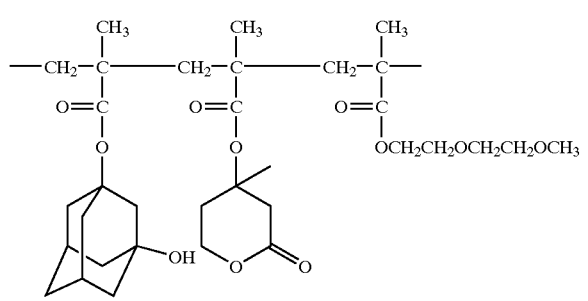
(8)
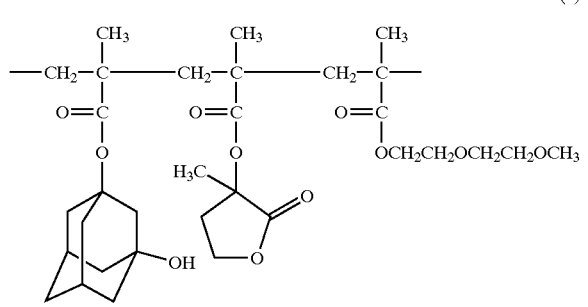
(9)
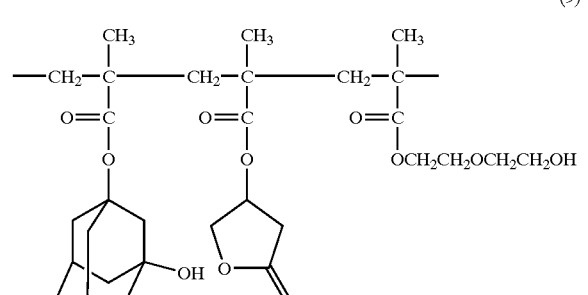
102
-continued
(10)
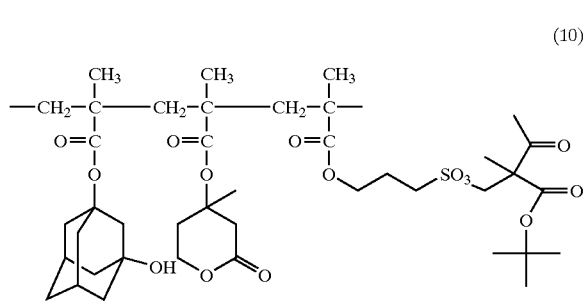
(11)
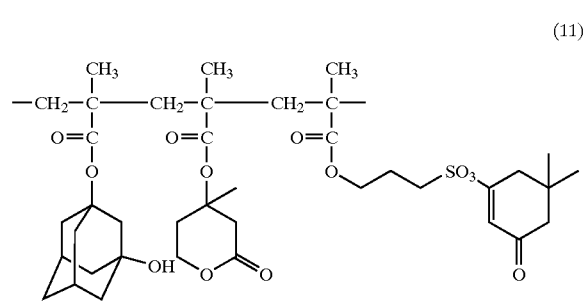
(12)
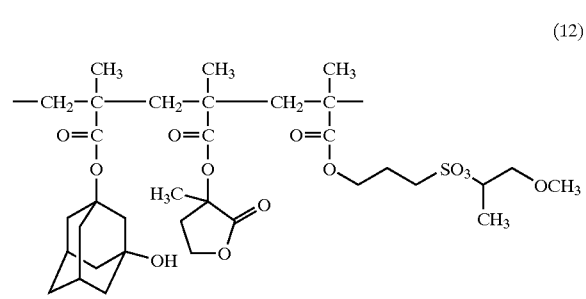
(13)
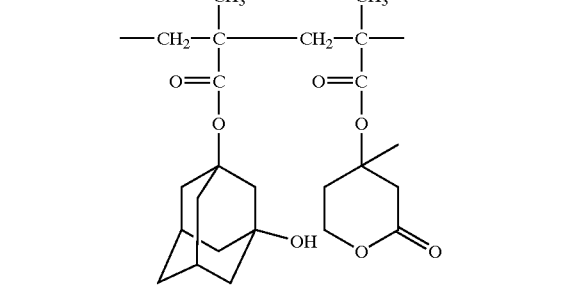
(14)
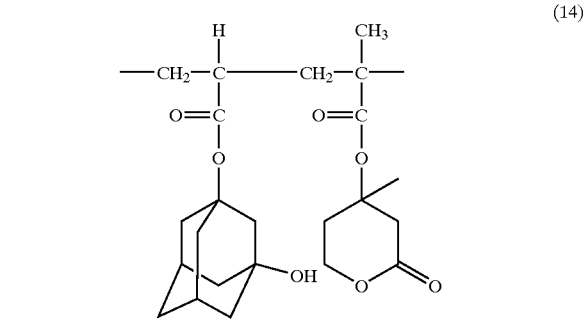

-continued

(15)
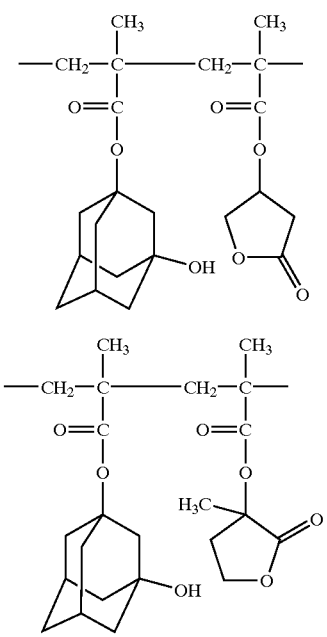

(16)

TABLE 1

| Resin | Repeating Unit 1 (mol %) | Repeating Unit 2 (mol %) | Repeating Unit 3 (mol %) | Molecular Weight |
|---|---|---|---|---|
| 2 | 32 | 42 | 16 | 6700 |
| 3 | 40 | 49 | 11 | 7300 |
| 4 | 31 | 57 | 12 | 7200 |
| 5 | 39 | 51 | 10 | 7600 |
| 6 | 40 | 52 | 8 | 7800 |
| 7 | 39 | 58 | 3 | 6900 |
| 8 | 39 | 59 | 2 | 7800 |
| 9 | 37 | 60 | 3 | 7700 |
| 10 | 42 | 54 | 4 | 6900 |
| 11 | 41 | 55 | 4 | 6600 |
| 12 | 41 | 56 | 3 | 7100 |
| 13 | 42 | 58 | | 8200 |
| 14 | 40 | 60 | | 7900 |
| 15 | 41 | 59 | | 8400 |
| 16 | 43 | 57 | | 8500 |

Synthesis of Resin

SYNTHESIS EXAMPLE (2)

Synthesis of Resin 17

2-Ethyl-2-adamantyl methacrylate, butyrolactone methacrylate and 3-hydroxyadamantyl methacrylate were charged in a ratio of 42/48/10 and dissolved in N,N-dimethylacetamide/tetrahydrofuran (5/5) to prepare 100 ml of a solution having a solid concentration of 20%. To this solution, 2 mol % of V-65 produced by Wako Pure Chemical Industries, Ltd. was added and the resulting solution was added dropwise to 10 ml of N,N-dimethylacetamide heated at 60° C., over 2 hours in a nitrogen atmosphere. After the completion of dropwise addition, the reaction solution was heated for 3 hours and again, 1 mol % of V-65 was added, followed by stirring for 3 hours. After the completion of reaction, the reaction solution was cooled to room temperature and crystallized in 3 liter of distilled water and the white powder precipitated was recovered.

The polymer compositional ratio determined by $C^{13}$ NMR was 36/54/10. The weight-average molecular weight determined by GPC was 9,600 in terms of standard polystyrene.

Resins 18 to 26 each having the compositional ratio and molecular weight shown in the table below were synthesized by the same operation as in the synthesis example above. In the table, the repeating units 1, 2 and 3 show the order from the left in the structural formula.

(17)
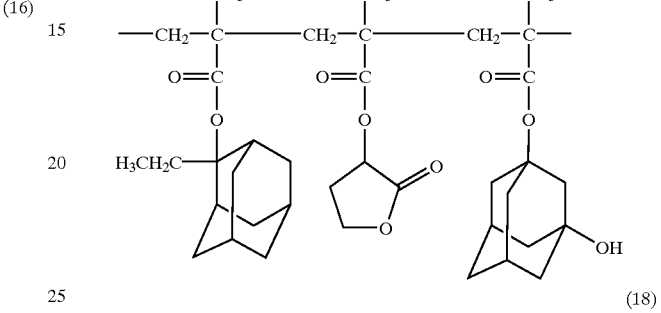

(18)
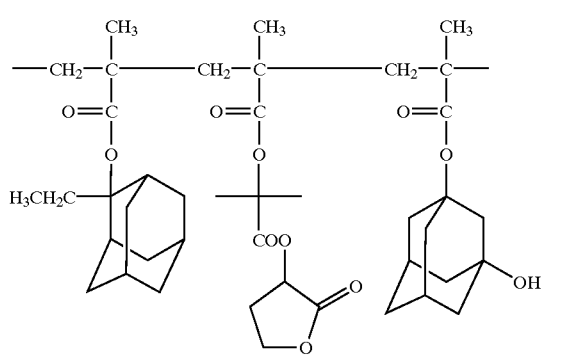

(19)
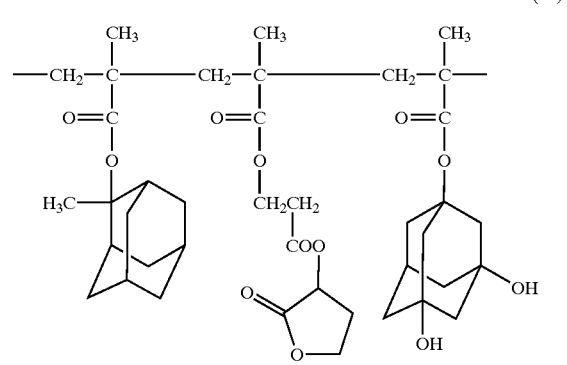

(20)
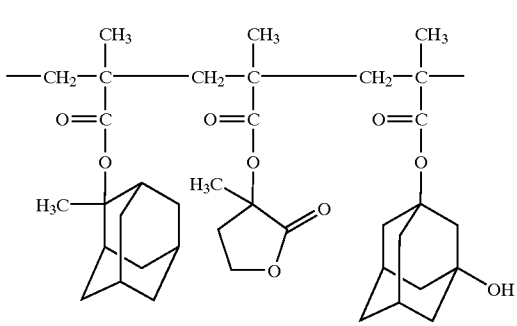

(21) 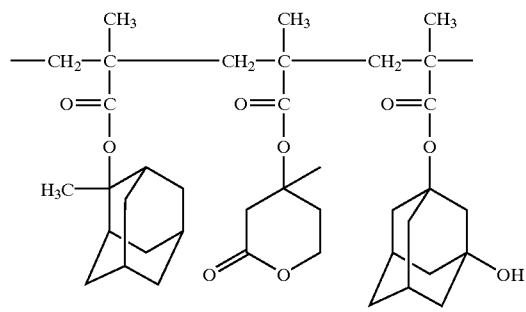

(22) 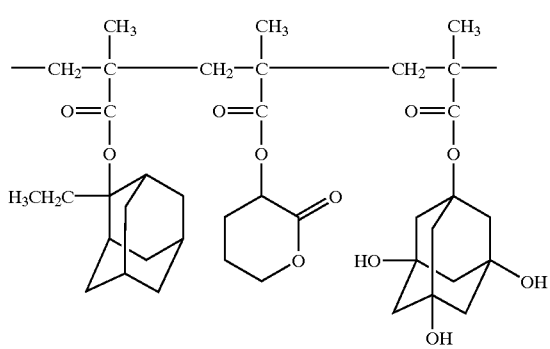

(23) 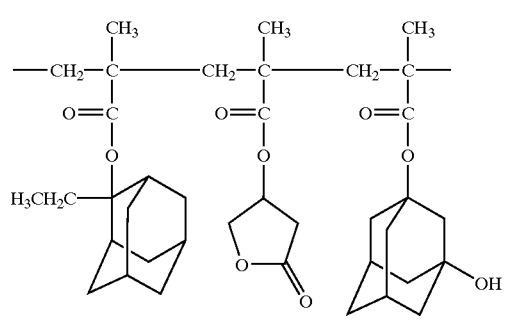

(24) 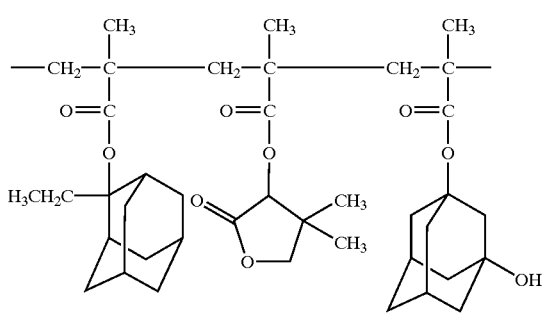

(25) 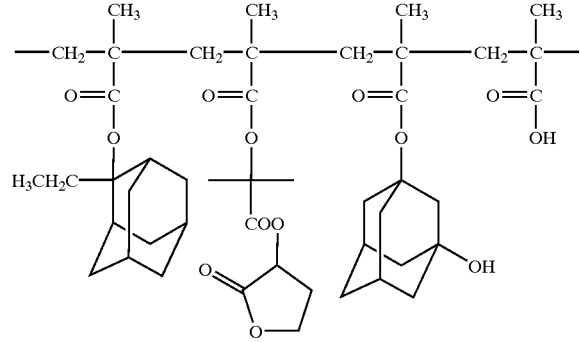

(26) 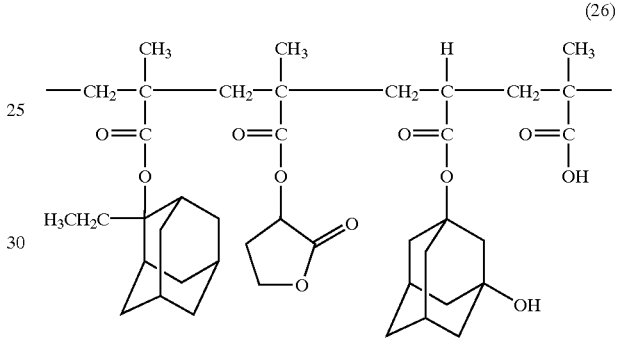

TABLE 2

| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 18 | 39 | 53 | 8 | | 9900 |
| 19 | 36 | 53 | 11 | | 9100 |
| 20 | 35 | 57 | 8 | | 9200 |
| 21 | 43 | 51 | 6 | | 8700 |
| 22 | 40 | 52 | 8 | | 8400 |
| 23 | 32 | 53 | 15 | | 8900 |
| 24 | 36 | 59 | 5 | | 9300 |
| 25 | 35 | 45 | 10 | 10 | 8300 |
| 26 | 32 | 48 | 9 | 11 | 8700 |

EXAMPLES 1a TO 26a AND COMPARATIVE EXAMPLES 1a AND 2a 1.4 g of a resin shown in Table 3, which was synthesized in Synthesis Examples above, 0.18 g of a photo-acid generator, a surfactant (added in an amount of 1 wt % based on all solid contents in the composition) and 10 mg of an organic basic compound were mixed as shown in Table 3 and is solved in propylene glycol monomethyl ether acetate each to a concentration of 14 wt % as solid content. The resulting solution was filtered through a 0.1 μm microfilter to prepare positive photoresist composition solutions of Examples 1a to 26a and Comparative Examples 1a and 2a.

In Table 3, PAG-1 denotes triphenylsulfonium triflate and PAG-2 denotes (PAG3–28) synthesized above. Resin R1 used in Comparative Example of Table 3 was the resin used in Example of JP-A-11-109632.

The surfactants used are:

W-1: Megafac F176 (produced by Dainippon Ink & Chemicals, Inc.) (fluorine-containing surfactant)

W-2: Megafac R08 (produced by Dainippon Ink & Chemicals, Inc.) (fluorine and silicone-containing surfactant)

W-3: polysiloxane polymer KP-341 (produced by Shin-Etsu Chemical Co., Ltd.)

W-4: polyoxyethylene nonyl phenyl ether Amines:
1 denotes 1,5-diazabicyclo[4.3.0]-5-nonene (DBN),
2 denotes bis(1,2,2,6,6-pentamethyl-4-piperidyl) sebacate,
3 denotes tri-n-butylamine.

(Evaluation Tests)

The obtained positive photoresist composition solutions each was coated on a silicon wafer using a spin coater and dried at 140° C. for 90 seconds to form a positive photoresist film having a thickness of about 0.5 µm. The resist film formed was exposed by an ArF excimer laser (193 nm), heat-treated at 120° C. for 90 seconds, developed with an aqueous 2.38% tetramethylammonium hydroxide solution and rinsed with distilled water to obtain a resist pattern profile.

Number of Development Failures

Each resist film was coated on a 6-inch bare Si substrate to have a thickness of 0.5 µm and dried on a vacuum adsorption-type hot plate at 140° C. for 60 seconds. Thereafter, each film was exposed through a test mask of 0.35 µm contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to the measurement of the number of development failures using KLA-2112 Machine manufactured by KLA Tencor Co. and the primary data value obtained was used as the number of development failures.

Generation of Development Residue (Scumming)

The degree of development residue in the case of a resist pattern having a line width of 0.22 µm was used for the evaluation. When the residue was not observed, the rating was ○, and when a fairly large amount of residue was observed, the rating was X.

Defocus Latitude Depended on Line Pitch

In a line-and-space pattern having a line width of 0.22 µm (dense pattern) and in an isolated line pattern (sparse pattern), the overlap range of the focus depth was determined with a tolerance of 0.22 µm±10%. The larger range reveals better latitude depended on line pitch.

The elevation results are shown in Table 3.

As apparent from the results in Table 3, the samples of Comparative Examples have problems in the number of development failures and the generation of scumming. On the other hand, the positive photoresist compositions for far ultraviolet exposure of the present invention are excellent in the sensitivity, resolution, adhesion to a substrate and dry etching resistance and further exhibit a satisfactory level with respect to the prevention of generation of development failures and occurrence of summing, namely these are suitable for the lithography using a far ultraviolet ray as in the ArF excimer laser exposure. Furthermore, when the resist composition of the present invention contains a specific organic basic compound, excellent defocus latitude depended on line pitch can also be attained.

The positive photoresist, Compositions for far ultraviolet exposure of the present invention is suitably applied particularly to light in the far ultraviolet wavelength region of from 170 to 220 nm, favored with excellent properties in the sensitivity, resolution, dry etching resistance and adhesion to a substrate, prevented from the generation of development failures and scumming, capable of providing a good resist pattern profile, and also favored with excellent defocus latitude depended on line pitch.

EXAMPLES 1b TO 10b AND COMPARATIVE EXAMPLE 1b 1.4 g of a resin shown in Table 4, which was synthesized in Synthesis Examples above, and 0.2 g of triphenylsulfonium triflate as a photo-acid generator were mixed and dissolved in propylene glycol monoethyl ether acetate each to a concentration of 14 wt % as the solid content. The resulting solution was filtered through a 0.1-µm microfilter to prepare positive photoresist composition solutions of Examples 1b to 10b.

The positive resist composition of Comparative Example 1b was prepared in the same manner as above except for using Resin R1 which was the resin used in Example 1 of JP-A-11-109632.

(Evaluation Tests)

The thus-obtained positive photoresist solutions each was coated on a silicon wafer using a spin coater and dried at 130° C. for 90 seconds to form a positive photoresist film having a thickness of about 0.4 µm. The resist film formed was exposed by an ArF excimer laser (exposed by an ArF stepper at a wavelength of 193 nm with NA=0.6, manufactured by ISI), heat-treated at 120° C. for 90 seconds, developed with an aqueous 2.38% tetramethylammonium hydroxide solution and rinsed with distilled water to obtain a resist pattern profile.

These samples were evaluated on the defocus latitude and the sensitivity of an isolated pattern as follows. The evaluation results are shown in Table 4.

Sensitivity

The minimum exposure amount necessary for resolving a 0.15-µm pattern was used as the sensitivity and a relative exposure amount by taking the sensitivity of Example 1b as 1 was shown as the sensitivity.

Defocus Latitude of Isolated Line

As described above, a 0.15-µm isolated line was formed, where at the exposure, the focus was varied from −1.0 to +1.0. The obtained isolated line was observed by SEM to examine the range of allowing the film to remain without any loss.

TABLE 4

| No. | Resin | DOF of Isolated Line* | Sensitivity |
|---|---|---|---|
| Example 1b | 17 | 0.7 | 1.0 |
| Example 2b | 18 | 0.8 | 0.9 |
| Example 3b | 19 | 0.8 | 1.1 |
| Example 4b | 20 | 0.7 | 1.1 |
| Example 5b | 21 | 0.8 | 0.9 |
| Example 6b | 22 | 0.8 | 1.0 |
| Example 7b | 23 | 0.8 | 1.0 |
| Example 8b | 24 | 0.8 | 1.1 |
| Example 9b | 25 | 0.8 | 0.8 |
| Example 10b | 26 | 0.8 | 0.8 |
| Comparative Example 1b | R1 | 0.1 | 2.0 |

*DOF of isolated line: Defocus latitude of isolated line.

As apparent from the results in Table 4, the positive resist compositions of the present invention all are in a satisfactory level, that is, these are suitable for lithography using a far ultraviolet ray as in the ArF excimer laser exposure.

According to the present invention, a positive resist composition suitable for far ultraviolet ray, particularly, ArF excimer laser ray, having excellent defocus latitude of isolated line and capable of providing an excellent resist pattern profile, can be obtained.

EXAMPLES 1c TO 16c AND COMPARATIVE EXAMPLE 1c 1.4 g of a resin shown in Table 5, which was synthesized in Synthesis Examples above, and 0.2 g of triphenylsulfonium triflate (PAG-1) as a photo-acid generator were mixed and dissolved in propylene glycol monoethyl ether acetate each to a concentration of 14 wt % as the solid content. The resulting solution was filtered through a 0.1-μm microfilter to prepare positive photoresist composition solutions of Examples 1c to 16c.

The positive resist composition of Comparative Example 1c was prepared in the same manner as above except for using Resin R1 which was the resin used in Example 1 of JP-A-11-109632.

(Evaluation Tests)

The thus-obtained positive photoresist solutions each was coated on a silicon wafer using a spin coater and dried at 130° C. for 90 seconds to form a positive photoresist film having a thickness of about 0.4 μm. The resist film formed was exposed by an ArF excimer laser (exposed by an ArF stepper at a wavelength of 193 nm with NA=0.6, manufactured by ISI), heat-treated at 120° C. for 90 seconds, developed with an aqueous 2.38% tetramethylammonium hydroxide solution and rinsed with distilled water to obtain a resist pattern profile.

These samples were evaluated on the defocus latitude and the resolution of contact hole as follows. The evaluation results are shown in Table 5.

Defocus Latitude of Isolated Line

The measurement was performed in the same manner as above.

Resolution of Contact Hole

The contact hole size which can be resolved with the exposure amount for reproducing a resist pattern having a hole size of 0.25 μm (hole/duty ratio: 1/2) was defined as the resolution of contact hole.

TABLE 5

| No. | Resin | DOF of Isolated Line | Resolution of Contact Hole (μm) |
|---|---|---|---|
| Example 1c | 1 | 0.8 | 0.17 |
| Example 2c | 2 | 0.7 | 0.17 |
| Example 3c | 3 | 0.7 | 0.18 |
| Example 4c | 4 | 0.7 | 0.18 |
| Example 5c | 5 | 0.8 | 0.18 |
| Example 6c | 6 | 0.8 | 0.18 |
| Example 7c | 7 | 0.8 | 0.17 |
| Example 8c | 8 | 0.7 | 0.17 |
| Example 9c | 9 | 0.7 | 0.17 |
| Example 10c | 10 | 0.8 | 0.16 |
| Example 11c | 11 | 0.8 | 0.16 |
| Example 12c | 12 | 0.8 | 0.16 |
| Example 13c | 13 | 0.8 | 0.21 |
| Example 14c | 14 | 0.7 | 0.21 |
| Example 15c | 15 | 0.7 | 0.22 |
| Example 16c | 16 | 0.7 | 0.22 |
| Comparative Example 1c | R1 | 0.1 | 0.25 |

*DOF of Isolated Line: Defocus latitude of isolated line.

As apparent from the results in Table 5, the positive resist compositions of the present invention all are in a satisfactory level, that is, these are suitable for lithography using a far ultraviolet ray as in the ArF excimer laser exposure.

According to the present invention, a positive resist composition suitable for far ultraviolet ray, particularly, ArF excimer laser ray, having excellent defocus latitude of isolated line and capable of providing an excellent resist pattern profile, can be obtained.

EXAMPLES 1d TO 26d AND COMPARATIVE EXAMPLES 1d AND 2d 1.2 g of a resin shown in Table 6, which was synthesized in Synthesis Examples above, 0.18 g of a photo-acid generator, 0.3 g of a compound represented by formula (CI) or (CII), 1 wt % (based on solid contents) of a surfactant (Megafac F176 (produced by Dainippon Ink & Chemicals Inc.), fluorine-containing surfactant) and 10 mg of 1,5-diazabicyclo[4.3.0]-5-nonene were mixed as shown in Tale 6 and dissolved in propylene glycol monoethyl ether acetate each to a concentration of 14 wt % as the solid content. The resulting solution was filtered through a 0.1-μm microfilter to prepare positive photoresist composition solutions of Examples 1c to 26c.

In Table 6, PAG-1 denotes triphenylsulfonium triflate and PAG-2 denotes (PAG3–28) synthesized above. Resin R1 used in Comparative Example of Table 6 was the polymer compound used in Example 1 of JP-A-9-265177.

(Evaluation Tests)

The thus-obtained positive photoresist composition solutions each was coated on a silicon wafer using a spin coater and dried at 140° C. for 90 seconds to form a positive photoresist film having a thickness of about 0.4 μm. The resist film formed was exposed by an ArF excimer laser (193 nm), heat-treated at 125° C. for 90 seconds, developed with an aqueous 2.38% tetramethylammonium hydroxide solution and rinsed with distilled water to obtain a resist pattern profile.

The edge roughness was measured on the edge roughness of an isolated pattern using an end measuring scanning-type electron microscope (SEM). The line pattern edge was detected at a plurality of positions within the measuring monitor and the dispersion (3σ) of the detected positions was used as an index for edge roughness. The smaller value is more preferred.

The evaluation results are shown in Table 6.

TABLE 6

| | Photo-Acid Generator | Acid-Decomposable Resin | Dissolution Inhibitor | Edge Roughness (nm) |
|---|---|---|---|---|
| Example | | | | |
| 1d | 1 | (1) | (CI-1) | 6 |
| 2d | 1 | (2) | (CII-2) | 7 |
| 3d | 2 | (3) | (CI-12) | 6 |
| 4d | 1 | (4) | (CI-66) | 6 |
| 5d | 1 | (5) | (CI-28) | 6 |
| 6d | 2 | (6) | (CII-8) | 7 |
| 7d | 2 | (7) | (CI-36) | 6 |
| 8d | 1 | (8) | (CI-83) | 6 |
| 9d | 1 | (9) | (CI-50) | 5 |
| 10d | 1 | (10) | (CII-12) | 7 |
| 11d | 1 | (11) | (CI-1) | 6 |
| 12d | 1 | (12) | (CII-33) | 7 |
| 13d | 1 | (13) | (CI-12) | 8 |
| 14d | 1 | (14) | (CII-2) | 9 |
| 15d | 2 | (15) | (CI-28) | 8 |
| 16d | 1 | (16) | (CI-1) | 9 |
| 17d | 1 | (17) | (CI-36) | 6 |
| 18d | 1 | (18) | (CII-12) | 7 |
| 19d | 1 | (19) | (CI-27) | 6 |
| 20d | 1 | (20) | (CI-28) | 6 |
| 21d | 1 | (21) | (CI-50) | 6 |
| 22d | 1 | (22) | (CI-12) | 5 |
| 23d | 1 | (23) | (CI-1) | 6 |
| 24d | 1 | (24) | (CII-2) | 7 |
| 25d | 1 | (25) | (CI-12) | 6 |
| 26d | 1 | (26) | (CII-2) | 7 |
| Comparative Example | | | | |
| 1d | 1 | R1 | (CI-1) | 12 |
| 2d | 1 | (1) | none | 15 |

As apparent from the results in Table 6, the samples of Comparative Examples have problems in the edge roughness. On the other hand, the positive photoresist compositions for far ultraviolet exposure of the present invention are in a satisfactory level, that is, these are suitable for the lithography using a far ultraviolet ray as in the ArF excimer laser exposure.

The positive photoresist composition for far ultraviolet exposure of the present invention is suitable particularly for light in the ultraviolet wavelength region of from 170 to 220 nm, is favored with high resolution and provides a pattern improved in the edge roughness.

(Synthesis of Sulfonic Acid-Generating Compound)

Compound (1-1):

32 g of t-butyl acetoacetate ester was dissolved in tetrahydrofuran and the resulting solution was cooled to 0° C. in a nitrogen stream. Thereto, 1.2 equivalent of sodium hydride was added and further 40 g of methyl iodide was added dropwise. After the completion of dropwise addition, the reaction solution was heated to room temperature and stirred for 3 hours. After the completion of reaction, the reaction solution was poured into distilled water and the objective was extracted with ethyl acetate and concentrated.

17 g of the compound obtained, 13 g of an aqueous 37% formalin solution and 6 ml of dioxane were mixed and stirred and thereto 7 g of potassium carbonate was slowly added while controlling the reaction temperature at from 10 to 20° C. After the completion of addition of potassium carbonate, the reaction solution was stirred for 8 hours while keeping the reaction temperature as it is. After the completion of reaction, sodium bicarbonate solution was added dropwise to the reaction solution and a mixture containing the objective was extracted with ethyl acetate. The mixture obtained was purified by silica gel column chromatography to recover 20 g of the objective (methylol form).

Finally, 8 g of 2-naphthalenesulfonyl chloride and 6 g of the methylol form obtained above were dissolved in THF and the resulting solution was cooled to 0° C. in a nitrogen stream. Thereto, 5 g of pyridine was added dropwise and after the completion of dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain 8 g of the objective Compound (1-1).

Compound (1-6):

Compound (1-6) was synthesized in the same manner as above except for using pentafluorobenzenesulfonyl chloride in place of naphthalensulfonyl chloride.

Compound (2-3):

Ethyl acetoacetate ester was formed into cyclic ketal using ethylene glycol by an ordinary method and reduced with hydrogenated lithium hydride to obtain a ketal form of acetoethanol. The ketal form of acetoethanol and camphorsulfonyl chloride were dissolved in THF and the resulting solution was cooled to 0° C. in a nitrogen stream. Thereto, excess pyridine was added dropwise and after the completion of dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain the objective Compound (2-3).

Compound (3-2):

Phenylcyclohexene was oxidized in the presence of osmium oxide to synthesize cis-diol, and the cis-diol obtained and 2-naphthalenesulfonyl chloride were dissolved in THF. The resulting solution was cooled to 0° C. in a nitrogen stream and thereto excess pyridine was added dropwise. After the completion of dropwise addition, the reaction solution was heated to room temperature and stirred for 10 hours. After the completion of reaction, the reaction solution was neutralized and extracted with ethyl acetate/water, and then the organic layer was purified by silica gel column chromatography to obtain the objective Compound (3-2).

Compound (4-1):

Dimedone and 1.2 equivalent of naphthalenesulfonyl chloride pyridine were dissolved in acetonitrile and the resulting solution was cooled to 0° C. in a nitrogen stream. Thereto, 2 equivalent of pyridine was added dropwise and after the completion of dropwise addition, the reaction solution was heated to room temperature and stirred for 8 hours. After the completion of reaction, the reaction solution was neutralized and extracted with ethyl acetate/water, and then the organic layer was purified by silica gel column chromatography to obtain the objective Compound (4-1).

Compound (4-3):

Compound (4-3) was synthesized in the same manner as in the synthesis of Compound (4-1) except for using a Meldrum's acid in place of dimedone.

Compound (5-2):

Compound (5-2) was synthesized according to the method described in *Journal of Photopolymer Science and Technologies*, Vol. 11, No. 3, pp. 505–506 (1998).

EXAMPLES 1e TO 26e AND COMPARATIVE EXAMPLES 1e TO 3e 1.2 g of a resin shown in Table 7, which was synthesized in Synthesis Examples above, 0.15 g of a photo-acid generator, 0.15 g of a sulfonic acid-generating compound, 1 wt % (based on solid contents) of a surfactant and 10 mg of amine were mixed as shown in Tale 7 and dissolved in propylene glycol monoethyl ether acetate each to a concentration of 14 wt % as the solid content. The resulting solution was filtered through a 0.1-μm microfilter to prepare positive photoresist composition solutions of Examples 1e to 26e.

In Table 7, Photo-Acid Generator 1 denotes triphenylsulfonium triflate. Resin R1 used in Comparative Example 1e in Table 2 had a structure shown below. Resin R2 used in Comparative Examples 2e and 3e was the resin used in Example 1 of JP-A-11-109632.

The surfactants used were the same as those shown in Table 3.

The amines used were also the same as those shown in Table 3.

Resin R1

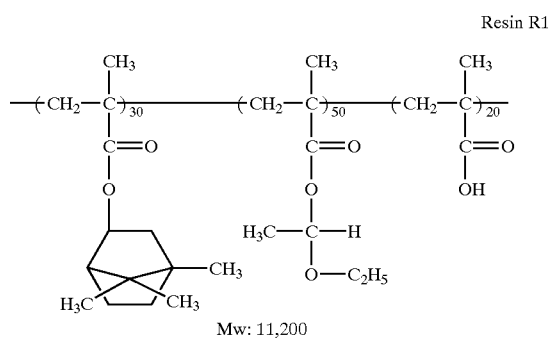

Mw: 11,200

(Evaluation Tests)

The obtained positive photoresist composition solutions each was coated on a silicon wafer using a spin coater and dried at 140° C. for 90 seconds to form a positive photoresist film having a thickness of about 0.5 μm. The resist film formed was exposed by an ArF excimer laser (193 nm), heat-treated at 125° C. for 90 seconds, developed with an aqueous 2.38% tetramethylammonium hydroxide solution and rinsed with distilled water to obtain a resist pattern profile.

Number of Development Failures

Each resist film was coated in a 6-inch bare Si substrate to have a thickness of 0.5 μm and dried on a vacuum adsorption-type hot plate at 120° C. for 60 seconds. Thereafter, each film was exposed through a test mask of 0.35 μm contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to, the measurement of the number of development failures using KLA-2112 Machine manufactured by KLA Tencor Co. and the primary data value obtained was used as the number of development failures.

Generation of Development Residue (Scumming)

The degree of development residue in the case of a resist pattern having a line width of 0.22 μm was used for the evaluation. When the residue was not observed, the rating was ○, and when a fairly large amount of residue was observed, the rating was X.

Defocus Latitude Depended on Line Pitch

In a line-and-space pattern having a line width of 0.18 μm (dense pattern) and in an isolated line pattern (sparse pattern), the overlap range of the focus depth was determined with a tolerance of 0.22 μm±10%., The larger range reveals better defocus latitude depended on line pitch.

The evaluation results are shown in Table 7.

As apparent from the results in Table 7, the samples of Comparative Examples have problems in all points. On the other hand, the positive photoresist compositions for far ultraviolet exposure of the present invention are in a satisfactory level, that is, these are suitable for the lithography using a far ultraviolet ray as in the ArF excimer laser exposure.

The positive photoresist compositions for far ultraviolet exposure of the present invention is suitable particularly for light in the far ultraviolet wavelength region of from 170 to 220 nm, reduced in the occurrence of development failures and scumming and at the same time, improved in the defocus latitude depended on line pitch. SYNTHESIS EXAMPLE 1a Synthesis of Photo-Acid Generator [Ia-3]

60 g of t-amylbenzene, 39.8 g of potassium iodate, 81 g of acetic acid anhydride and 170 ml of dichloromethane were mixed and thereto 66.8 g of concentrated sulfuric acid was added dropwise over 2 hours while cooling it on an ice bath. The reaction solution was stirred as it is for 2 hours and then stirred at room temperature overnight, thereby completing the reaction.

After the completion of reaction, 50 ml of distilled water was added dropwise to the reaction solution while cooling it on an ice bath and then extracted. The organic layer obtained was washed with water, with aqueous sodium bicarbonate and again with water, and then concentrated to obtain 40 g of di(t-amylphenyl)iodonium sulfate.

The thus-obtained sulfate was reacted for salt exchanging with potassium heptadecafluorooctanesulfonate to obtain the objective Compound [Ia-3].

SYNTHESIS EXAMPLE 2a

Synthesis of Photo-Acid Generator [Ia-6]

90 g of n-octylphenylether, 39.5 g of potassium iodate, 81 g of acetic acid anhydride and 180 ml of dichloromethane were mixed and thereto 66.8 g of concentrated sulfuric acid was added dropwise over 2 hours while cooling it on an ice bath. The reaction solution was stirred as it is for 2 hours and then stirred at room temperature overnight, thereby completing the reaction.

After the completion of reaction, 50 ml of distilled water was added dropwise to the reaction solution while cooling it on an ice bath and then extracted. The organic layer obtained was washed with water, with aqueous sodium bicarbonate and again with water, and then concentrated to obtain 45 g of di(n-octyloxyphenyl)iodonium sulfate.

The thus-obtained sulfate was reacted for salt exchanging with potassium heptadecafluorooctanesulfonate to obtain the objective Compound [Ia-6].

SYNTHESIS EXAMPLE 3a

Synthesis of Photo-Acid Generator [Ia-9]

The objective Compound [Ia-9] was synthesized by reacting the di(t-amylphenyl)iodonium sulfate obtained in Synthesis Example 1a for salt exchanging with sodium pentafluorobenzenesulfonate.

SYNTHESIS EXAMPLE 4a

Synthesis of Photo-Acid Generator [Ia-5]

91 g of peracetic acid was gradually added dropwise to 40 g of iodobenzene and the reaction solution was stirred at 30°

C. for 2 hours. When white powder was started precipitating, the reaction system was cooled with ice and the precipitate was filtered to recover 38 g of iodosobenzene diacetate.

50 g of the thus-obtained iodosobenzene diacetate, 30 g of octylphenylether, 70 g of acetic acid anhydride and 725 ml of glacial acetic acid were mixed and thereto, 8 g of concentrated sulfuric acid was added dropwise over 1 hour while cooling it on an ice bath. After 1 hour, 150 ml of an aqueous solution having dissolved therein 31 g of NaBr was added dropwise and then, 42 g of iodonium bromide salt precipitated was recovered as white powder The iodonium bromide slat was salt-exchanged with trifluoromethanesulfonate to obtain the objective compound [Ia-5].

SYNTHESIS EXAMPLE 5a

Synthesis of Photo-Acid Generator [IIa-3]

50 g of diphenylsulfoxide was dissolved in 800 ml of mesitylene and thereto 200 g of aluminum oxide was added, followed by stirring at 80° C. for 24 hours. After the completion of reaction, the reaction solution was gradually poured into 2 liter of ice. Thereto, 400 ml of concentrated hydrochloric acid was added and heated at 70° for 10 minutes. The reaction solution was cooled to room temperature, washed with ethyl acetate and then filtered. To the filtrate, 400 ml of distilled water having dissolved therein 200 g of ammonium iodide was added. The powder precipitated was filtered, washed with water and then with ethyl acetate, and dried to obtain 72 g of sulfonium iodide.

50 g of the thus-obtained sulfonium iodide was dissolved in 300 ml of methanol and thereto 31 g of silver oxide was added, followed by stirring for 4 hours. The reaction solution was filtered and then salt exchanged with potassium heptadecafluorooctanesulfonate to recover 40 g of the objective compound [IIa-3].

SYNTHESIS EXAMPLE 6a

Synthesis of Photo-Acid Generator [IIa-2]

The corresponding sulfonium iodide was synthesized using octylbenzene in place of mesitylene in Synthesis Example 5a and then salt exchanged with potassium trifluoromethanesulfonate in the same manner as in Synthesis Example 5a to obtain the objective compound [IIa-2].

SYNTHESIS EXAMPLE 7a

Synthesis of Photo-Acid Generator [IIa-8]

The corresponding sulfonium iodide was synthesized using octylbenzene in place of mesitylene in Synthesis Example 5a and then salt exchanged with potassium nonafluorobutanesulfonate in the same manner as in Synthesis Example 5a to obtain the objective compound [IIa-8].

SYNTHESIS EXAMPLE 8a

Synthesis of Photo-Acid Generator [IIa-14]

To 50 g of diphenylsulfoxide and 45 g of 2,6-xylenol, 100 ml of a methanesulfonic acid/diphosphorus pentaoxide (10/1) solution was added. When the heat generation was settled, the solution was heated at 50° C. for 4 hours. After the completion of reaction, the reaction solution was poured into ice. The resulting aqueous solution was washed with toluene and filtered and thereto an aqueous solution obtained by dissolving 200 g of ammonium iodide in 400 ml of distilled water was added. The powder precipitated was collected by filtration and the filtrate obtained was washed with water and then dried to obtained sulfonium iodide.

50 g of the thus-obtained sulfonium iodide was dissolved in 300 ml of methanol and thereto 31 g of silver oxide was added, followed by stirring for 4 hours. The reaction solution was filtered and then sat exchanged with potassium heptadecafluorooctanesulfonate to recover 43 g of the objective compound [IIc-14].

EXAMPLES 1f TO 26f AND COMPARATIVE EXAMPLE 1f 1.2 g of a resin shown in Table 8, which was synthesized in Synthesis Examples above, 0.24 g of a photo-acid generator shown in Table 8, which was synthesized in Synthesis Examples above, 1 wt % (based on solid contents) of a surfactant (Megafac F176 (produced by Dainippon Ink & Chemicals Inc.), fluorine-containing surfactant) and 16 mg of 1,5-diazabicyclo[4.3.0]-5-nonene were mixed as shown in Tale 8 and dissolved in propylene glycol monoethyl ether acetate each to a concentration of 12 wt % as the solid content. The resulting solution was filtered through a 0.1-$\mu$m microfilter to prepare positive photoresist composition solutions of Examples 1f to 26f.

In Table 8, Photo-Acid Generator 1 denotes triphenylsulfonium hexafluoroantimonate.

(Evaluation Tests)

The obtained positive photoresist composition solutions each was coated on a silicon wafer using a spin coater and dried at 140° C. for 90 seconds to form a positive photoresist film having a thickness of about 0.5 $\mu$m. The resist film formed was exposed by an ArF excimer laser (193 nm), heat-treated at 125° C. for 90 seconds, developed with an aqueous 2.38% tetramethylammonium hydroxide solution and rinsed with distilled water to obtain a resist pattern profile.

Aging Stability of Composition Solution

The positive photoresist composition solutions (coating solutions) prepared above were left standing at 4° C. for 1 week and the number of particles was counted by a particle counter manufactured by Rion.

Sensitivity

The minimum exposure amount (mJ/cm$^2$) necessary for reproducing a 0.18-$\mu$m mask pattern was defined as the sensitivity and shown by a relative exposure amount when the minimum exposure amount of Example if was taken as 1.

Resolution

The limiting resolution ($\mu$m) with the minimum exposure amount for reproducing a 0.18-$\mu$m mask pattern at a pitch of 1/1 was used as the resolution.

The evaluation results are shown in Table 8.

TABLE 8

| | Photo-Acid Generator | Acid-Decomposable Resin | Aging Stability | Resolution ($\mu$m) | Sensitivity |
|---|---|---|---|---|---|
| Example | | | | | |
| 1f | Ia-3 | (1) | <5 | 0.15 | 1.0 |
| 2f | IIa-3 | (2) | <5 | 0.14 | 0.8 |
| 3f | Ia-6 | (3) | <5 | 0.15 | 1.0 |
| 4f | IIa-2 | (4) | <5 | 0.14 | 0.7 |
| 5f | Ia-9 | (5) | <5 | 0.15 | 1.1 |
| 6f | IIa-8 | (6) | <5 | 0.14 | 0.8 |
| 7f | Ia-5 | (7) | <5 | 0.15 | 0.9 |
| 8f | IIa-14 | (8) | <5 | 0.14 | 0.8 |
| 9f | Ia-3 | (9) | <5 | 0.15 | 0.9 |
| 10f | IIa-2 | (10) | <5 | 0.35 | 0.6 |
| 11f | Ia-6 | (11) | <5 | 0.15 | 0.8 |
| 12f | IIa-14 | (12) | <5 | 0.35 | 0.7 |
| 13f | Ia-5 | (13) | <5 | 0.16 | 1.0 |
| 14f | IIa-3 | (14) | <5 | 0.16 | 0.9 |
| 15f | Ia-6 | (15) | <5 | 0.16 | 1.1 |
| 16f | IIa-8 | (16) | <5 | 0.16 | 0.9 |
| 17f | Ia-9 | (17) | <5 | 0.14 | 1.0 |
| 18f | IIa-14 | (18) | <5 | 0.135 | 0.7 |
| 19f | Ia-3 | (19) | <5 | 0.14 | 0.9 |
| 20f | IIa-2 | (20) | <5 | 0.135 | 0.6 |
| 21f | Ia-5 | (21) | <5 | 0.14 | 0.9 |
| 22f | IIa-3 | (22) | <5 | 0.135 | 0.7 |
| 23f | Ia-6 | (23) | <5 | 0.14 | 1.0 |
| 24f | IIa-14 | (24) | <5 | 0.135 | 0.7 |
| 25f | Ia-9 | (25) | <5 | 0.14 | 1.0 |
| 26f | IIa-8 | (26) | <5 | 0.135 | 0.7 |
| Comparative Example | | | | | |
| 1f | 1 | (1) | 1200 | 0.17 | 2.0 |

As apparent from the results in Table 8, the samples of Comparative Examples have problems in all points. On the other hand, the positive photoresist compositions for far ultraviolet exposure of the present invention are in a satisfactory level, that is, these are suitable for the lithography using a far ultraviolet ray as in the ArF excimer laser exposure.

The positive photoresist compositions for far ultraviolet exposure of the present invention is suitable particularly for light in the far ultraviolet wavelength region of from 170 to 220 nm, favored with high sensitivity and high resolution and at the same time, improved in the aging storage stability of the composition solution.

EXAMPLES 1a TO 26q AND COMPARATIVE EXAMPLES 1g AND 2g 1.4 g of a resin shown in Table 9, which was synthesized in Synthesis Examples above, 0.18 g of a photo-acid generator, 11.4 g of solvents (at a mixing ratio shown in Table 9), a surfactant (added in an amount of 1 wt % based on all solid contents in the composition) and 10 mg of an organic basic compound were mixed as shown in Table 9 and filtered through a 0.1-$\mu$m microfilter to prepare positive photoresist composition solutions of Examples 1g to 26g and Comparative Examples 1g and 2g.

In Table 9, PAG-1 denotes triphenylsulfonium triflate and PAG-2 denotes (PAG3–28) synthesized above. Resin R1 used in Comparative Example of Table 9 was the resin used in Example 1 of JP-A-11-109632.

The solvents used were:
S1: ethyl lactate
S2: ethyl 3-ethoxypropionate
S3: γ-butyrolactone
S4: propylene carbonate
S5: ethylene carbonate The surfactants used were the same as those shown in Table 3.

The organic basic compounds used were the same as those shown in Table 3.

(Evaluation Tests)

The obtained positive photoresist composition solutions each was coated on a silicon wafer using a spin coater and dried at 140° C. for 90 second to form a positive photoresist film having a thickness of about 0.5 $\mu$m. The resist film formed was exposed by an ArF excimer laser (193 nm), heat-treated at 120° C. for 90 seconds, developed with an aqueous 2.38% tetramethylammonium hydroxide solution and rinsed with distilled water to obtain a resist pattern profile.

Number of Development Failures

Each resist film was coated on a 6-inch bare Si substrate to have a thickness of 0.5 $\mu$m and dried on a vacuum adsorption-type hot plate at 140° C. for 60 seconds. Thereafter, each film was exposed through a test mask of a 0.35-$\mu$m contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to the measurement of the number of development failures using KLA-2112 Machine manufactured by KLA Tencor Co. and the primary data value obtained was used as the number of development failures.

Edge Roughness

The edge roughness was measured on the edge roughness of an isolated pattern using an end measuring scanning-type electron microscope (SEM). The line pattern edge was detected at a plurality of positions within the measuring monitor and the dispersion (3σ) of the detected positions was used as an index for edge roughness. The smaller value is more preferred.

Defocus Latitude Depended on Line Pitch

In a line-and-space pattern having a line width of 0.22 $\mu$m (dense pattern) and in an isolated line pattern (sparse pattern), the overlap range of focus depth was determined with a tolerance of 0.22 $\mu$m±10%. The larger range reveals better defocus latitude depended on line pitch.

The evaluation results are shown in Table 9.

As apparent from the results in Table 9, the samples of Comparative Examples have problems in the number of development failures and the generation of edge roughness. On the other hand, the positive photoresist compositions for far ultraviolet exposure of the present invention are excellent in the sensitivity, resolution, adhesion to a substrate and dry etching resistance and further exhibit a satisfactory level with respect to the prevention of generation of development failures and occurrence of edge roughness, namely, these are suitable for the lithography using a far ultraviolet ray as in the ArF excimer laser exposure. Furthermore, when the resist composition of the present invention contains a specific organic basic compound, excellent defocus latitude depended on line pitch can also be attained.

The positive photoresist compositions for far ultraviolet exposure of the present invention is suitably applied particularly to light in the far ultraviolet wavelength region of from 170 to 220 nm, favored with excellent properties in the sensitivity, resolution, dry etching resistance and adhesion to a substrate, prevented from the generation of development failures or edge roughness, capable of providing a good resist pattern profile, and also favored with excellent defocus latitude depended on line pitch.

EXAMPLES 1h TO 26h AND COMPARATIVE EXAMPLES 1h AND 2h 1.4 g of a resin shown in Table 10, which was synthesized in Synthesis Examples above, 0.18 g of a photo-acid generator, 11.4 g of solvents (at a mixing ratio shown in Table 10), a surfactant (added in an amount of 1 wt % based on all solid contents in the composition) and 10 mg of an organic basic compound were mixed as shown in Table 10 and filtered through a 0.1-$\mu$m microfilter to prepare positive photoresist composition solutions of Examples 1h to 26h and Comparative Examples 1h and 2h.

In Examples and Comparative Examples, the photo-acid generator used was triphenylsulfonium triflate. Resin R1 used in Comparative Example of Table 10 was the resin used in Example 1 of JP-A-11-109632.

The solvents used were:

S1: ethyl lactate

S2: propylene glycol monomethyl ether acetate

S3: $\gamma$-butyrolactone

S4: propylene carbonate

S5: ethylene carbonate

S6: butyl acetate

S7: 2-heptanone

The surfactants used were the same as those shown in Table 3.

The organic basic compounds used were also the same as those shown in Table 3.

(Evaluation Tests)

The obtained positive photoresist composition solutions each was coated on a silicon wafer using a spin coater and dried at 140° C. for 90 second to form a positive photoresist film having a thickness of about 0.5 $\mu$m. The resist film formed was exposed by an ArF excimer laser (193 nm), heat-treated at 120° C. for 90 seconds, developed with an aqueous 2.38% tetramethylammonium hydroxide solution and rinsed with distilled water to obtain a resist pattern profile.

Number of Development Failures

Each resist film was coated on a 6-inch bare Si substrate to have a thickness of 0.5 $\mu$m and dried on a vacuum adsorption-type hot plate at 140° C. for 60 seconds. Thereafter, each film was exposed through a test mask of a 0.35-$\mu$m contact hole pattern (hole duty ratio=1:3) by Nikon Stepper NSR-1505EX and after the exposure, heat-treated at 120° C. for 90 seconds. Subsequently, each film was paddle-developed with 2.38% TMAH (aqueous tetramethylammonium hydroxide solution) for 60 seconds, wished with pure water for 30 seconds, and then spin-dried. The thus-obtained samples each was subjected to the measurement of the number of development failures using KLA-2112 Machine manufactured by KLA Tencor Co. and the primary data value obtained was used as the number of development failures.

Edge Roughness

The edge roughness was measured on the edge roughness of an isolated pattern using an end measuring scanning-type electron microscope (SEM). The line pattern edge was detected at a plurality of positions within the measuring monitor and the dispersion (3$\sigma$) of the detected positions was used as an index for edge roughness. The smaller value is more preferred.

Defocus Latitude Depended on Line Pitch

In a line-and-space pattern having a line width of 0.22 $\mu$m (dense pattern) and in an isolated line pattern (sparse pattern), the overlap range of focus depth was determined with a tolerance of 0.22 $\mu$m±10%. The larger range reveals better defocus latitude depended on line pitch.

The evaluation results are shown in Table 10.

As apparent from the results in Table 10, the sample of Comparative Examples have problems in the number of development failures and the edge roughness. On the other hand, the positive photoresist compositions for far ultraviolet exposure of the present invention are in a satisfactory level with respect to sensitivity, resolution, adhesion to a substrate, dry etching resistance, and the prevention of the generation of development failures and edge roughness, namely, these are suitable for the lithography using a far ultraviolet ray as in the ArF excimer laser exposure. Furthermore, when the resist composition of the present invention contains a specific organic basic compound, excellent defocus latitude depended on line pitch can also be attained.

The positive photoresist compositions for far ultraviolet exposure of the present invention is suitably applied particularly to light in the far ultraviolet wavelength region of from 170 to 220 nm, favored with excellent properties in the sensitivity, resolution, dry etching resistance and adhesion to a substrate, prevented from the generation of development failures and edge roughness, capable of providing a good resist pattern profile, and also favored with excellent defocus latitude depended on line pitch.

While the invention has been described in detail and with reference to specific embodiments thereof, it will be apparent to one skilled in the art that various changes and modifications can be made therein without departing from the spirit and scope thereof.

This application is based on Japanese Patent Applications No. 11-146774 filed on May 26, 1999, No. 11-146775 filed on May 26, 1999, No. 11-150215 filed on May 28, 1999, No. 11-152860 filed on May 31, 1999, No. 11-152861 filed on May 31, 1999, No. 11-152862 filed on May 31, 1999, No. 11-158693 filed on Jun. 4, 1999, and No. 11-158695 filed on Jun. 4, 1999, the entire contents of which are incorporated herein by reference.

What is claimed is:

1. A positive photoresist composition for far ultraviolet exposure, comprising:

(A) a compound capable of generating an acid upon irradiation with actinic rays or radiation, (B) a resin having a repeating unit represented by the following formula (I) and being capable of decomposing under the action of an acid to increase the solubility in alkali, and (D) a fluorine-containing and/or silicon-containing surfactant:

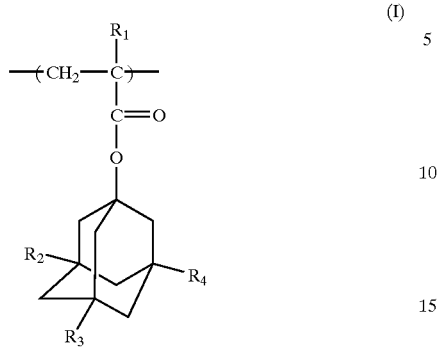
(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

2. The positive photoresist composition for far ultraviolet exposure as claimed in claim 1, further comprising a nitrogen-containing basic compound.

3. The positive photoresist composition for far ultraviolet exposure as claimed in claim 2, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

4. A positive photoresist composition for far ultraviolet exposure, comprising:
(A) a compound capable of generating an acid upon irradiation with actinic rays or radiation, and
(B') a resin containing a repeating unit having an alkali-soluble group protected by at least one of the groups containing an alicyclic hydrocarbon structure represented by the following formula (pI), (pII), (pIII), (pIV), (pV) or (pVI) and repeating unit represented by the following formula (I) and being capable of decomposing under the action of an acid to increase the solubility in alkali:

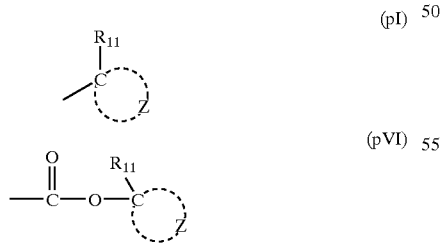
(pI)
(pVI)

wherein in formulae (pI) and (pVI) $R_{11}$ represents a methyl group, an ethyl group, an n-propyl group, an isopropyl group, an n-butyl group, an isobutyl group or a sec-butyl group and Z represents an atomic group necessary for forming a unsubstituted or substituted alicyclic hydrocarbon group together with the carbon atom represented by the following formulae (1)–(39) and (41)–(50);

 (1)

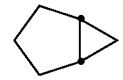 (2)

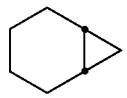 (3)

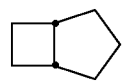 (4)

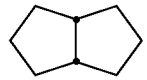 (5)

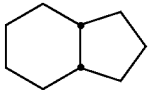 (6)

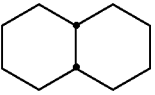 (7)

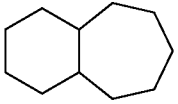 (8)

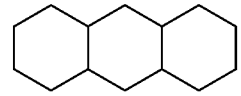 (9)

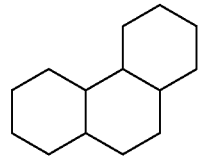 (10)

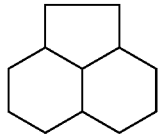 (11)

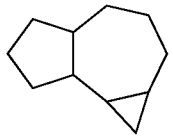 (12)

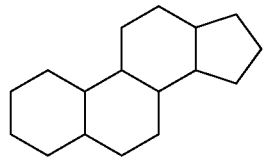 (13)

-continued
(14)
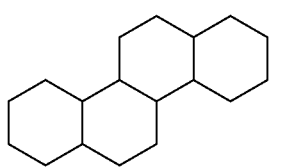
(15)
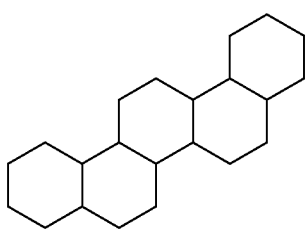
(16)
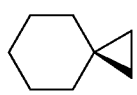
(17)
(18)
(19)
(20)
(21)
(22)
(23)
(24)
(25)
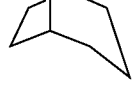
-continued
(26)
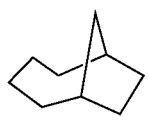
(27)
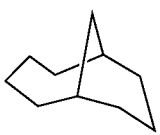
(28)
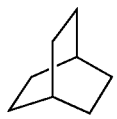
(29)
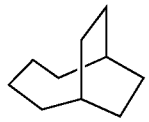
(30)
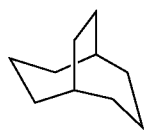
(31)
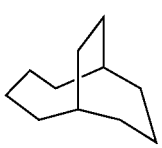
(32)
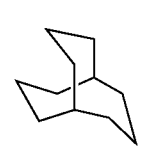
(33)
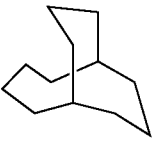
(34)
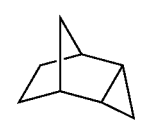
(35)
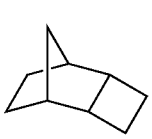
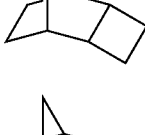
(36)
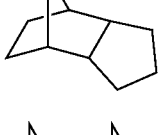
(37)
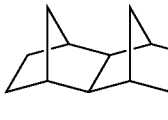

-continued

(38) 

(39) 

(41) 

(42) 

(43) 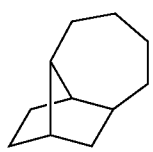

(44) 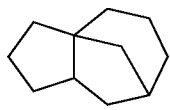

(45) 

(46) 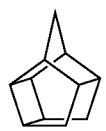

(47) 

(48) 

(49) 

(50) 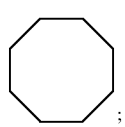

;

(pII) 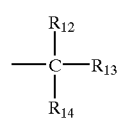

-continued

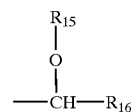 (pIII)

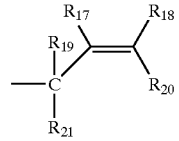 (pIV)

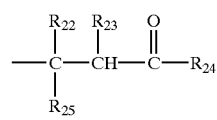 (pV)

wherein in formulae (pII)–(pV) $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom; $R_{12}$ and $R_{16}$ each independently represents a linear or branched alkyl group having from 1 to 4 carbon atoms or an alicyclic hydrocarbon group having from 1 to 4 carbon atoms, provided that at least one of $R_{12}$ to $R_{14}$ or either one of $R_{15}$ and $R_{16}$ represents an alicyclic hydrocarbon group; $R_{17}$ and $R_{21}$ each independently represents a hydrogen atom, a linear or branched alkyl group having from 1 to 4 carbon atoms or an alicyclic hydrocarbon group having from 1 to 4 carbon atoms, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group having from 1 to 4 carbon atoms; and $R_{22}$ to $R_{25}$ each independently represents a linear or branched alkyl group having from 1 to 4 carbon atoms or an alicyclic hydrocarbon group having from 1 to 4 carbon atoms, provided that at least one of $R_{22}$ to $R_{25}$ represents an alicyclic hydrocarbon group;

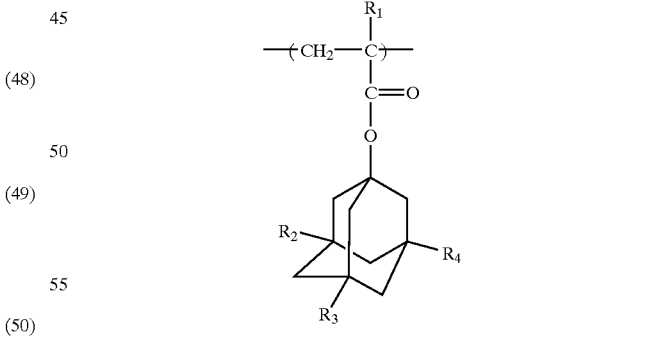 (I)

where $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

5. The positive photoresist composition for far ultraviolet exposure as claimed in claim 4, wherein the rein (B') further contains a repeating unit having a group represented by the following formula (II):

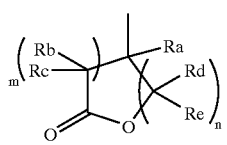
(II)

wherein Ra to Re each represents a hydrogen atom or an alkyl group having from 1 to 4 carbon atoms and m and n each independently represents an integer of from 0 to 3, provided that m+n is a number of from 2 to 6.

6. A positive photoresist composition for far ultraviolet exposure, comprising:

(A) a compound capable of generating an acid upon irradiation with actinic rays or radiation, and (B") a resin containing a repeating unit having a group represented by the following formula (I) and a repeating unit represented by the following formula (II'):

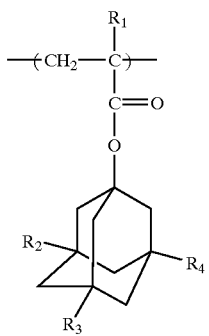
(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group;

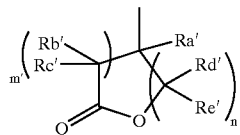
(II')

wherein Ra' represents a hydrogen atom or an alkyl group having from 1 to 4 carbon atoms, provided that when m' is 0 or 2, Ra' represents an alkyl group having from 1 to 4 carbon atoms; Rb' to Re' each independently represent a hydrogen atom or an alkyl group which may have a substituent; m' represents an integer of from 0 to 2; and n' represents an integer of from 1 to 3, provided that m'+n' is a number of from 2 to 6.

7. The positive photoresist composition for far ultraviolet exposure as claimed in claim 6, wherein the resin (B") further contains at least one of the repeating units represented by the following formulae (III-a) to (III-d):

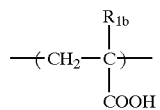
(III-a)

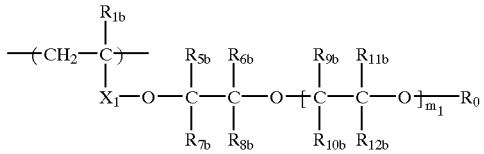
(III-b)

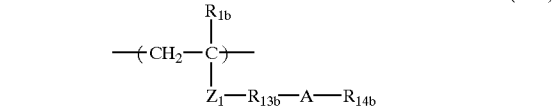
(III-c)

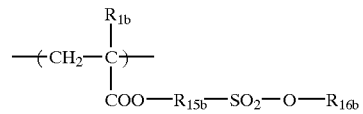
(III-d)

wherein $R_{1b}$ has the same meaning as $R_1$ in formula (I), $R_{5b}$ to $R_{12b}$ each independently represents a hydrogen atom or an alkyl group which may have a substituent; $R_0$ represents a hydrogen atom or an alkyl group which may have a substituent, a cyclic alkyl group which may have a substituent, an aryl group which may have a substituent or an aralkyl group which may have a substituent; $m_1$ represents an integer of from 1 to 10; $X_1$ represents a single bond, an alkylene group which may have a substituent, a cyclic alkylene group which may have a substituent, an arylene group which may have a substituent, or a divalent group incapable of decomposing under the action of an acid selected from the group consisting of an ether group, a thioether group, a carbonyl group, an ester group, an amido group, a sulfonamido group, a urethane group, a urea group and a combination of two or more thereof; $Z_1$ represents a single bond or a divalent group selected from the group consisting of an ether group, an ester group, an amide group, an alkylene group and a combination thereof; $R_{13b}$ represents a single bond or a divalent group selected from the group consisting of an alkylene group, an arylene group and a combination thereof; $R_{15b}$ represents a divalent group selected from the group consisting of an alkylene group, an arylene group and a combination thereof; $R_{14b}$ represents an alkyl group which may have a substituent, a cyclic alkyl group which may have a substituent, an aryl group which may have a substituent or an aralkyl group which may have a substituent; $R_{16b}$ represents a hydrogen atom, an alkyl group which may have a substituent, a cyclic alkyl group which may have a substituent, an alkenyl group which may have a substituent, an aryl group which may have a substituent, or an aralkyl group which may have a substituent; and A represents any one of the following functional groups:

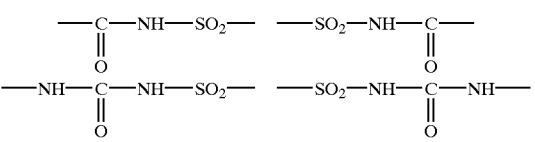

-continued

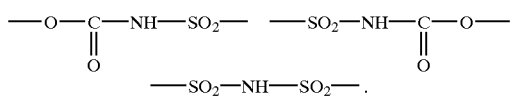

—SO₂—NH—SO₂— .

8. A positive photoresist composition for far ultraviolet exposure, comprising:
(A) a compound capable of generating an acid upon irradiation with actinic rays or radiation,
(B) a resin having a repeating unit represented by the following formula (I) and being capable of decomposing under the action of an acid to increase the solubility in alkali, and
(C) a compound represented by the following formula (CI) or (CII):

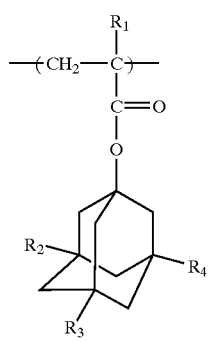

(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group;

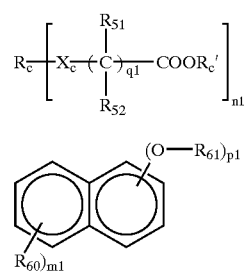

wherein
in formula (CI), $X_c$ represents —O—, —S—, —N($R_{53}$)— or a single bond, $R_{51}$, $R_{52}$ and $R_{53}$ each independently represents a hydrogen atom or an alkyl group, $R_c{'}$ represents a group for constituting an acid decomposable group in the form of —COOR$_c{'}$, and $R_c$ represents an n1-valent residue containing a bridge-containing hydrocarbon group or a naphthalene ring; and
in formula (CII), $R_{60}$ represents a hydrogen atom or an alkyl group, $R_{61}$ represents a group for constituting an acid decomposable group in the form of —O—$R_{61}$, m1, n1 and p1 each independently represents an integer of from 1 to 4, and q1 represents an integer of from 0 to 10.

9. A positive photoresist composition for far ultraviolet exposure, comprising:

(A) a compound capable of generating an acid upon irradiation with actinic rays or radiation,
(B) a resin having a repeating unit represented by the following formula (I) and being capable of decomposing under the action of an acid to increase the solubility in alkali, and
(E) a compound capable of decomposing under the action of an acid to generate a sulfonic acid:

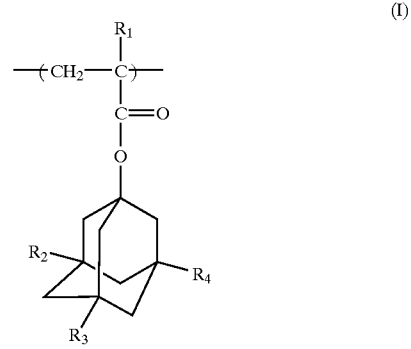

(I)

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

10. The positive photoresist composition for far ultraviolet exposure as claimed in claim 9, further comprising a fluorine-containing surfactant and/or a silicon-containing surfactant.

11. The positive photoresist composition for far ultraviolet exposure as claimed in claim 9, further comprising a nitrogen-containing basic compound.

12. The positive photoresist composition for far ultraviolet exposure as claimed in claim 11, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

13. A positive photoresist composition for far ultraviolet exposure, comprising:

(A) a compound capable of generating an acid upon irradiation with actinic rays or radiation,
(B) a resin having a repeating unit represented by the following formula (I) and being capable of decomposing under the action of an acid to increase the solubility in alkali, and
(S1) a solvent containing (a) ethyl lactate in an amount of from 60 to 90 wt % based on the entire solvent and (b) ethyl 3-ethoxypropionate in an amount of from 10 to 40 wt % based on the entire solvent:

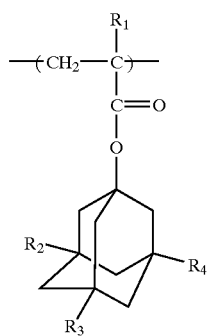

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

14. The positive photosensitive resin composition as claimed in claim 13, wherein the solvent (S1) further contains (c) a solvent having a boiling point of 180° C. or more and a solubility parameter of 12 or more in an amount of from 1 to 20 wt % based on the entire solvent.

15. The positive photosensitive resin composition as claimed in claim 14, wherein the solvent (c) is at least one selected from γ-butyrolactone, ethylene carbonate and propylene carbonate.

16. The positive photoresist composition for far ultraviolet exposure as claimed in claim 13, further comprising a fluorine-containing surfactant and/or a silicon-containing surfactant.

17. The positive photoresist composition for far ultraviolet exposure as claimed in claim 13, further comprising a nitrogen-containing basic compound.

18. The positive photoresist composition for far ultraviolet exposure as claimed in claim 17, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

19. A positive photoresist composition for far ultraviolet exposure, comprising:
(A) a compound capable of generating an acid upon irradiation with actinic rays or radiation,
(B) a resin having a repeating unit represented by the following formula (I) and being capable of decomposing under the action of an acid to increase the solubility in alkali, and
(S2) a solvent containing (a) a first solvent shown below in an amount of from 60 to 90 wt % based on the entire solvent and (b) a second solvent shown below in an amount of from 10 to 40 wt % based on the entire solvent:

(a) at least one first solvent selected from ethyl lactate, propylene glycol monomethyl ether acetate, propylene glycol monomethyl ether propionate, methyl 3-methoxypropionate, ethyl 3-ethoxypropionate and 2-heptanone; and
(b) a second solvent having a viscosity at a temperature of 20° C. of 1 cps or less:

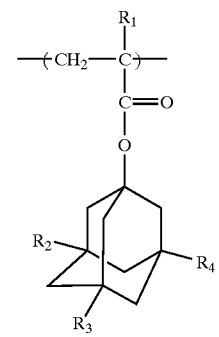

wherein $R_1$ represents a hydrogen atom, a halogen atom, a linear or branched alkyl group having from 1 to 4 carbon atoms and $R_2$ to $R_4$ each independently represents a hydrogen atom or a hydroxyl group, provided that at least one of $R_2$ to $R_4$ represents a hydroxyl group.

20. The positive photosensitive resin composition as claimed in claim 19, wherein the solvent (S2) further contains (c) a third solvent having a boiling point of 180° C. or more and a solubility parameter of 12 or more in an amount of from 1 to 20 wt % based on the entire solvent.

21. The positive photosensitive resin composition as claimed in claim 20, wherein the third solvent (c) is at least one selected from γ-butyrolactone, ethylene carbonate and propylene carbonate.

22. The positive photoresist composition, for far ultraviolet exposure as claimed in claim 19, further comprising a fluorine-containing surfactant and/or a silicon-containing surfactant.

23. The positive photoresist composition for far ultraviolet exposure as claimed in claim 19, further comprising a nitrogen-containing basic compound.

24. The positive photoresist composition for far ultraviolet exposure as claimed in claim 23, wherein the nitrogen-containing basic compound is at least one compound selected from the group consisting of 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines and hindered amines having a hindered piperidine skeleton.

* * * * *

UNITED STATES PATENT AND TRADEMARK OFFICE
CERTIFICATE OF CORRECTION

PATENT NO.          : 6,479,211 B1
APPLICATION NO.  : 09/577884
DATED                    : November 12, 2002
INVENTOR(S)         : Kenichiro Sato et al.

It is certified that error appears in the above-identified patent and that said Letters Patent is hereby corrected as shown below:

Please insert - Table 3 at column 107, after line 61 (See Table 3 attached)

Please insert - Table 7 at column 114, after line 4 (See Table 7 attached)

Signed and Sealed this

Twenty-second Day of December, 2009

David J. Kappos
*Director of the United States Patent and Trademark Office*

TABLE 3

| | Photo-Acid Generator | Acid-Decomposable Resin | Surfactant | Organic Basic Compound | Number of Development Failures | Scum | Defocus Latitude Depended on Line Pitch |
|---|---|---|---|---|---|---|---|
| Example 1a | 1 | (1) | W-3 | 1 | 30 | ○ | 1.0 |
| 2a | 1 | (2) | W-1 | 2 | 30 | ○ | 1.0 |
| 3a | 2 | (3) | W-2 | 1 | 30 | ○ | 1.0 |
| 4a | 1 | (4) | W-2 | 2 | 25 | ○ | 1.0 |
| 5a | 1 | (5) | W-3 | 1 | 80 | ○ | 0.7 |
| 6a | 2 | (6) | W-1 | 3 | 30 | ○ | 1.0 |
| 7a | 2 | (7) | W-1 | 1 | 30 | ○ | 0.7 |
| 8a | 1 | (8) | W-1 | 2 | 25 | ○ | 1.0 |
| 9a | 1 | (9) | W-2 | 2 | 25 | ○ | 1.0 |
| 10 | 1 | (10) | W-3 | 1 | 15 | ○ | 1.1 |
| 11a | 1 | (11) | W-1 | 2 | 15 | ○ | 1.1 |
| 12a | 1 | (12) | W-2 | 1 | 10 | ○ | 1.1 |
| 13a | 1 | (13) | W-3 | 3 | 70 | ○ | 0.7 |
| 14a | 1 | (14) | W-1 | 1 | 30 | ○ | 0.7 |
| 15a | 2 | (15) | W-2 | 2 | 35 | ○ | 0.6 |
| 16a | 1 | (16) | W-3 | 1 | 35 | ○ | 0.6 |
| 17a | 1 | (17) | W-2 | 2 | 30 | ○ | 1.0 |
| 18a | 1 | (18) | W-3 | 1 | 25 | ○ | 1.0 |
| 19a | 1 | (19) | W-1 | 1 | 25 | ○ | 1.0 |
| 20a | 1 | (20) | W-2 | 1 | 30 | ○ | 1.0 |
| 21a | 1 | (21) | W-3 | 2 | 25 | ○ | 1.1 |
| 22a | 1 | (22) | W-1 | 1 | 25 | ○ | 1.0 |
| 23a | 1 | (23) | W-2 | 3 | 30 | ○ | 1.1 |
| 24a | 1 | (24) | W-3 | 2 | 25 | ○ | 1.1 |
| 25a | 1 | (25) | W-1 | 1 | 20 | ○ | 1.1 |
| 26a | 1 | (26) | W-2 | 3 | 40 | ○ | 0.7 |
| Comparative Example 1a | 1 | R1 | none | 3 | 15000 | × | 0.2 |
| 2a | 1 | (1) | W-4 | 1 | 300 | ○ | 0.3 |

TABLE 7

| | Photo-Acid Generator | Acid-Decomposable Resin | Sulfonic Acid-Generating Compound | Surfactant | Amine | Number of Development Failures | Scum | Defocus Latitude Depended on Line Pitch |
|---|---|---|---|---|---|---|---|---|
| Example 1e | 1 | (1) | (1-1) | W-1 | 1 | 20 | ○ | 1.0 |
| 2e | 1 | (2) | (2-3) | W-2 | 2 | 30 | ○ | 0.9 |
| 3e | 1 | (3) | (3-2) | W-3 | 3 | 60 | ○ | 0.7 |
| 4e | 1 | (4) | (4-1) | W-1 | 1 | 20 | ○ | 1.0 |
| 5e | 1 | (5) | (1-6) | W-2 | 2 | 20 | ○ | 1.0 |
| 6e | 1 | (6) | (4-3) | W-3 | 1 | 70 | ○ | 1.0 |
| 7e | 1 | (7) | (5-2) | W-4 | 2 | 30 | ○ | 0.8 |
| 8e | 1 | (8) | (1-1) | W-1 | 2 | 20 | ○ | 1.0 |
| 9e | 1 | (9) | (3-2) | W-2 | 1 | 35 | ○ | 0.9 |
| 10e | 1 | (10) | (2-3) | W-3 | 2 | 35 | ○ | 0.9 |
| 11e | 1 | (11) | (5-2) | W-1 | 1 | 30 | ○ | 0.9 |
| 12e | 1 | (12) | (4-1) | W-2 | 2 | 20 | ○ | 1.0 |
| 13e | 1 | (13) | (2-3) | W-3 | 1 | 70 | ○ | 0.7 |
| 14e | 1 | (14) | (3-2) | W-4 | 3 | 80 | ○ | 0.7 |
| 15e | 1 | (15) | (5-2) | W-1 | 1 | 40 | ○ | 0.9 |
| 16e | 1 | (16) | (1-6) | W-2 | 2 | 40 | ○ | 1.0 |
| 17e | 1 | (17) | (4-1) | W-3 | 1 | 20 | ○ | 1.0 |
| 18e | 1 | (18) | (4-3) | W-4 | 2 | 60 | ○ | 0.7 |
| 19e | 1 | (19) | (5-2) | W-1 | 1 | 30 | ○ | 0.9 |
| 20e | 1 | (20) | (4-1) | W-2 | 2 | 45 | ○ | 0.7 |
| 21e | 1 | (21) | (2-3) | W-1 | 3 | 35 | ○ | 0.9 |
| 22e | 1 | (22) | (1-1) | W-2 | 1 | 25 | ○ | 1.0 |
| 23e | 1 | (23) | (3-2) | W-3 | 2 | 30 | ○ | 0.9 |
| 24e | 1 | (24) | (5-2) | W-1 | 1 | 30 | ○ | 0.9 |
| 25e | 1 | (25) | (4-1) | W-2 | 1 | 20 | ○ | 1.0 |
| 26e | 1 | (26) | (4-3) | W-3 | 2 | 20 | ○ | 1.0 |
| Comparative Example 1e | 1 | (R1) | (3-2) | W-1 | 1 | 550 | × | 0.4 |
| 2e | 1 | (R2) | none | none | none | 1500 | × | 0.1 |
| 3e | 1 | (R2) | none | W-1 | 1 | 1200 | × | 0.2 |